(12) United States Patent
Yamazaki et al.

(10) Patent No.: US 11,489,077 B2
(45) Date of Patent: Nov. 1, 2022

(54) METHOD FOR FORMING OXIDE SEMICONDUCTOR FILM, SEMICONDUCTOR DEVICE, AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Masahiro Watanabe, Tochigi (JP); Mitsuo Mashiyama, Oyama (JP); Kenichi Okazaki, Tochigi (JP); Motoki Nakashima, Atsugi (JP); Hideyuki Kishida, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 114 days.

(21) Appl. No.: 17/000,580

(22) Filed: Aug. 24, 2020

(65) Prior Publication Data

US 2021/0043453 A1 Feb. 11, 2021

Related U.S. Application Data

(60) Continuation of application No. 15/657,273, filed on Jul. 24, 2017, now abandoned, which is a division of
(Continued)

(30) Foreign Application Priority Data

May 25, 2011 (JP) .................................. 2011-117354
Jul. 1, 2011 (JP) .................................. 2011-147189

(51) Int. Cl.
*H01L 29/786* (2006.01)
*H01L 21/02* (2006.01)
*H01L 29/66* (2006.01)

(52) U.S. Cl.
CPC .... *H01L 29/7869* (2013.01); *H01L 21/02554* (2013.01); *H01L 21/02565* (2013.01);
(Continued)

(58) Field of Classification Search
CPC ......... H01L 21/02554; H01L 21/02565; H01L 21/02631; H01L 21/8232;
(Continued)

(56) References Cited

U.S. PATENT DOCUMENTS

| 5,528,032 A | 6/1996 | Uchiyama |
| 5,536,330 A | 7/1996 | Chen et al. |

(Continued)

FOREIGN PATENT DOCUMENTS

| CN | 101897031 A | 11/2010 |
| CN | 101911303 A | 12/2010 |

(Continued)

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.
(Continued)

*Primary Examiner* — Cheung Lee
(74) *Attorney, Agent, or Firm* — Robinson Intellectual Property Law Office; Eric J. Robinson

(57) ABSTRACT

The impurity concentration in the oxide semiconductor film is reduced, and a highly reliability can be obtained.

11 Claims, 39 Drawing Sheets

Related U.S. Application Data application No. 13/473,653, filed on May 17, 2012, now abandoned.

(52) U.S. Cl.
CPC .. *H01L 21/02631* (2013.01); *H01L 29/66969* (2013.01); *H01L 29/78603* (2013.01); *H01L 29/78606* (2013.01); *H01L 29/78618* (2013.01)

(58) Field of Classification Search
CPC ............. H01L 21/823412; H01L 29/66; H01L 29/66969; H01L 29/786; H01L 29/78603; H01L 29/78606; H01L 29/78618; H01L 29/7869; H01L 29/78696; C23C 16/22; C23C 16/30; C23C 16/40; C23C 16/407
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,759,287 A | 6/1998 | Chen et al. |
| 6,271,066 B1 | 8/2001 | Yamazaki et al. |
| 6,294,274 B1 | 9/2001 | Kawazoe et al. |
| 6,331,476 B1 | 12/2001 | Kawakita et al. |
| 6,563,174 B2 | 5/2003 | Kawasaki et al. |
| 6,727,522 B1 | 4/2004 | Kawasaki et al. |
| 6,743,739 B2 | 6/2004 | Shimamoto et al. |
| 6,992,022 B2 | 1/2006 | Shimamoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,314,838 B2 | 1/2008 | Tsai et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,651,730 B2 | 1/2010 | Hasebe |
| 7,671,369 B2 | 3/2010 | Yamazaki et al. |
| 7,674,650 B2 | 3/2010 | Akimoto et al. |
| 7,691,715 B2 | 4/2010 | Kaji et al. |
| 7,732,819 B2 | 6/2010 | Akimoto et al. |
| 7,791,072 B2 | 9/2010 | Kumomi et al. |
| 7,883,934 B2 | 2/2011 | Kaji et al. |
| 8,129,719 B2 | 3/2012 | Yamazaki et al. |
| 8,183,099 B2 | 5/2012 | Sakata |
| 8,314,765 B2 | 11/2012 | Umezaki |
| 8,319,218 B2 | 11/2012 | Yamazaki et al. |
| 8,329,506 B2 | 12/2012 | Akimoto et al. |
| 8,343,800 B2 | 1/2013 | Umeda et al. |
| 8,384,077 B2 | 2/2013 | Yano et al. |
| 8,410,002 B2 | 4/2013 | Yamazaki et al. |
| 8,421,090 B2 | 4/2013 | Choi |
| 8,461,583 B2 | 6/2013 | Yano et al. |
| 8,492,758 B2 | 7/2013 | Yamazaki et al. |
| 8,502,220 B2 | 8/2013 | Yamazaki et al. |
| 8,518,740 B2 | 8/2013 | Yamazaki et al. |
| 8,643,011 B2 | 2/2014 | Akimoto et al. |
| 8,723,175 B2 | 5/2014 | Yano et al. |
| 8,742,412 B2 | 6/2014 | Goyal et al. |
| 8,742,544 B2 | 6/2014 | Yamazaki et al. |
| 8,774,347 B2 | 7/2014 | Umezaki |
| 8,791,457 B2 | 7/2014 | Yano et al. |
| 8,803,149 B2 | 8/2014 | Sakata |
| 8,822,264 B2 | 9/2014 | Yamazaki et al. |
| 8,841,661 B2 | 9/2014 | Akimoto et al. |
| 8,883,554 B2 | 11/2014 | Sakata et al. |
| 8,981,369 B2 | 3/2015 | Yano et al. |
| 8,993,386 B2 | 3/2015 | Ohara et al. |
| 9,036,767 B2 | 5/2015 | Umezaki |
| 9,196,713 B2 | 11/2015 | Yamazaki et al. |
| 9,196,738 B2 | 11/2015 | Sakata et al. |
| 9,214,563 B2 | 12/2015 | Yamazaki et al. |
| 9,252,288 B2 | 2/2016 | Akimoto et al. |
| 9,306,072 B2 | 4/2016 | Yamazaki et al. |
| 9,311,876 B2 | 4/2016 | Umezaki |
| 9,312,156 B2 | 4/2016 | Miyairi |
| 9,318,617 B2 | 4/2016 | Yamazaki et al. |
| 9,466,756 B2 | 10/2016 | Yamazaki et al. |
| 9,601,601 B2 | 3/2017 | Sakata |
| 9,768,281 B2 | 9/2017 | Ohara et al. |
| 9,853,167 B2 | 12/2017 | Yamazaki et al. |
| 9,893,200 B2 | 2/2018 | Akimoto et al. |
| 9,911,865 B2 | 3/2018 | Yamazaki et al. |
| 9,935,202 B2 | 4/2018 | Yamazaki et al. |
| 10,103,272 B2 | 10/2018 | Sakata et al. |
| 10,121,435 B2 | 11/2018 | Umezaki |
| 10,418,491 B2 | 9/2019 | Yamazaki et al. |
| 10,439,050 B2 | 10/2019 | Sakata |
| 2001/0046027 A1 | 11/2001 | Tai et al. |
| 2002/0016029 A1 | 2/2002 | Kawakita et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0130449 A1 | 6/2005 | Chuang et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0237725 A1 | 10/2006 | Jeong et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |

(56) References Cited

U.S. PATENT DOCUMENTS

| | | |
|---|---|---|
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0278864 A1 | 11/2008 | Zhang et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1* | 5/2009 | Sakakura ............ H01L 51/0011 313/504 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0302314 A1 | 12/2009 | Kusumori et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0182223 A1 | 7/2010 | Choi et al. |
| 2010/0193782 A1 | 8/2010 | Sakata |
| 2010/0276688 A1 | 11/2010 | Yano et al. |
| 2010/0289020 A1 | 11/2010 | Yano et al. |
| 2011/0062436 A1 | 3/2011 | Yamazaki et al. |
| 2011/0068335 A1 | 3/2011 | Yamazaki et al. |
| 2011/0068336 A1 | 3/2011 | Yamazaki et al. |
| 2011/0084264 A1* | 4/2011 | Yamazaki ......... H01L 29/78693 257/43 |
| 2011/0101335 A1 | 5/2011 | Yamazaki et al. |
| 2011/0111558 A1 | 5/2011 | Yamazaki et al. |
| 2011/0127525 A1 | 6/2011 | Yamazaki et al. |
| 2011/0128275 A1 | 6/2011 | Ueda et al. |
| 2011/0175081 A1 | 7/2011 | Goyal et al. |
| 2011/0204355 A1 | 8/2011 | Suzuki et al. |
| 2011/0215317 A1 | 9/2011 | Yamazaki et al. |
| 2012/0161121 A1 | 6/2012 | Yamazaki |
| 2012/0161122 A1 | 6/2012 | Yamazaki |
| 2012/0161123 A1 | 6/2012 | Yamazaki |
| 2012/0161124 A1 | 6/2012 | Yamazaki |
| 2012/0161125 A1 | 6/2012 | Yamazaki |
| 2012/0161126 A1 | 6/2012 | Yamazaki |
| 2012/0184066 A1 | 7/2012 | Yano et al. |
| 2012/0199842 A1 | 8/2012 | Takemura |
| 2012/0213000 A1 | 8/2012 | Takemura |
| 2012/0228687 A1 | 9/2012 | Noda |
| 2012/0275214 A1 | 11/2012 | Atsumi et al. |
| 2012/0286260 A1 | 11/2012 | Noda et al. |
| 2013/0005124 A1 | 1/2013 | Yamashita et al. |
| 2013/0092925 A1 | 4/2013 | Saito et al. |
| 2013/0092926 A1 | 4/2013 | Yamazaki |
| 2013/0328044 A1 | 12/2013 | Yamazaki et al. |
| 2014/0264327 A1 | 9/2014 | Yamazaki et al. |
| 2017/0005118 A1 | 1/2017 | Yamazaki et al. |
| 2017/0154998 A1 | 6/2017 | Ueda et al. |
| 2018/0166581 A1 | 6/2018 | Akimoto et al. |
| 2018/0190834 A1 | 7/2018 | Yamazaki et al. |
| 2018/0226510 A1 | 8/2018 | Yamazaki et al. |
| 2019/0051754 A1 | 2/2019 | Sakata et al. |
| 2019/0206354 A1 | 7/2019 | Umezaki |

FOREIGN PATENT DOCUMENTS

| | | |
|---|---|---|
| CN | 101933150 A | 12/2010 |
| CN | 102132413 A | 7/2011 |
| EP | 0632144 A | 1/1995 |
| EP | 1737044 A | 12/2006 |
| EP | 2226847 A | 9/2010 |
| EP | 2544237 A | 1/2013 |
| EP | 3217435 A | 9/2017 |
| EP | 3249698 A | 11/2017 |
| EP | 3540772 A | 9/2019 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-250622 A | 11/1991 |
| JP | 05-251705 A | 9/1993 |
| JP | 06-004919 A | 1/1994 |
| JP | 06-275697 A | 9/1994 |
| JP | 07-078775 A | 3/1995 |
| JP | 08-264794 A | 10/1996 |
| JP | 09-007969 A | 1/1997 |
| JP | 09-508494 | 8/1997 |
| JP | 11-505377 | 5/1999 |
| JP | 2000-044236 A | 2/2000 |
| JP | 2000-150900 A | 5/2000 |
| JP | 2000-206566 A | 7/2000 |
| JP | 2000-286423 A | 10/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-253380 A | 9/2006 |
| JP | 2006-287084 A | 10/2006 |
| JP | 2007-073699 A | 3/2007 |
| JP | 2007-096055 A | 4/2007 |
| JP | 2008-031035 A | 2/2008 |
| JP | 2008-182124 A | 8/2008 |
| JP | 2009-141221 A | 6/2009 |
| JP | 2009-206508 A | 9/2009 |
| JP | 2010-027194 A | 2/2010 |
| JP | 2010-045263 A | 2/2010 |
| JP | 2010-074148 A | 4/2010 |
| JP | 2010-080947 A | 4/2010 |
| JP | 2010-153802 A | 7/2010 |
| JP | 2010-166030 A | 7/2010 |
| JP | 2010-222214 A | 10/2010 |
| JP | 2010-226097 A | 10/2010 |
| JP | 2010-251732 A | 11/2010 |
| JP | 2011-003775 A | 1/2011 |
| JP | 2011-009697 A | 1/2011 |
| JP | 2011-049448 A | 3/2011 |
| JP | 2011-054957 A | 3/2011 |
| JP | 2011-086923 A | 4/2011 |
| JP | 2011-091375 A | 5/2011 |
| JP | 2011-100979 A | 5/2011 |
| JP | 2011-142311 A | 7/2011 |
| KR | 2010-0086256 A | 7/2010 |
| KR | 2010-0107058 A | 10/2010 |
| KR | 2010-0137379 A | 12/2010 |
| KR | 2011-0003284 A | 1/2011 |
| KR | 2011-0014783 A | 2/2011 |
| KR | 2011-0024935 A | 3/2011 |
| TW | 557501 | 10/2003 |
| TW | 200520094 | 6/2005 |
| TW | 200625444 | 7/2006 |
| TW | 200705551 | 2/2007 |
| TW | 201044464 | 12/2010 |
| WO | WO-1995/020823 | 8/1995 |
| WO | WO-2004/114391 | 12/2004 |
| WO | WO-2009/075281 | 6/2009 |
| WO | WO-2009/081885 | 7/2009 |
| WO | WO-2009/096608 | 8/2009 |
| WO | WO-2010/021349 | 2/2010 |
| WO | WO-2010/071034 | 6/2010 |
| WO | WO-2010/071183 | 6/2010 |
| WO | WO-2010/103935 | 9/2010 |
| WO | WO-2011/033936 | 3/2011 |
| WO | WO-2011/036999 | 3/2011 |

(56) References Cited

FOREIGN PATENT DOCUMENTS

| WO | WO-2011/040028 | 4/2011 |
|----|----------------|--------|
| WO | WO-2011/043176 | 4/2011 |
| WO | WO-2011/058866 | 5/2011 |
| WO | WO-2011/071185 | 6/2011 |
| WO | WO-2012/035281 | 3/2012 |

OTHER PUBLICATIONS

Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.

Kim.S et al., "Source/Drain Formation of Self-Aligned Top-Gate Amorphous GaInZnO Thin-Film Transistors by NH3 Plasma Treatment", IEEE Electron Device Letters, Apr. 1, 2009, vol. 30, No. 4, pp. 374-376.

Du Ahn.B et al., "Comparison of the effects of Ar and H2 plasmas on the performance of homojunctioned amorphous indium gallium zinc oxide thin film transistors", Appl. Phys. Lett. (Applied Physics Letters), 2008, vol. 93, No. 20, pp. 203506-1-203506-3.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

(56) References Cited

OTHER PUBLICATIONS

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17 22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings Ofthe 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Taiwanese Office Action (Application No. 101118014) dated Oct. 21, 2015.
Taiwanese Office Action (Application No. 106101876) dated Sep. 6, 2017.
Korean Office Action (Application No. 2012-0055560) dated Sep. 28, 2018.
Hwaiyu.G, "7.3 Methods for Creating a Vacuum", Semiconductor Manufacturing Handbook, 2005, pp. 7.5-7.8, McGraw-Hill.

\* cited by examiner

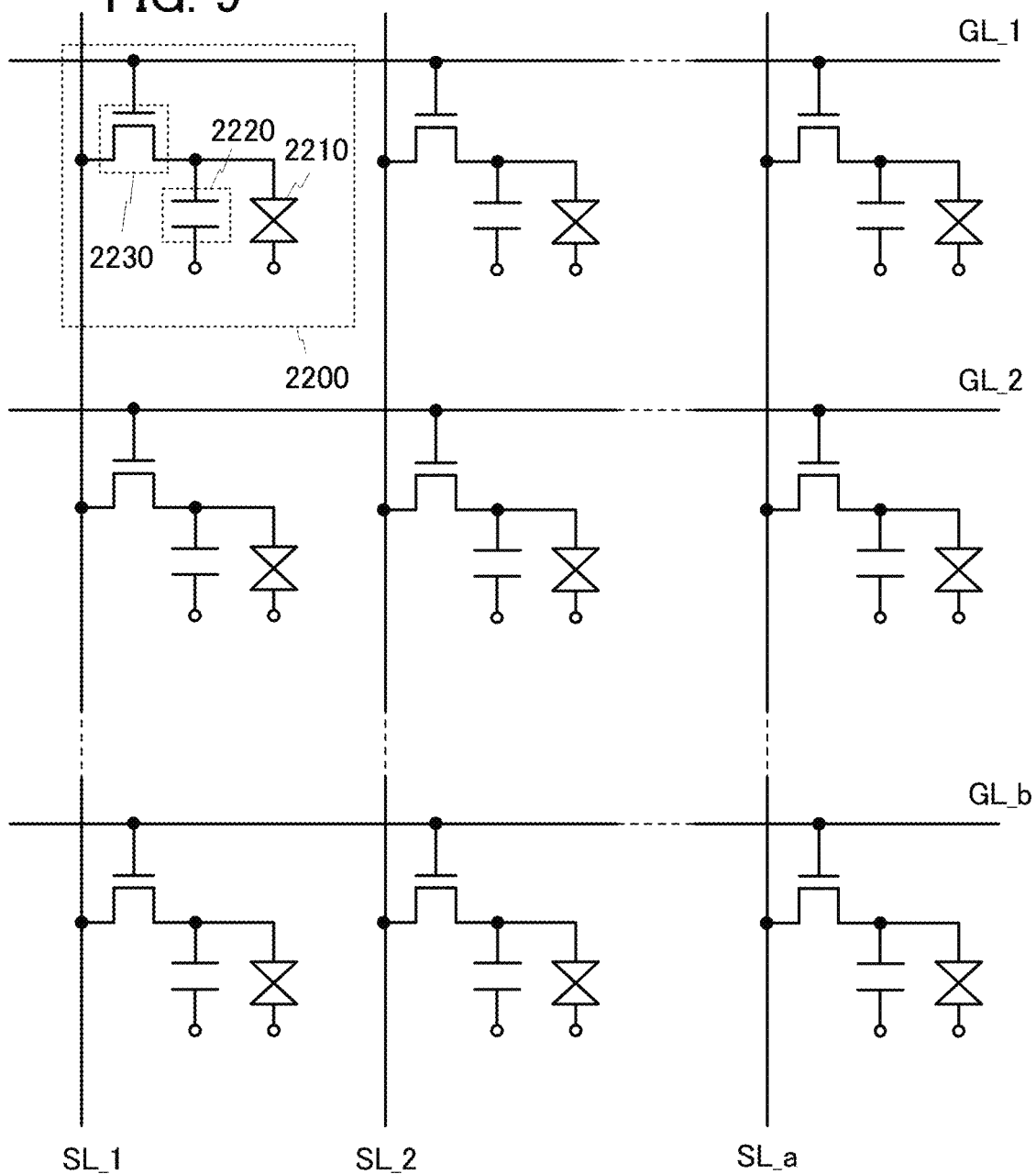

FIG. 15A    FIG. 15B
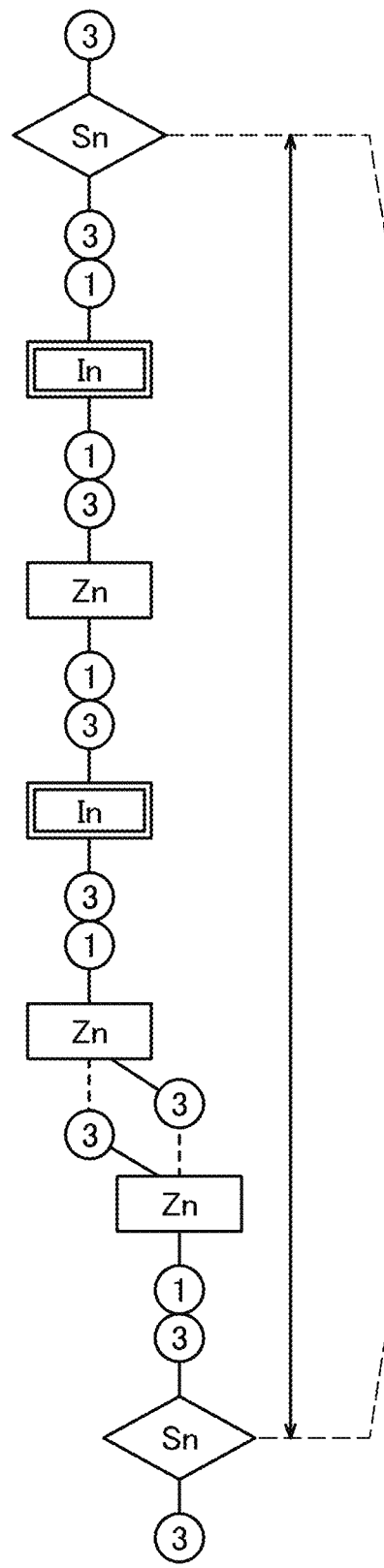
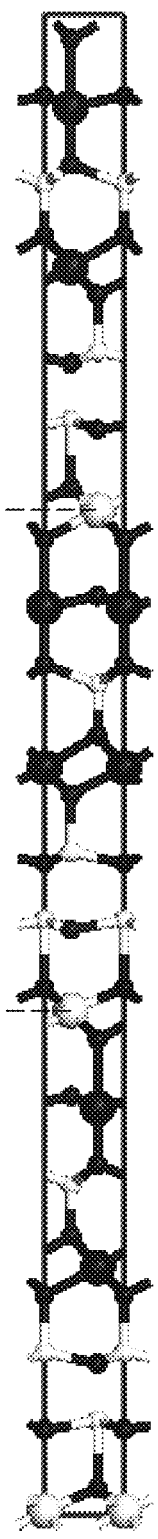
FIG. 15C
● In
○ Sn
· Zn
● O ● In
○ Ga
○ Zn
● O In
Ga
Zn
O

- In
- Ga
- Zn
- O
- C

METHOD FOR FORMING OXIDE SEMICONDUCTOR FILM, SEMICONDUCTOR DEVICE, AND METHOD FOR MANUFACTURING SEMICONDUCTOR DEVICE

BACKGROUND OF THE INVENTION

1. Field of the Invention

The present invention relates to a method for forming an oxide semiconductor film and a method for manufacturing a semiconductor device.

In this specification, a semiconductor device means a general device which can function by utilizing semiconductor characteristics, and an electrooptic device, a semiconductor circuit, and an electronic device are all semiconductor devices.

2. Description of the Related Art

A technique by which transistors are formed using semiconductor thin films formed over a substrate having an insulating surface has been attracting attention. Such transistors are applied to a wide range of electronic devices such as an integrated circuit (IC) and an image display device (display device). As materials of semiconductor thin films applicable to the transistors, silicon-based semiconductor materials have been widely used, but oxide semiconductors have been attracting attention as alternative materials.

For example, disclosure is made of a transistor whose active layer is formed using an oxide semiconductor containing In, Ga, and Zn and having an electron carrier concentration of lower than $10^{18}/cm^3$, and a sputtering method is considered the most suitable as a method for forming a film of the oxide semiconductor (see Patent Document 1).

REFERENCE

[Patent Document 1] Japanese Published Patent Application No. 2006-165528

SUMMARY OF THE INVENTION

There have been cases where transistors formed using oxide semiconductors are inferior in reliability to transistors formed using amorphous silicon. In the present invention, a semiconductor device including a highly reliable transistor formed using an oxide semiconductor is provided.

In addition, a method for forming an oxide semiconductor film, which can be used to provide such a semiconductor device, is described.

Impurities such as hydrogen, nitrogen, and carbon contained in an oxide semiconductor film might lead to less favorable semiconductor characteristics of the oxide semiconductor film.

For example, hydrogen and nitrogen which are contained in an oxide semiconductor film generate carriers in the oxide semiconductor film. Thus, hydrogen and nitrogen in the oxide semiconductor film included in a transistor might cause a shift of the threshold voltage of the transistor in the negative direction, resulting in a reduction in reliability of the transistor.

In addition, nitrogen, carbon, and a rare gas contained in an oxide semiconductor film inhibit formation of a crystalline region in the oxide semiconductor film in some cases.

For example, a nitrogen molecule and a carbon dioxide molecule have large diameter; thus, particularly inhibit formation of a crystalline region in the oxide semiconductor film. Further, when a carbon atom is substituted by a metal atom in the oxide semiconductor film, a crystal structure is cut at a position where the substitution occurs.

That is why it is important to obtain an oxide semiconductor film containing few impurities in order to manufacture a highly reliable transistor.

Specifically, the concentration of hydrogen in the oxide semiconductor film, which is measured by secondary ion mass spectrometry (SIMS), is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of nitrogen in the oxide semiconductor film, which is measured by SIMS, is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of carbon in the oxide semiconductor film, which is measured by SIMS, is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

When electrons are generated due to hydrogen (including hydrogen contained in water or the like) and nitrogen which are contained in an oxide semiconductor film included in a transistor, the drain current might flow in the transistor even without application of the gate voltage (the transistor is normally on). Note that a drain current refers to a current flowing between a source and a drain of a transistor, and a gate voltage refers to a potential difference between a source potential as a reference potential and a gate potential. Consequently, the threshold voltage shifts in the negative direction. A transistor formed using an oxide semiconductor film is likely to have n-type conductivity, and it comes to have normally-on characteristics by a shift of the threshold voltage in the negative direction.

Further, the threshold voltage of a transistor formed using an oxide semiconductor film might change due to the entry of hydrogen or nitrogen into the oxide semiconductor film after the transistor is manufactured. The shift of the threshold voltage significantly impairs the reliability of the transistor.

For that reason, hydrogen and nitrogen contained in an oxide semiconductor film and a film in contact with the oxide semiconductor film need to be reduced to form a highly reliable transistor.

Similarly, it is known that electrons are generated due to oxygen vacancies in an oxide semiconductor film.

To prevent oxygen vacancies from being caused in an oxide semiconductor film, it is preferable that the oxide semiconductor film contain oxygen between lattices. The oxygen between lattices can fill oxygen vacancies caused in the oxide semiconductor film.

In the case where an oxide semiconductor film included in a transistor is single-crystal, carriers due to oxygen vacancies are generated in the oxide semiconductor film owing to the absence of oxygen between lattices which fill the oxygen vacancies; as a result, the threshold voltage of the transistor shifts in the negative direction in some cases. Thus, the oxide semiconductor film is preferably non-single-crystal.

It is preferable that a CAAC-OS (c-axis aligned crystalline oxide semiconductor) film be used as the oxide semiconductor film.

The CAAC-OS film is not completely single-crystal nor completely amorphous. The CAAC-OS film is an oxide semiconductor film with a crystal-amorphous mixed phase structure where crystal regions and amorphous regions are included in an amorphous phase. Note that in many cases, the crystal region fits inside a cube whose one side is less than 100 nm. In an observation image obtained with a transmission electron microscope (TEM), a boundary between the amorphous region and the crystal region in the CAAC-OS film is not clear. Further, with the TEM, a grain boundary in the CAAC-OS film is not found. Thus, in the CAAC-OS film, a reduction in electron mobility due to the grain boundary is suppressed.

In the crystal regions included in the CAAC-OS film, c-axes are aligned in the direction parallel to the normal vector of a surface where the CAAC-OS film is formed or the normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that the directions of the a-axis and the b-axis of one crystal region may be different from those of another crystal region. In this specification, a simple term "perpendicular" means a range of 85° to 95°. In addition, a simple term "parallel" means a range of −5° to 5°.

In the CAAC-OS film, distribution of crystal regions is not necessarily uniform. For example, in the case where crystal growth occurs from the surface side of an oxide semiconductor film in a formation process of the CAAC-OS film, the proportion of crystal regions in the vicinity of a surface of the CAAC-OS film is higher than that in the vicinity of the surface where the CAAC-OS film is formed in some cases. Further, when an impurity is added to the CAAC-OS film, the crystal region in a region to which the impurity is added becomes amorphous in some cases.

Since the c-axes of the crystal regions included in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal region is the direction parallel to the normal vector of the surface where the CAAC-OS film is formed or the normal vector of the surface of the CAAC-OS film. The crystal region is formed by deposition or by performing treatment for crystallization such as heat treatment after deposition.

In a transistor formed using the CAAC-OS film, changes in electric characteristics due to irradiation with visible light or ultraviolet light can be reduced. Thus, the transistor has high reliability.

For improvement in crystallinity of an oxide semiconductor film, the following factors are important: the flatness of a surface where the oxide semiconductor film is formed and a formation method of the oxide semiconductor film.

Specifically, the surface where the oxide semiconductor film is formed has an average surface roughness ($R_a$) of 1 nm or less, preferably 0.3 nm or less, more preferably 0.1 nm or less.

Further, the oxide semiconductor film is preferably formed in an oxygen gas atmosphere by a sputtering method while a substrate is heated. During the film formation, the entry of impurities which inhibit formation of a crystal region in the oxide semiconductor film is suppressed as much as possible.

A specific example of the impurity inhibiting formation of a crystal region in the oxide semiconductor film is carbon dioxide. In addition, large-diameter atoms or molecules of some rare gases (helium, neon, argon, krypton, and xenon), nitrogen, carbon monoxide, and hydrocarbon might also be impurities which inhibit formation of a crystal region in the oxide semiconductor film.

To prevent the above impurities from entering the oxide semiconductor film, it is necessary to reduce impurities in a target, a deposition gas, and a deposition chamber.

Specifically, a deposition gas with a purity of 8N or more, preferably 9N or more may be used.

Impurities existing in a deposition chamber can be reduced as follows.

Impurities existing in a deposition chamber depend on a balance between the amount of gas reduced from the deposition chamber and the amount of gas leaking into the deposition chamber. Therefore, it is preferable that the amount of gas reduced from a deposition chamber be large and the amount of gas leaking into the deposition chamber be small.

The amount of gas reduced from a deposition chamber depends on the kind and capacity of a vacuum pump and the length and the thickness of a pipe connected to the vacuum pump. For example, as the pipe connected to the vacuum pump is shorter and thicker, a larger amount of gas can be reduced.

Further, parallel connection of different kinds of vacuum pumps allows a reduction of a variety of kinds of gases. For example, it is preferable to use a turbo molecular pump and a cryopump which are connected in parallel.

Alternatively, the same kinds of vacuum pumps may be connected in parallel. For example, in the case where two cryopumps are connected in parallel, while one of the cryopumps is in regeneration, evacuation can be performed with the use of the other cryopump. Accordingly, down time of an apparatus in regeneration of the cryopump can be reduced, leading to an increase in productivity. Further, when evacuation is performed using the plurality of vacuum pumps together, higher evacuation capability can be achieved.

In addition, it is also necessary to reduce the amount of gas leaking into a deposition chamber.

Leakage into a deposition chamber includes internal leakage due to impurities adsorbed onto the interior wall of the deposition chamber and external leakage from a sealed portion.

For example, to remove impurities adsorbed onto the interior wall of a deposition chamber, evacuation may be performed while the deposition chamber is heated. Heating a deposition chamber permits desorption of the impurities adsorbed onto the interior wall of the deposition chamber; thus, impurities can be efficiently removed.

Further, it is preferable to perform dummy film formation. Note that the dummy film formation refers to film formation on a dummy substrate, in which a film is deposited on the dummy substrate and the inner wall of a deposition chamber so that impurities in the deposition chamber and an adsorbate on the interior wall of the deposition chamber are confined in the film. The dummy film formation may be performed while the deposition chamber is heated.

To remove impurities present in a deposition chamber, it is preferable that a heated oxygen gas or a heated inert gas such as a heated rare gas, or the like be supplied to increase pressure in the deposition chamber, and after the elapse of a certain period of time, treatment for evacuating the deposition chamber be performed. The supply of the heated gas allows impurities adsorbed in the deposition chamber to be desorbed from the deposition chamber, so that the impurities in the deposition chamber. Note that repeated performance of this treatment is effective. A gas heating system may be provided in a deposition apparatus itself to supply a heated oxygen gas or a heated inert gas such as a heated rare gas. Provision of a gas heating system in a deposition apparatus makes it possible to reduce the piping distance between the gas heating system and a deposition chamber or the like; thus, gas can be supplied to the deposition chamber with the gas kept at a high temperature.

With the above method, the leakage rate is made to be $3\times10^{-5}$ Pa·m$^3$/s or less, preferably $1\times10^{-5}$ Pa·m$^3$/s or less, more preferably $3\times10^{-6}$ Pa·m$^3$/s or less, still more preferably $1\times10^{-6}$ Pa·m$^3$/s or less, further preferably $3\times10^{-7}$ Pa·m$^3$/s or less.

Note that the leakage rate of a gas having a mass-to-charge ratio (m/z) of 28 (e.g., nitrogen molecule) is $1\times10^{-5}$ Pa·m$^3$/s or less, preferably $3\times10^{-6}$ Pa·m$^3$/s or less.

Note that the leakage rate of a gas having a mass-to-charge ratio (m/z) of 44 (e.g., carbon oxide molecule) is $3\times10^{-6}$ Pa·m$^3$/s or less, preferably $1\times10^{-6}$ Pa·m$^3$/s or less.

Note that the leakage rate of a gas having a mass-to-charge ratio (m/z) of 18 (e.g., water molecule) is $1\times10^{-7}$ Pa·m$^3$/s or less, preferably $3\times10^{-8}$ Pa·m$^3$/s or less.

Further, with the above method, the pressure in a deposition chamber is made to be specifically $1\times10^{-4}$ Pa or less, preferably $3\times10^{-5}$ Pa or less, more preferably $1\times10^{-5}$ Pa or less.

In a deposition chamber under such a condition, an oxide semiconductor film is formed.

Note that in forming the oxide semiconductor film, it is preferable to remove impurities adsorbed onto a surface where the oxide semiconductor film is to be formed, in advance.

Specifically, plasma treatment and/or heat treatment may be performed to remove impurities adsorbed onto the surface where the oxide semiconductor film is to be formed. Note that the plasma treatment and the heat treatment are preferably performed in a reduced-pressure atmosphere. A reduced-pressure atmosphere in this specification refers to an atmosphere where the pressure is 10 Pa or less, 1 Pa or less, $1\times10^{-2}$ Pa or less, or $1\times10^{-4}$ Pa or less.

It is preferable that after the treatment for removing impurities adsorbed onto a surface where the oxide semiconductor film is to be formed, a substrate be transferred to the deposition chamber of the oxide semiconductor film so that the impurities are not adsorbed onto the surface where the oxide semiconductor film is to be formed, without exposure to the air.

Here, the oxide semiconductor film is preferably formed under the condition that the substrate heating temperature is 100° C. to 650° C. inclusive, preferably 150° C. to 600° C. inclusive, more preferably 200° C. to 500° C. inclusive. When the substrate heating temperature falls within the above range, the impurity concentration in the oxide semiconductor film can be decreased, and the oxide semiconductor film is likely to have high crystallinity.

After formation of the oxide semiconductor film, heat treatment is preferably performed. The heat treatment is performed at 250° C. to 650° C. inclusive, preferably 300° C. to 600° C. inclusive, in an inert atmosphere, a reduced-pressure atmosphere, or an oxidation atmosphere. Though the heat treatment, the impurity concentration in the oxide semiconductor film can be decreased, and the oxide semiconductor film is likely to have high crystallinity.

A transistor formed using the oxide semiconductor film formed in the aforementioned manner has high reliability and a small variation in threshold voltage.

It is possible to provide an oxide semiconductor film from which impurities such as hydrogen, nitrogen, and carbon are reduced and which have a low carrier density and high crystallinity.

With the use of the oxide semiconductor film, a transistor which has high reliability and a small variation in threshold voltage can be provided.

With the use of the transistor, a semiconductor device which has high reliability and excellent characteristics can be provided.

BRIEF DESCRIPTION OF THE DRAWINGS

In the accompanying drawings:

FIG. 9 is a circuit diagram illustrating an example of a display device;

FIGS. 15A to 15C illustrate a crystalline structure of an oxide semiconductor according to one embodiment of the present invention;

DETAILED DESCRIPTION OF THE INVENTION

Figure 1A:
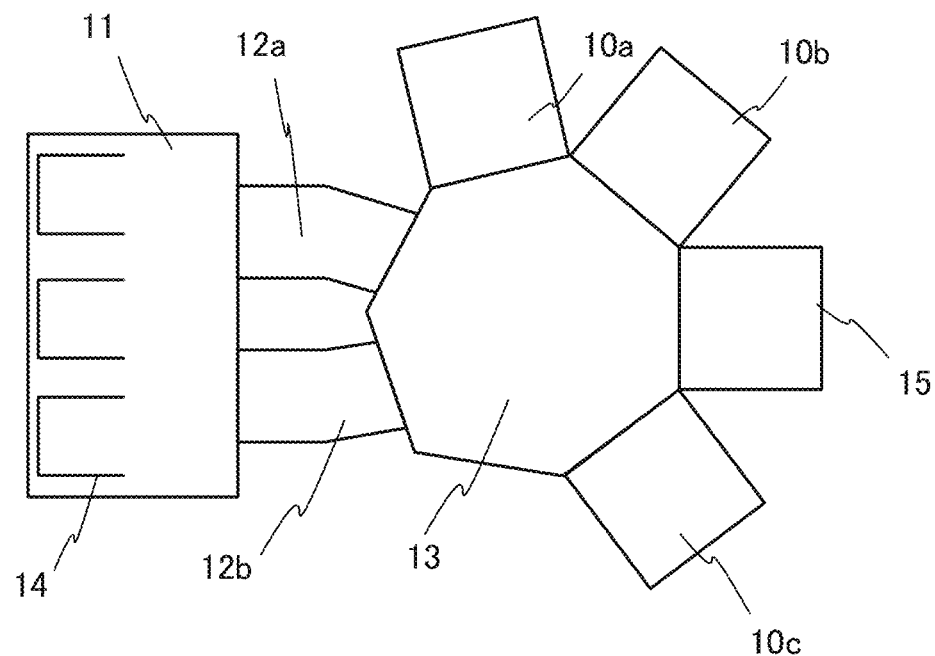
FIGS. 1A and 1B are top views which illustrate examples of deposition apparatuses.

Hereinafter, embodiments and examples of the present invention will be described in detail with reference to the accompanying drawings. However, the present invention is not limited to the following description, and it is easily understood by those skilled in the art that modes and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the ordinal numbers such as "first" and "second" in this specification are used for the sake of convenience and do not denote the order of steps or the stacking order of layers. In addition, the ordinal numbers in this specification do not denote particular names which specify the present invention.

Embodiment 1

In this embodiment, a method for forming an oxide semiconductor film containing few impurities and a transistor formed using the oxide semiconductor film will be described.

First, a structure of a deposition apparatus which allows the entry of few impurities during film formation will be described using FIGS. 1A and 1B.

FIG. 1A illustrates a multi-chamber deposition apparatus. The deposition apparatus includes a substrate supply chamber 11 provided with three cassette ports 14 for holding substrates, load lock chambers 12a and 12b, a transfer chamber 13, a substrate heating chamber 15, and deposition chambers 10a, 10b, and 10c. The substrate supply chamber 11 is connected to the load lock chambers 12a and 12b. The load lock chambers 12a and 12b are connected to the transfer chamber 13. The substrate heating chamber 15 and the deposition chambers 10a to 10c are each connected only to the transfer chamber 13. A gate valve is provided for a connecting portion between chambers so that each chamber can be independently kept under vacuum. Although not illustrated, the transfer chamber 13 has one or more substrate transfer robots. Here, the substrate heating chamber 15 preferably also serves as a plasma treatment chamber. With a single wafer multi-chamber deposition apparatus, a substrate does not need to be exposed to the air between treatments, and adsorption of impurities to a substrate can be suppressed. In addition, the order of film formation, heat treatment, or the like can be freely determined. Note that the number of the deposition chambers, the number of the load lock chambers, and the number of the substrate heating chambers are not limited to the above, and can be determined as appropriate depending on the space for placement or the process.

Figure 2A:
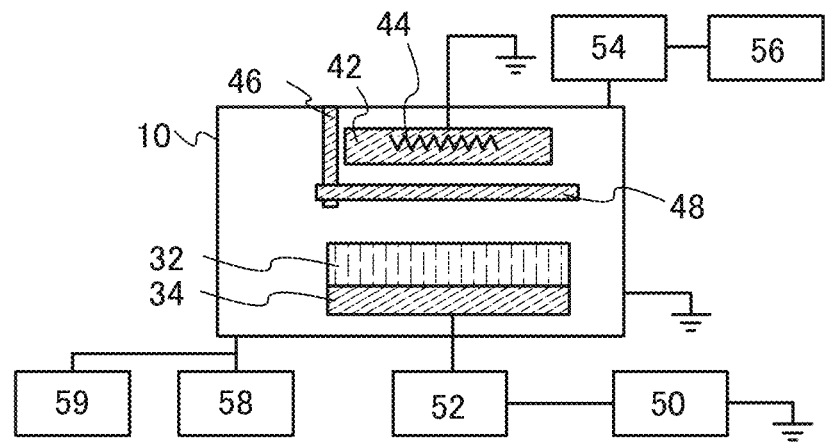
FIGS. 2A and 2B illustrate a deposition chamber and a substrate heating chamber, respectively.

An example of a deposition chamber (sputtering chamber) illustrated in FIG. 1A will be described with reference to FIG. 2A. A deposition chamber 10 includes a target 32, a target holder 34 for holding a target, a substrate holder 42 for holding a substrate, which is embedded with a substrate heater 44, and a shutter plate 48 capable of being rotated about a shutter axis 46. The target holder 34 is connected to an RF power source 50 for supplying power through a matching box 52. The deposition chamber 10 is connected to a gas supply source 56 through a refiner 54 and is connected to a vacuum pump 58 and a vacuum pump 59. Here, the deposition chamber 10, the RF power source 50, the shutter axis 46, the shutter plate 48, and the substrate holder 42 are grounded. Note that one or more of the deposition chamber 10, the shutter axis 46, the shutter plate 48, and the substrate holder 42 may be in a floating state depending on the use.

Further, the number of vacuum pumps is not limited to two (the vacuum pumps 58 and 59), and three or more vacuum pumps may be provided or only one of the vacuum pumps may be provided. For example, another vacuum pump may be provided in series with the vacuum pump 58.

As the vacuum pumps 58 and 59, a rough vacuum pump such as a dry pump and high vacuum pumps such as a sputter ion pump, a turbo molecular pump, and a cryopump may be used in appropriate combination. It is known that the turbo molecular pump is capable of stably removing a gas of a large-diameter atom or molecule, needs low frequency of maintenance, and thus enables high productivity, whereas it has a low capability in removing hydrogen and water. Hence, a combination of a cryopump having a high capability in removing an atom or molecule having a relatively high melting point, such as water, and a sputter ion pump having a high capability in removing a highly reactive atom or molecule is effective. Further, a turbo molecular pump provided with a cryotrap may be used for the vacuum pump. The temperature of a refrigerator of the cryotrap is 100 K or lower, preferably 80 K or lower. In the case where the cryotrap includes a plurality of refrigerators, it is preferable to set the temperatures of the refrigerators at different temperatures because efficient evacuation is possible. For example, the temperatures of a first-stage refrigerator and a second-stage refrigerator may be set at 100 K or lower and 20 K or lower, respectively.

Note that a cryopump is an entrapment pump; thus, regeneration needs to be performed regularly. The cryopump is not used very often for an apparatus for mass production because it cannot perform evacuation during regeneration, resulting in low productivity. To solve this problem, two or more cryopumps may be connected in parallel. In the case where two or more cryopumps are connected in parallel, even when one of the cryopumps is in regeneration, evacuation can be performed with the use of any of the other cryopumps. Alternatively, a cryopump and a turbo molecular pump may be connected in parallel. In this case, for example, the turbo molecular pump is used for evacuation in film formation and the cryopump is used in a process except for film formation, so that the frequency of regeneration can be reduced.

Further, the number of the gas supply sources 56 and the number of the refiners 54 may each be plural. For example, the number of deposition gas supply sources and the number of refiners can each be increased depending on the number of kinds of deposition gases. The gas supply sources and the refiners may be directly connected to the deposition chamber 10. In such a case, a mass flow controller for controlling the flow rate of a deposition gas may be provided between each refiner and the deposition chamber 10. Alternatively, the gas supply sources and the refiners may be connected to pipes between the deposition chamber 10 and the refiners 54.

Figure 38A:
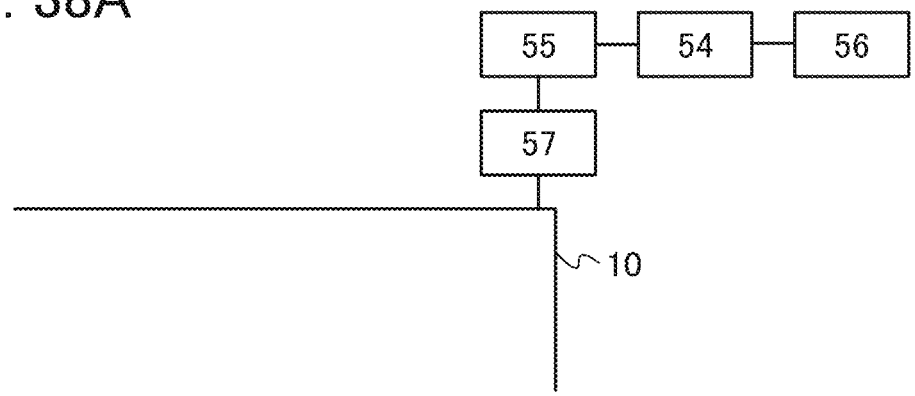
FIGS. 38A to 38C are diagrams each illustrating a connecting method of a gas heating system.
Figure 38B:
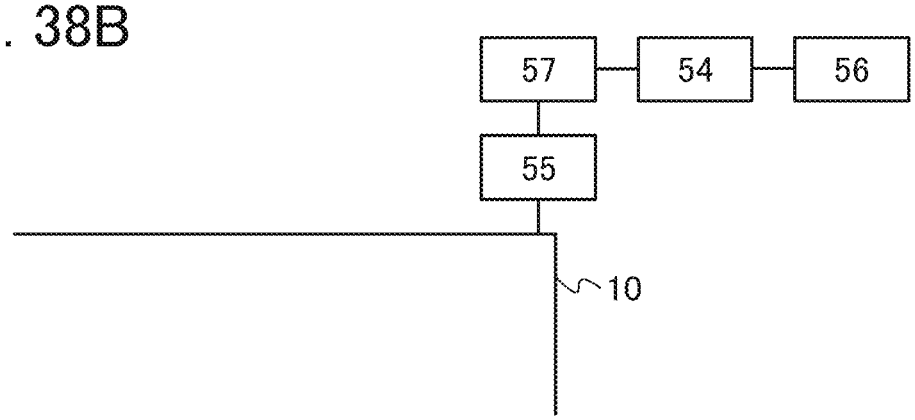
Figure 38C:
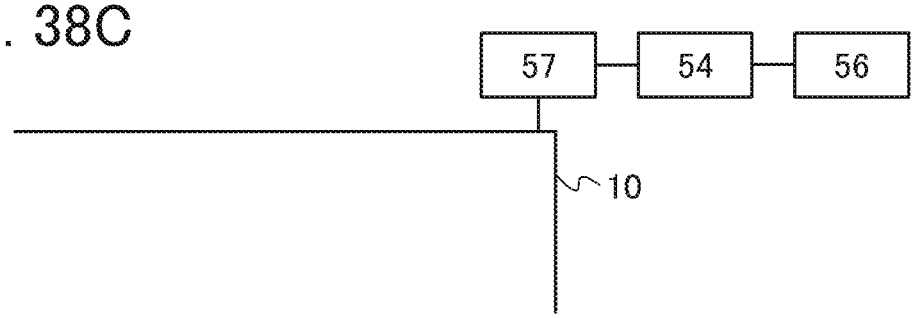

An example in which a gas heating system is provided between the refiner 54 and the deposition chamber 10 will be described with reference to FIG. 38A to 38C. FIG. 38A to 38C each illustrate a detailed structure of connection from the gas supply source 56 to the deposition chamber 10.

FIG. 38A illustrates a structure in which the deposition chamber 10 and the gas heating system 57 are connected through a pipe, the gas heating system 57 and a mass flow controller 55 are connected through a pipe, the mass flow controller 55 and the refiner 54 are connected through a pipe, and the refiner 54 and the gas supply source 56 are connected through a pipe.

FIG. 38B illustrates a structure in which the deposition chamber 10 and the mass flow controller 55 are directly connected through a pipe, the mass flow controller 55 and the gas heating system 57 are connected through a pipe, the gas heating system 57 and the refiner 54 are connected through a pipe, and the refiner 54 and the gas supply source 56 are connected through a pipe.

Note that it is preferable to use a mass flow controller which can accurately control the flow rate of even a heated gas, in the case of using a heated gas.

FIG. 38C illustrates a structure in which the deposition chamber 10 and the gas heating system 57 are connected through a pipe, the gas heating system 57 and the refiner 54 are connected through a pipe, and the refiner 54 and the gas supply source 56 are connected through a pipe.

In the structure in FIG. 38C, a mass flow controller is not provided, and a gas flow rate control system different from a mass flow controller may be provided. Alternatively, a system with which a certain amount of gas is supplied may be provided.

The structure in FIG. 38C may be used, for example, in the case where the gas flow rate is not necessarily controlled with high accuracy. A mass flow controller needs regular maintenance and replacement of components as well as being relatively expensive. Thus, the structure in FIG. 38C without a mass flow controller permits reduction in cost of an apparatus.

For example, the structure in FIG. 38C may be used to reduce impurities in the deposition chamber 10 in which a heated gas which is described later is used.

With the gas heating system 57, a gas to be supplied to the deposition chamber 10 can be heated to 40° C. to 400° C. inclusive, preferably 50° C. to 200° C. inclusive.

Subsequently, the deposition chamber illustrated in FIG. 2A will be described. In is preferable to provide a magnet inside or below the target holder 34, which is not illustrated, because high-density plasma can be confined on the periphery of the target. With this method called a magnetron sputtering method, an increase in deposition rate, a reduction in plasma damage on the substrate, and an improvement in film quality can be achieved. When the magnet can be rotated in employing a magnetron sputtering method, non-uniformity of a magnetic field can be suppressed, so that efficiency of use of the target can be increased and variation in film quality in a substrate plane can be reduced.

Although the RF power source is used as a sputtering power source here, one embodiment of the present invention is not necessarily limited to an RF power source. A DC power source, an AC power source, or two kinds or more power sources between which switching can be performed may be provided depending on the use. In the case where a DC power source or an AC power source is used, the matching box between the power source and the target holder is not necessary.

The substrate holder 42 needs to be provided with a chuck system for supporting a substrate. As the chuck system, an electrostatic chuck system, a clamp system, and the like can be given. To increase the uniformity of film quality and film thickness in a substrate plane, the substrate holder 42 may be provided with a rotating system. Further, a plurality of substrate holders may be provided in the deposition chamber so that film formation of a plurality of substrates can be performed simultaneously. Furthermore, a structure may be employed in which the shutter axis 46, the shutter plate 48, and the substrate heater 44 are not provided. In the structure in FIG. 2A, the target faces upward and the substrates faces downward; however, it is also possible to employ a structure in which the target faces downward and the substrate faces upward, or a structure in which the target and the substrate are provided sideways so that they face each other.

In the substrate heating chamber 15, for example, a resistance heater or the like may be used for heating. Alternatively, heat conduction or heat radiation from a medium such as a heated gas may be used for heating. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas.

Figure 2B:
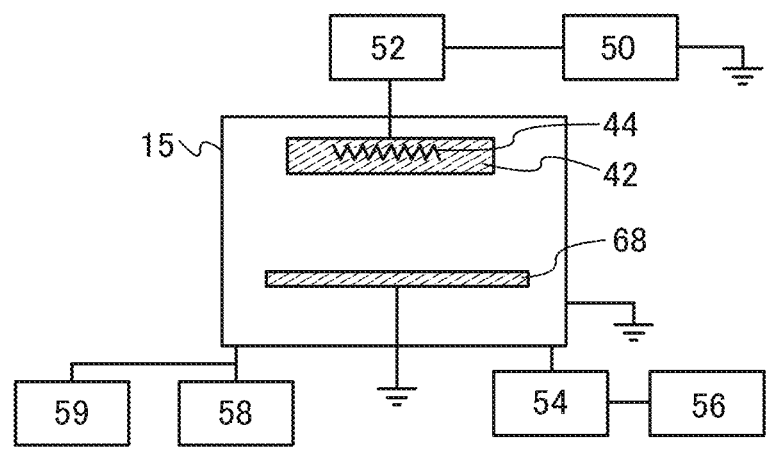

For example, the substrate heating chamber 15 can have a structure illustrated in FIG. 2B. In the substrate heating chamber 15, the substrate holder 42 embedded with the substrate heater 44 is provided. The substrate heating chamber 15 is connected to the gas supply source 56 through the refiner 54 and is connected to the vacuum pump 58 and the vacuum pump 59. Note that instead of a heating system with a substrate heater, an LRTA apparatus may be provided so as to face the substrate holder. In such a case, a reflective plate may be provided on the substrate holder 42 to transmit heat efficiently. Here, in the case where the substrate heating chamber 15 also serves as a plasma treatment chamber, the substrate holder 42 is connected to the RF power source 50 through the matching box 52, and a counter electrode 68 is provided so as to face the substrate holder 42.

Note that the back pressure of each of the deposition chamber 10 and the substrate heating chamber 15 is $1 \times 10^{-4}$ Pa or less, preferably $3 \times 10^{-5}$ Pa or less, more preferably $1 \times 10^{-5}$ Pa or less.

In each of the deposition chamber 10 and the substrate heating chamber 15, the partial pressure of a gas having a mass-to-charge ratio (m/z) of 18 is $3 \times 10^{-5}$ Pa or less, preferably $1 \times 10^{-5}$ Pa or less, more preferably $3 \times 10^{-6}$ Pa or less.

In each of the deposition chamber 10 and the substrate heating chamber 15, the partial pressure of a gas having a mass-to-charge ratio (m/z) of 28 is $3 \times 10^{-5}$ Pa or less, preferably $1 \times 10^{-5}$ Pa or less, more preferably $3 \times 10^{-6}$ Pa or less.

In each of the deposition chamber 10 and the substrate heating chamber 15, the partial pressure of a gas having a mass-to-charge ratio (m/z) of 44 is $3 \times 10^{-5}$ Pa or less, preferably $1 \times 10^{-5}$ Pa or less, more preferably $3 \times 10^{-6}$ Pa or less.

Further, in each of the deposition chamber 10 and the substrate heating chamber 15, the leakage rate is $3 \times 10^{-6}$ Pa·m$^3$/s or less, preferably $1 \times 10^{-6}$ Pa·m$^3$/s or less.

In each of the deposition chamber 10 and the substrate heating chamber 15, the leakage rate of a gas having a mass-to-charge ratio (m/z) of 18 is $1 \times 10^{-7}$ Pa·m$^3$/s or less, preferably $3 \times 10^{-8}$ Pa·m$^3$/s or less.

In each of the deposition chamber 10 and the substrate heating chamber 15, the leakage rate of a gas having a mass-to-charge ratio (m/z) of 28 is $1 \times 10^{-5}$ Pa·m$^3$/s or less, preferably $1 \times 10^{-6}$ Pa·m$^3$/s or less.

In each of the deposition chamber 10 and the substrate heating chamber 15, the leakage rate of a gas having a mass-to-charge ratio (m/z) of 44 is $3 \times 10^{-6}$ Pa·m$^3$/s or less, preferably $1 \times 10^{-6}$ Pa·m$^3$/s or less.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be lower than or equal to the above value.

For example, an open/close portion of the deposition chamber is preferably sealed with a metal gasket. For the metal gasket, a metal material covered with iron fluoride, aluminum oxide, or chromium oxide is preferably used. The metal gasket enables higher adhesion than an O-ring, leading to a reduction in the external leakage. Further, by use of a metal material covered with iron fluoride, aluminum oxide, chromium oxide, or the like which is in the passive state, the release of gas containing impurities generated from the metal gasket is suppressed, so that the internal leakage can be reduced.

For a member of the deposition apparatus, aluminum, chromium, titanium, zirconium, nickel, or vanadium, which releases a smaller amount of gas containing impurities, is used. Alternatively, an alloy material containing iron, chromium, nickel, and the like covered with the above material may be used. The alloy material containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus may be covered with iron fluoride, aluminum oxide, chromium oxide, or the like.

The member of the deposition apparatus is preferably formed using only a metal material when possible. For example, in the case where a viewing window formed using quartz or the like is provided, a surface is preferably covered thinly with iron fluoride, aluminum oxide, chromium oxide, or the like to suppress the release of gas.

When the refiner of a deposition gas is provided, the length of a pipe between the refiner and the deposition chamber is less than or equal to 5 m, preferably less than or equal to 1 m. When the length of the pipe is less than or equal to 5 m or less than or equal to 1 m, the effect of the release of gas from the pipe can be reduced accordingly.

As the pipe for the deposition gas, a metal pipe the inside of which is covered with iron fluoride, aluminum oxide, chromium oxide, or the like is preferably used. With the above pipe, the amount of released gas containing impurities is small and the entry of impurities into the deposition gas can be reduced as compared with a SUS316L-EP pipe, for example. Further, a high-performance ultra-compact metal gasket joint (UPG joint) is preferably used as a joint of the pipe. A structure where all the materials of the pipe are metal materials is preferable because the effect of the release of gas or the external leakage can be reduced as compared to a structure where resin or the like is used.

An adsorbate does not affect the pressure in the deposition chamber when existing in the deposition chamber; however, the adsorbate releases gas at the time of the evacuation of the deposition chamber. Therefore, although there is no correlation between the leakage rate and the evacuation rate, it is important that the adsorbate present in the deposition chamber be desorbed as much as possible and evacuation be performed in advance with the use of a pump with high evacuation capability. Note that the deposition chamber may be heated for promotion of desorption of the adsorbate. By the heating, the rate of desorption of the adsorbate can be increased about tenfold. The heating may be performed at a temperature in the range of 100° C. to 450° C. At this time, when the adsorbate is removed while an inert gas is supplied, the desorption rate of water or the like, which is difficult to desorb simply by evacuation, can be further increased. Note that when the inert gas to be supplied is heated to substantially the same temperature as the heating temperature of the deposition chamber, the desorption rate of the adsorbate can be further increased. Here, a rare gas is preferably used as an inert gas. Depending on the kind of a film to be formed, oxygen or the like may be used instead of an inert gas. For example, in the case of depositing an oxide, using oxygen, which is the main component of the oxide, is preferable in some cases.

Alternatively, treatment for evacuating the deposition chamber is preferably performed a certain period of time after a heated oxygen gas, a heated inert gas such as a heated rare gas, or the like is supplied to increase pressure in the deposition chamber. The supply of the heated gas facilitates desorption of the adsorbate in the deposition chamber. Note that a positive effect can be achieved when this treatment is repeated 2 to 30 times inclusive, preferably 5 to 15 times inclusive. Specifically, an inert gas, oxygen, or the like at a temperature in the range of 40° C. to 400° C., preferably 50° C. to 200° C. is supplied to the deposition chamber so that the pressure therein is kept at 0.1 Pa to 10 kPa inclusive, 1 Pa to 1 kPa inclusive, or 5 Pa to 100 Pa inclusive for 1 minute to 300 minutes inclusive or 5 minutes to 120 minutes inclusive. After that, the deposition chamber is evacuated for 5 minutes to 300 minutes inclusive or 10 minutes to 120 minutes inclusive.

The rate of desorption of the adsorbate can be further increased also by dummy film formation. For a dummy substrate, a material which releases a smaller amount of gas is preferably used, and for example, the same material as that of a substrate 100 which is to be described later may be used. Note that the dummy film formation may be performed at the same time as the heating of the deposition chamber.

Figure 1B:
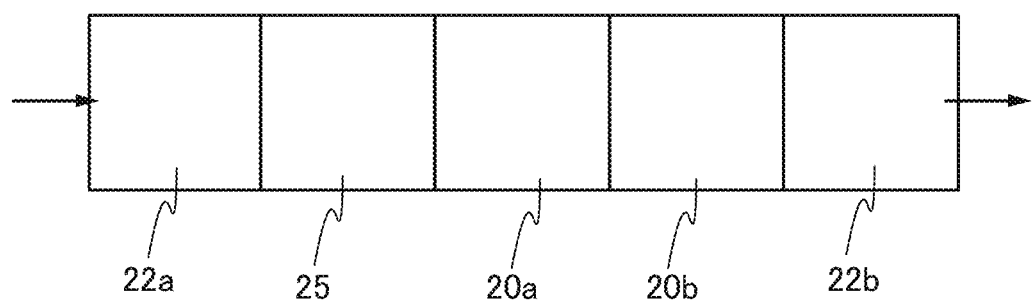

FIG. 1B illustrates a deposition apparatus having a structure different from that in FIG. 1A. The deposition apparatus includes a load lock chamber 22a, a substrate heating chamber 25, deposition chambers 20a and 20b, and a load lock chamber 22b. The load lock chamber 22a is connected to the substrate heating chamber 25. The substrate heating chamber 25 is connected to the deposition chamber 20a. The deposition chamber 20a is connected to the deposition chamber 20b. The deposition chamber 20b is connected to the load lock chamber 22b. A gate valve is provided for a connecting portion between chambers so that each chamber can be independently kept in a vacuum state. Note that the deposition chambers 20a and 20b have structures similar to those of the deposition chambers 10a to 10c in FIG. 1A. The substrate heating chamber 25 has a structure similar to that of the substrate heating chamber 15 in FIG. 1A. A substrate is transferred in only one direction indicated by arrows in FIG. 1B, and an inlet and an outlet for the substrate are different. Unlike the single wafer multi-chamber deposition apparatus in FIG. 1A, there is no transfer chamber, and the footprint can be reduced accordingly. Note that the number of the deposition chambers, the number of the load lock chambers, and the number of the substrate heating chambers are not limited to the above, and can be determined as appropriate depending on the space for placement or the process. For example, the deposition chamber 20b may be omitted, or a second substrate heating chamber or a third deposition chamber which is connected to the deposition chamber 20b may be provided.

When an oxide semiconductor film is formed with the use of the above deposition apparatus, the entry of impurities into the oxide semiconductor film can be suppressed. Furthermore, when a film in contact with the oxide semiconductor film is formed with the use of the above deposition apparatus, the entry of impurities into the oxide semiconductor film from the film in contact therewith can be suppressed.

Next, a method for forming an oxide semiconductor film in which the concentration of hydrogen, nitrogen, and carbon, which are impurities, is low.

The oxide semiconductor film is formed in an oxygen gas atmosphere at a substrate heating temperature of 100° C. to 600° C. inclusive, preferably 150° C. to 550° C. inclusive, and more preferably 200° C. to 500° C. inclusive. The thickness of the oxide semiconductor film is more than or equal to 1 nm and less than or equal to 40 nm, and preferably more than or equal to 3 nm and less than or equal to 20 nm. As the substrate heating temperature at the time of film formation is higher, the impurity concentration of the obtained oxide semiconductor film is lower. Further, the atomic arrangement in the oxide semiconductor film is ordered and the density thereof is increased, so that a polycrystalline film or a CAAC-OS film is likely to be formed. Furthermore, since an oxygen gas atmosphere is employed for the film formation, an unnecessary atom is not contained in the oxide semiconductor film unlike in the case of employing a rare gas atmosphere or the like, so that a polycrystalline film or a CAAC-OS film is readily formed. Note that a mixed atmosphere of an oxygen gas and a rare gas may be used. In that case, the percentage of the oxygen gas is higher than or equal to 30 vol. %, preferably higher than or equal to 50 vol. %, more preferably higher than or equal to 80 vol. %. As the oxide semiconductor film is thinner, the short channel effect of the transistor can be reduced. However, when the semiconductor film is too thin, it is significantly influenced by interface scattering; thus, the field-effect mobility might be decreased.

The oxide semiconductor film is formed under the condition that the deposition pressure is less than or equal to 0.8 Pa, preferably less than or equal to 0.4 Pa, and the distance between a target and a substrate is less than or equal to 40 mm, preferably less than or equal to 25 mm. When the oxide semiconductor film is formed under such a condition, the frequency of the collision of a sputtered particle and another sputtered particle, a gas, or an ion can be reduced. That is, depending on the deposition pressure, the distance between the target and the substrate is made shorter than the mean free path of a sputtered particle, a gas, or an ion, so that the entry of impurities into the film can be reduced.

For example, when the pressure is 0.4 Pa and the temperature is 25° C. (the absolute temperature is 298 K), a hydrogen molecule (H$_2$) has a mean free path of 48.7 mm, a helium atom (He) has a mean free path of 57.9 mm, a water molecule (H$_2$O) has a mean free path of 31.3 mm, an ethane molecule (CH$_4$) has a mean free path of 13.2 mm, a neon atom (Ne) has a mean free path of 42.3 mm, a nitrogen molecule (N$_2$) has a mean free path of 23.2 mm, a carbon monoxide molecule (CO) has a mean free path of 16.0 mm, an oxygen molecule (O$_2$) has a mean free path of 26.4 mm, an argon atom (Ar) has a mean free path of 28.3 mm, a carbon dioxide molecule (CO$_2$) has a mean free path of 10.9 mm, a krypton atom (Kr) has a mean free path of 13.4 mm, and a xenon atom (Xe) has a mean free path of 9.6 mm. Note that a doubling of the pressure halves a mean free path and a doubling of the absolute temperature doubles a mean free path.

The mean free path depends on pressure, temperature, and the diameter of an atom or molecule. In the case where pressure and temperature are constant, as the diameter of an atom or molecule is larger, the mean free path is shorter. Note that the diameters of the following atoms or molecules are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of an atom or molecule is larger, the mean free path is shorter and the growth of a crystal region is inhibited due to the large diameter of the atom or molecule when the molecule enters the film. For this reason, it can be said that, for example, an atom or molecule with a diameter of an Ar atom or larger is likely to serve as an impurity.

Here, whether the crystal structure can be maintained in the case where $CO_2$ is added between layers of an In—Ga—Zn—O crystal was evaluated by classical molecular dynamics simulation.

Figure 30:
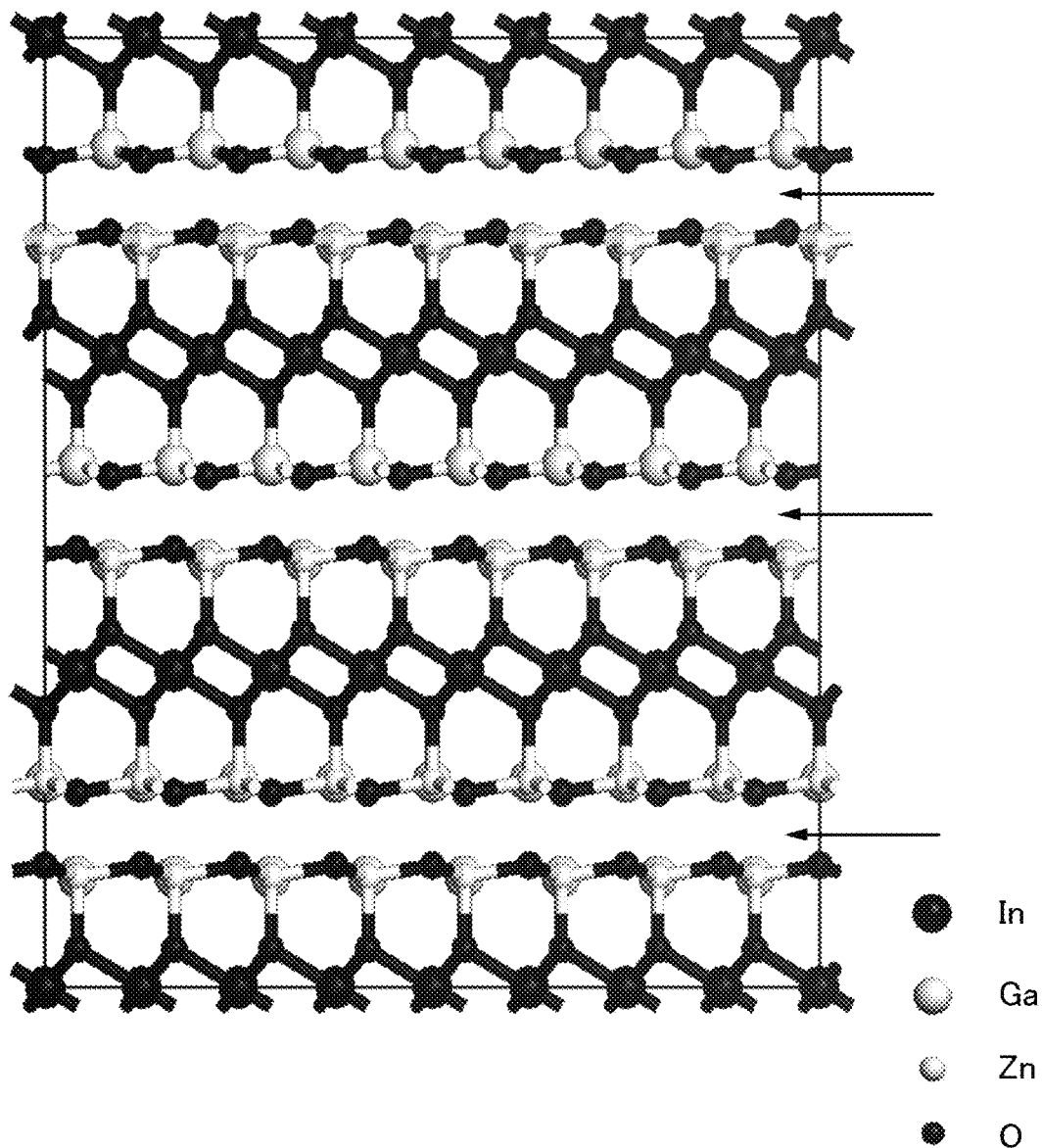
FIG. 30 is a diagram illustrating a crystal structure of an oxide semiconductor according to one embodiment of the present invention.

FIG. 30 is a schematic diagram of an In—Ga—Zn—O crystal. Here, $CO_2$ was added to layers indicated by arrows in FIG. 30. The additive rate of $CO_2$ with respect to all atoms in the In—Ga—Zn—O crystal was 0.07% ($5.19\times10^{19}/cm^3$), 0.15% ($1.04\times10^{20}/cm^3$), 0.22% ($1.65\times10^{20}/cm^3$), 0.30% ($2.08\times10^{20}/cm^3$), 0.37% ($2.60\times10^{20}/cm^3$), 0.44% ($3.11\times10^{20}/cm^3$), 0.52% ($3.63\times10^{20}/cm^3$), 0.59% ($4.15\times10^{20}/cm^3$), or 0.67% ($4.67\times10^{20}/cm^3$).

For the simulation, Materials Explorer 5.0 manufactured by Fujitsu Limited was used, and the temperature, the pressure, the time step size, and the number of steps were 298 K, 1 atmospheric pressure, 0.2 fs, and 5,000,000 times, respectively.

As a result, when the additive rate of $CO_2$ was 0.07% to 0.52%, the In—Ga—Zn—O crystal was maintained, whereas when the additive rate of $CO_2$ was 0.59% to 0.67%, the In—Ga—Zn—O crystal was not able to be maintained.

This result reveals that the rate of $CO_2$ with respect to all atoms in the In—Ga—Zn—O crystal needs to be less than or equal to 0.52% or less than 0.59% so that the In—Ga—Zn—O crystal can be obtained.

Next, heat treatment is performed. The heat treatment is performed at 250° C. to 650° C. inclusive, preferably 300° C. to 600° C. inclusive in a reduced pressure atmosphere, an inert atmosphere, or an oxidation atmosphere. By the heat treatment, the impurity concentration in the oxide semiconductor film can be reduced. Further, the oxide semiconductor film is likely to have high crystallinity. The oxidation atmosphere refers to an atmosphere containing an oxidation gas such as oxygen, ozone, or nitrous oxide at 10 ppm or higher.

The heat treatment is preferably performed in such a manner that after heat treatment is performed in a reduced pressure atmosphere or an inert atmosphere, the atmosphere is switched to an oxidation atmosphere with the temperature maintained and heat treatment is further performed. When the heat treatment is performed in a reduced pressure atmosphere or an inert atmosphere, the impurity concentration in the oxide semiconductor film can be reduced; however, oxygen vacancies are caused at the same time. By the heat treatment in an oxidation atmosphere, the caused oxygen vacancies can be reduced.

When heat treatment is performed on the oxide semiconductor film after the film formation in addition to the substrate heating in the film formation, the impurity concentration in the film can be significantly reduced.

With the above deposition apparatus, an oxide semiconductor film containing few impurities can be formed. Such an oxide semiconductor film containing few impurities has a low carrier density and high crystallinity; thus, the semiconductor characteristics thereof are excellent. Accordingly, a transistor including such an oxide semiconductor film can be highly reliable.

Specifically, the concentration of hydrogen in the oxide semiconductor film, which is measured by SIMS, is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$.

The concentration of nitrogen in the oxide semiconductor film, which is measured by SIMS, is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$.

The concentration of carbon in the oxide semiconductor film, which is measured by SIMS, is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$.

The amount of each of the following gass released from the oxide semiconductor film is $1\times10^{19}/cm^3$ or less, preferably $1\times10^{18}/cm^3$ or less, which is measured by thermal desorption spectroscopy (TDS) analysis: a gas having a mass-to-charge ratio (m/z) of 2 (e.g., water molecule), a gas having a mass-to-charge ratio (m/z) of 18, a gas having a mass-to-charge ratio (m/z) of 28, and a gas having a mass-to-charge ratio (m/z) of 44.

A measurement method of the amount of released oxygen atoms, which is to be described later, is referred to for a measurement method of the release amount using TDS analysis.

Subsequently, a transistor including the oxide semiconductor film formed using the above deposition apparatus will be described with reference to FIGS. 3A and 3B, FIGS. 4A and 4B, FIGS. 5A and 5B, FIGS. 6A and 6B, FIGS. 7A to 7C, and FIGS. 8A and 8B.

Transistors illustrated in FIGS. 3A and 3B, FIGS. 4A and 4B, FIGS. 5A and 5B, and FIGS. 6A and 6B are excellent in productivity because the number of photolithography processes is small. The transistors in FIGS. 3A and 3B, FIGS. 4A and 4B, FIGS. 5A and 5B, and FIGS. 6A and 6B are often used for display devices in which transistors have relatively large sizes, and the like.

Figure 3A:
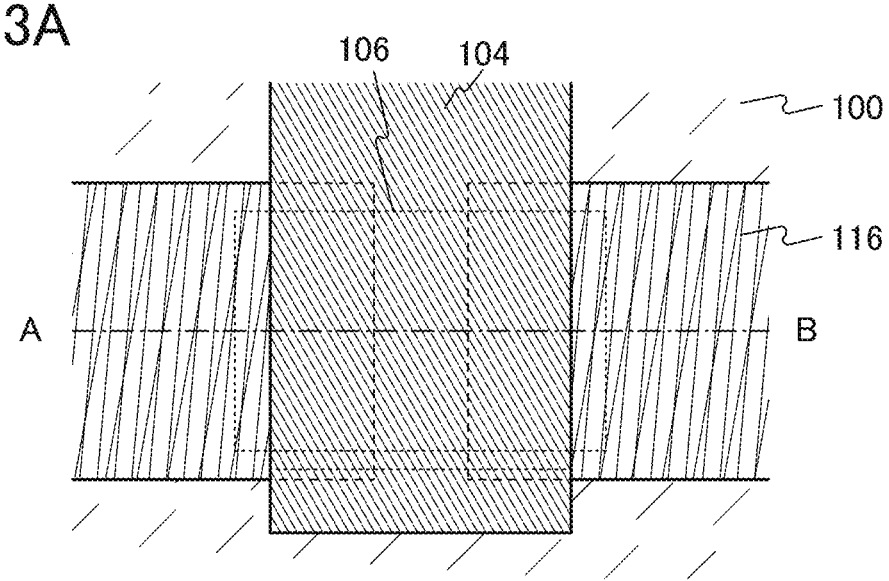
FIGS. 3A and 3B are a top view and a cross-sectional view which illustrate an example of a transistor.
Figure 3B:
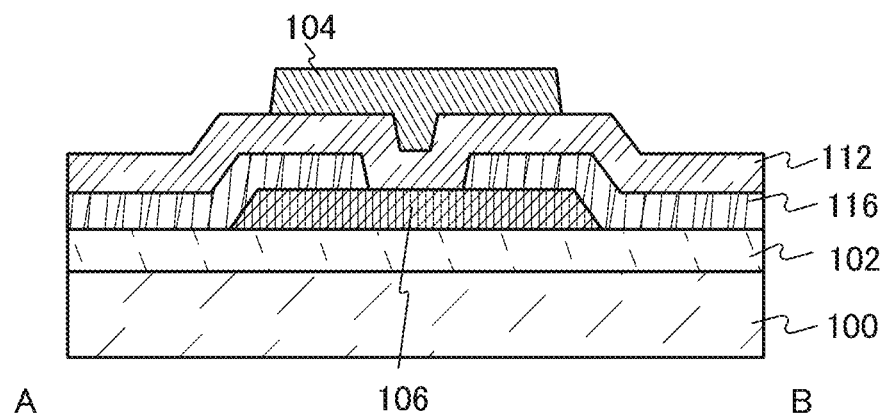

First, the structure of the transistor in FIGS. 3A and 3B will be described. FIG. 3A is a top view of the transistor. FIG. 3B is a cross-sectional view along dashed-dotted line A-B in FIG. 3A.

The transistor in FIG. 3B includes, over the substrate 100, a base insulating film 102; an oxide semiconductor film 106 provided over the base insulating film 102; a pair of electrodes 116 provided over and at least partly in contact with the oxide semiconductor film 106; a gate insulating film 112 provided to cover the oxide semiconductor film 106 and the pair of electrodes 116; and a gate electrode 104 provided to overlap with the oxide semiconductor film 106 with the gate insulating film 112 interposed therebetween.

Here, the oxide semiconductor film with a low impurity concentration described in this embodiment may be used as the oxide semiconductor film 106.

The thickness of the oxide semiconductor film 106 is larger than or equal to 1 nm and smaller than or equal to 50 nm, preferably larger than or equal to 3 nm and smaller than or equal to 20 nm. Particularly in the case where the transistor has a channel length of 30 nm or less and the oxide semiconductor film 106 has a thickness of around 5 nm, a short channel effect can be suppressed and stable electrical characteristics can be obtained.

The oxide semiconductor film 106 preferably contains at least In and Zn. Further, it is preferable that the oxide semiconductor film 106 contain Ga, Sn, Hf, or Al in addition to In and Zn so that variations in electric characteristics of the transistor can be reduced.

Alternatively, the oxide semiconductor film 106 may contain one or more kinds of lanthanoid such as La, Ce, Pr, Nd, Sm, Eu, Gd, Tb, Dy, Ho, Er, Tm, Yb, and Lu in addition to In and Zn so that variations in electric characteristics of the transistor can be reduced.

For the oxide semiconductor film 106, any of the followings can be used for example: two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material, three-component metal oxides such as an In—Ga—Zn—O-based material, an In—Al—Zn—O-based material, an In—Sn—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, and an In—Lu—Zn—O-based material, and four-component metal oxides such as an In—Sn—Ga—Zn—O-based material, an In—Hf—Ga—Zn—O-based material, an In—Al—Ga—Zn—O-based material, an In—Sn—Al—Zn—O-based material, an In—Sn—Hf—Zn—O-based material, and an In—Hf—Al—Zn—O-based material.

For example, an "In—Ga—Zn—O-based material" means an oxide containing In, Ga, and Zn as its main components and there is no particular limitation on the ratio of In:Ga:Zn.

For example, high field-effect mobility can be achieved relatively easily in the case of a transistor formed using an In—Sn—Zn—O-based material. Specifically, the transistor can have a field-effect mobility of 31 cm$^2$/Vs or more, 40 cm$^2$/Vs or more, 60 cm$^2$/Vs or more, 80 cm$^2$/Vs or more, or 100 cm$^2$/Vs or more. Also in the case of a transistor formed using a material other than an In—Sn—Zn—O-based material (e.g., an In—Ga—Zn—O-based material), the field-effect mobility can be increased by reducing the defect density.

In the case where an In—Zn—O-based material is used for the oxide semiconductor film 106, the atomic ratio of In to Zn is in the range of 0.5:1 to 50:1, preferably 1:1 to 20:1, more preferably 1.5:1 to 15:1. When the atomic ratio of In to Zn is in the above range, the field-effect mobility of the transistor can be increased. Here, when the atomic ratio of In:Zn:O of the compound is X:Y:Z, Z>1.5X+Y is preferably satisfied.

A material represented by $InMO_3(ZnO)_m$ (m>0) may be used for the oxide semiconductor film 106. Here, M represents one or more metal elements selected from Zn, Ga, Al, Mn, Sn, Hf, and Co. For example, M may be Ga, Ga and Al, Ga and Mn, Ga and Co, or the like.

For the oxide semiconductor film 106, a material which has a band gap of 2.5 eV or more, preferably 2.8 eV or more, more preferably 3.0 eV or more is selected to reduce the off-state current of the transistor.

Note that it is preferable that an alkali metal, an alkaline earth metal, and the like be reduced from the oxide semiconductor film 106 so that the impurity concentration is extremely low. When the oxide semiconductor film 106 contains any of the above impurities, recombination in a band gap occurs owing to a level formed by the impurity, so that the off-state current of the transistor is increased.

As for alkali metal concentrations in the oxide semiconductor film 106, which are measured by SIMS, the concentration of sodium is $5 \times 10^{16}$ atoms/cm$^3$ or lower, preferably $1 \times 10^{16}$ atoms/cm$^3$ or lower, more preferably $1 \times 10^{15}$ atoms/cm$^3$ or lower; the concentration of lithium is $5 \times 10^{15}$ atoms/cm$^3$ or lower, preferably $1 \times 10^{15}$ atoms/cm$^3$ or lower; and the concentration of potassium is $5 \times 10^{15}$ atoms/cm$^3$ or lower, preferably $1 \times 10^{15}$ atoms/cm$^3$ or lower.

The use of the oxide semiconductor film 106 described above makes it possible to reduce the off-state current of the transistor. Specifically, for example, the off-state current of the transistor with a channel length of 3 μm and a channel width of 1 μm can be lower than or equal to $1 \times 10^{-18}$ A, lower than or equal to $1 \times 10^{-21}$ A, or lower than or equal to $1 \times 10^{-24}$ A.

The oxide semiconductor film 106 is a non-single-crystal oxide semiconductor film. It is particularly preferable that the oxide semiconductor film 106 have crystallinity. For example, a polycrystalline film or a CAAC-OS film is used.

An example of a crystal structure of the CAAC-OS film will be described in detail with reference to FIGS. 14A to 14E, FIGS. 15A to 15C, FIGS. 16A to 16C, and FIGS. 17A and 17B. In FIGS. 14A to 14E, FIGS. 15A to 15C, FIGS. 16A to 16C, and FIGS. 17A and 17B, the vertical direction corresponds to the c-axis direction and a plane perpendicular to the c-axis direction corresponds to the a-b plane, unless otherwise specified. When the expressions "upper half" and "lower half" are simply used, they refer to the upper half above the a-b plane and the lower half below the a-b plane (the upper half and the lower half with respect to the a-b plane). Further, in FIGS. 14A to 14E, O surrounded by a circle represents tetracoordianate O and O surrounded by a double circle represents tricoordinate O.

Figure 14A:
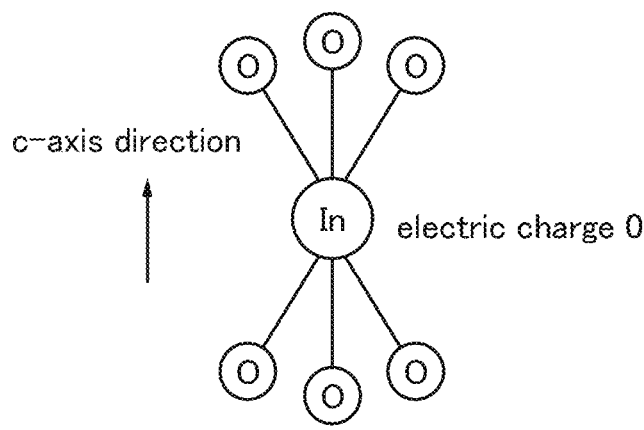
FIGS. 14A to 14E illustrate a crystalline structure of an oxide semiconductor according to one embodiment of the present invention.

FIG. 14A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 14A is actually an octahedral structure, but is illustrated as a planar structure for simplicity. Note that three tetracoordinate O atoms exist in each of the upper half and the lower half in FIG. 14A. In the small group illustrated in FIG. 14A, electric charge is 0.

Figure 14D:
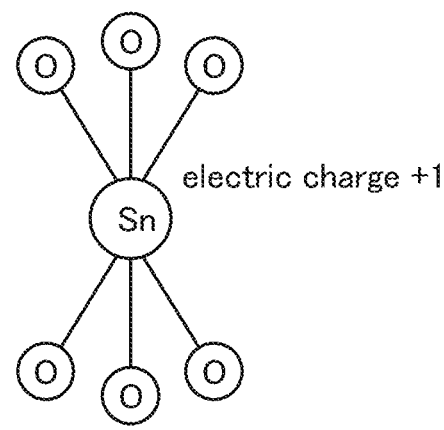
Figure 14B:
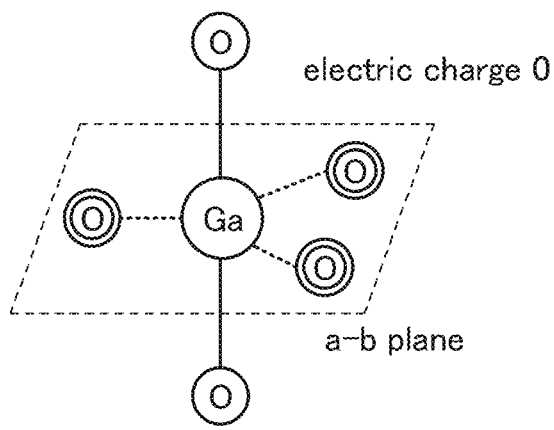

FIG. 14B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of the upper half and the lower half in FIG. 14B. An In atom can also have the structure illustrated in FIG. 14B because an In atom can have five ligands. In the small group illustrated in FIG. 14B, electric charge is 0.

Figure 14E:
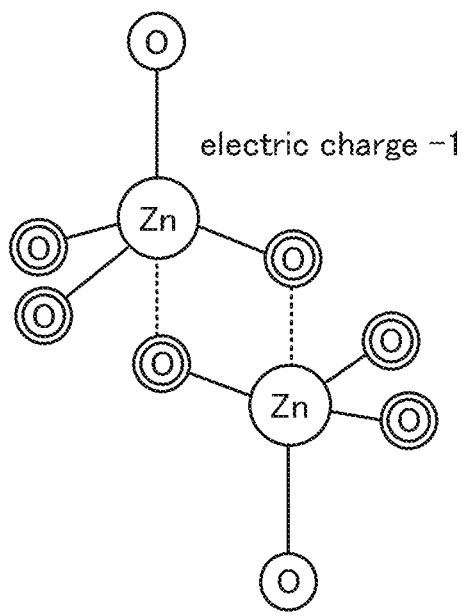
Figure 14C:
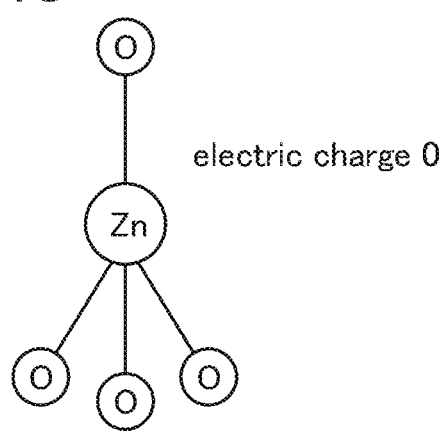

FIG. 14C illustrates a structure including one tetracoordinate Zn atom and four tetracoordinate O atoms proximate to the Zn atom. In FIG. 14C, one tetracoordinate O atom exists in the upper half and three tetracoordinate O atoms exist in the lower half. Alternatively, three tetracoordinate O atoms may exist in the upper half and one tetracoordinate O atom may exist in the lower half in FIG. 14C. In the small group illustrated in FIG. 14C, electric charge is 0.

FIG. 14D illustrates a structure including one hexacoordinate Sn atom and six tetracoordinate O atoms proximate to the Sn atom. In FIG. 14D, three tetracoordinate O atoms exist in each of the upper half and the lower half. In the small group illustrated in FIG. 14D, electric charge is +1.

FIG. 14E illustrates a small group including two Zn atoms. In FIG. 14E, one tetracoordinate O atom exists in each of the upper half and the lower half. In the small group illustrated in FIG. 14E, electric charge is −1.

Here, a plurality of small groups form a medium group, and a plurality of medium groups form a large group (also referred to as a unit cell). Now, a rule of bonding between the small groups will be described. The three O atoms in the upper half with respect to the hexacoordinate In atom in FIG. 14A each have three proximate In atoms in the downward direction, and the three O atoms in the lower half each have three proximate In atoms in the upward direction. The one O atom in the upper half with respect to the pentacoordinate Ga atom in FIG. 14B has one proximate Ga atom in the downward direction, and the one O atom in the lower half has one proximate Ga atom in the upward direction. The one O atom in the upper half with respect to the tetracoordinate Zn atom in FIG. 14C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 15A illustrates a model of a medium group included in a layered structure of an In—Sn—Zn—O-based material. FIG. 15B illustrates a large group including three medium groups. Note that FIG. 15C illustrates an atomic arrangement in the case where the layered structure in FIG. 15B is observed from the c-axis direction.

In FIG. 15A, a tricoordinate O atom is omitted for simplicity, and a tetracoordinate O atom is illustrated by a circle; the number in the circle shows the number of tetracoordinate O atoms. For example, three tetracoordinate O atoms existing in each of the upper half and the lower half with respect to a Sn atom are denoted by circled 3. Similarly, in FIG. 15A, one tetracoordinate O atom existing in each of the upper half and the lower half with respect to an In atom is denoted by circled 1. FIG. 15A also illustrates a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

In the medium group included in the layered structure of the In—Sn—Zn—O-based material in FIG. 15A, in the order starting from the top, a Sn atom proximate to three tetracoordinate O atoms in each of the upper half and the lower half is bonded to an In atom proximate to one tetracoordinate O atom in each of the upper half and the lower half, the In atom is bonded to a Zn atom proximate to three tetracoordinate O atoms in the upper half, the Zn atom is bonded to an In atom proximate to three tetracoordinate O atoms in each of the upper half and the lower half through one tetracoordinate O atom in the lower half with respect to the Zn atom, the In atom is bonded to a small group that includes two Zn atoms and is proximate to one tetracoordinate O atom in the upper half, and the small group is bonded to a Sn atom proximate to three tetracoordinate O atoms in each of the upper half and the lower half through one tetracoordinate O atom in the lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracooridnate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 14E can be given. For example, with one small group including two Zn atoms, electric charge of one small group including a Sn atom can be cancelled, so that the total electric charge of the layered structure can be 0.

Specifically, when the large group illustrated in FIG. 15B is repeated, a crystal of the In—Sn—Zn—O-based material ($In_2SnZn_3O_8$) can be obtained. Note that a layered structure of the obtained In—Sn—Zn—O-based material can be expressed by a composition formula, $In2SnZnO_6(ZnO)_m$ (m is a natural number).

The above-described rule also applies to the following materials: a four-component metal oxide such as an In—Sn—Ga—Zn—O-based material; three-component metal oxides such as an In—Ga—Zn—O-based material, an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, and an In—Lu—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and the like.

Figure 16A:
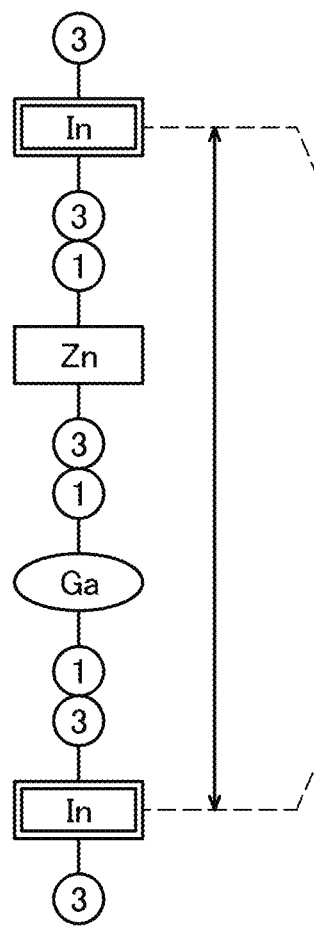
FIGS. 16A to 16C illustrate a crystalline structure of an oxide semiconductor according to one embodiment of the present invention.

As an example, FIG. 16A illustrates a model of a medium group included in a layered structure of an In—Ga—Zn—O-based material.

In the medium group included in the layered structure of the In—Ga—Zn—O-based material in FIG. 16A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 16B:
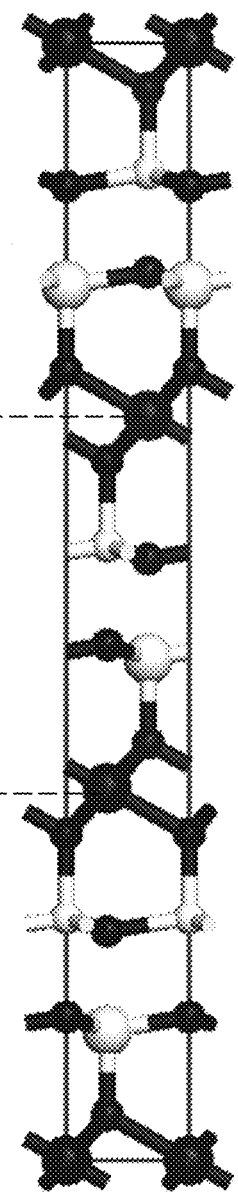
Figure 16C:
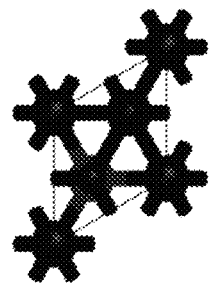

FIG. 16B illustrates a large group including three medium groups. Note that FIG. 16C illustrates an atomic arrangement in the case where the layered structure in FIG. 16B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 16A but also a medium group in which the arrangement of the In atom, the Ga atom, and the Zn atom is different from that in FIG. 16A.

Specifically, when the large group illustrated in FIG. 16B is repeated, a crystal of the In—Ga—Zn—O-based material can be obtained. Note that a layered structure of the obtained In—Ga—Zn—O-based material can be expressed by a composition formula, $InGaO_3(ZnO)_n$ (n is a natural number).

Figure 17A:
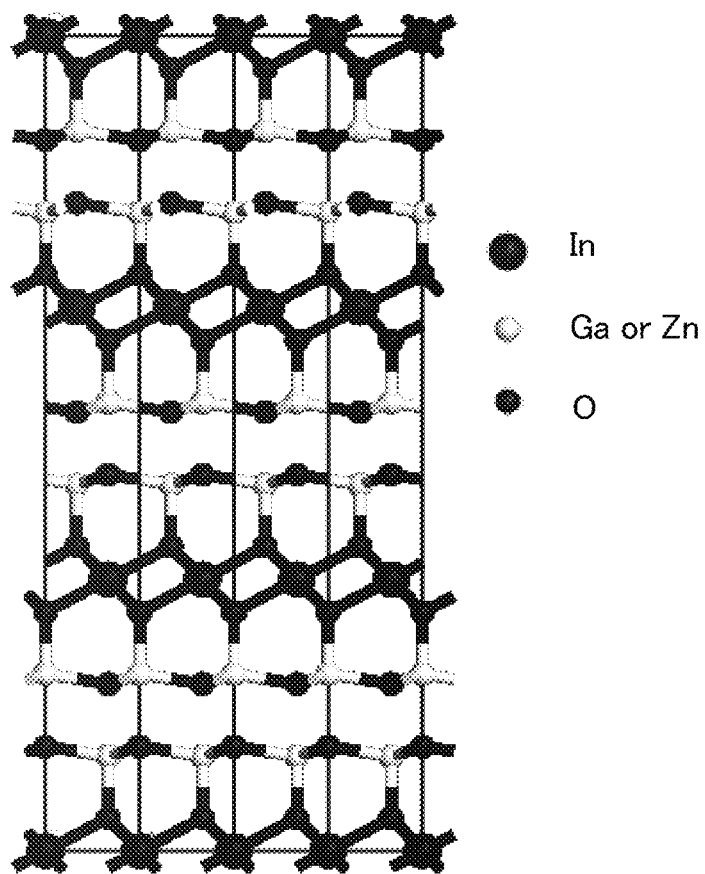
FIGS. 17A and 17B illustrate crystalline structures of oxide semiconductors according to embodiments of the present invention.

In the case where n is 1 ($InGaZnO_4$), a crystal structure illustrated in FIG. 17A can be obtained, for example. Note that in the crystal structure in FIG. 17A, since a Ga atom and an In atom each have five ligands as described in FIG. 14B, a structure in which Ga is replaced with In can be obtained.

Figure 17B:
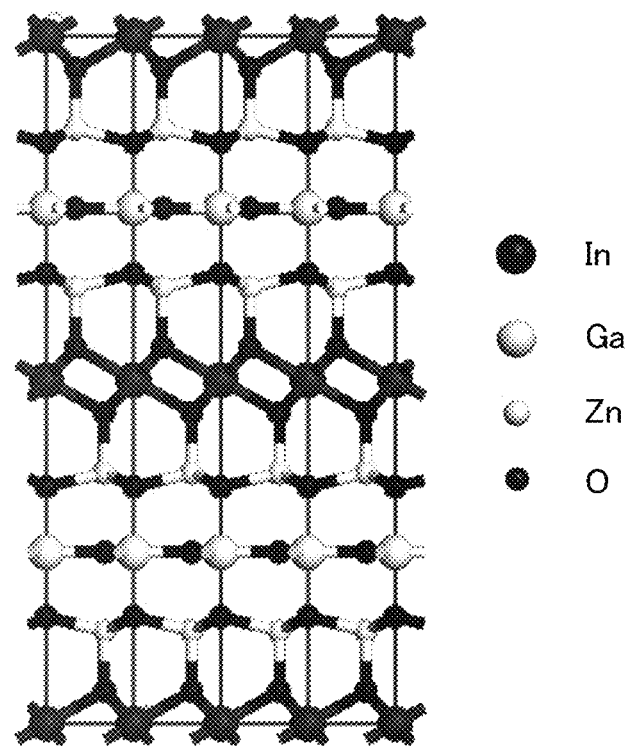

In the case where n is 2 ($InGaZn_2O_5$), a crystal structure illustrated in FIG. 17B can be obtained, for example. Note that in the crystal structure in FIG. 17B, since a Ga atom and an In atom each have five ligands as described in FIG. 14B, a structure in which Ga is replaced with In can be obtained.

Here, a change in crystal state in the case where one carbon atom (C) was introduced into the large group of $InGaZnO_4$ in FIG. 16B was evaluated using a first-principles calculation.

Note that CASTEP, software of first-principles calculation produced by Accelrys Software Inc., was used for the first-principles calculation. An ultrasoft type pseudopotential was used, and the cut-off energy was 300 eV.

Figure 31A:
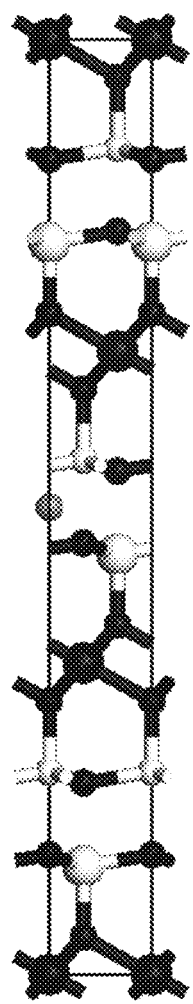
FIGS. 31A and 31B are diagrams illustrating crystal structures of an oxide semiconductor according to one embodiment of the present invention.
Figure 31B:
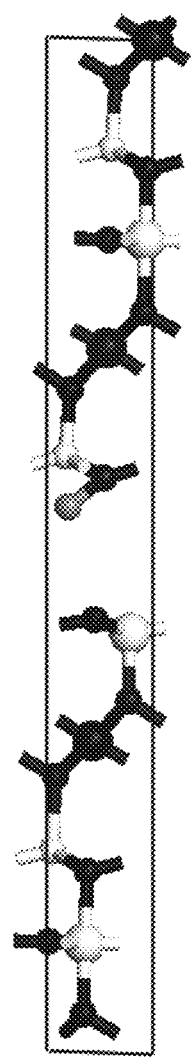

FIG. 31A shows a position in the large group of $InGaZnO_4$ into which C is introduced. FIG. 31B shows a crystal state of the large group of $InGaZnO_4$ after introduction of C and optimization of the structure.

FIG. 31B reveals that introduction of C allowed the bonding between C and O, resulting in an increase in interatomic distance between Ga and O which had been bonded to each other.

This result shows that C in the In—Ga—Zn—O-based material inhibited maintenance of the crystal structure.

Next, a change in crystal state in the case where one carbon dioxide molecule ($CO_2$) is introduced into the large group of $InGaZnO_4$ is evaluated using a first-principles calculation.

Note that CASTEP, software of first-principles calculation produced by Accelrys Software Inc., was used for the first-principles calculation. An ultrasoft type pseudopotential was used, and the cut-off energy was 300 eV.

Figure 39A:
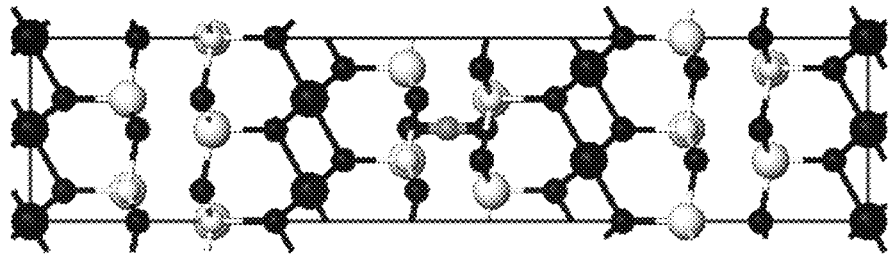
FIGS. 39A to 39D are diagrams illustrating crystal structures of an oxide semiconductor according to one embodiment of the present invention.
Figure 39B:
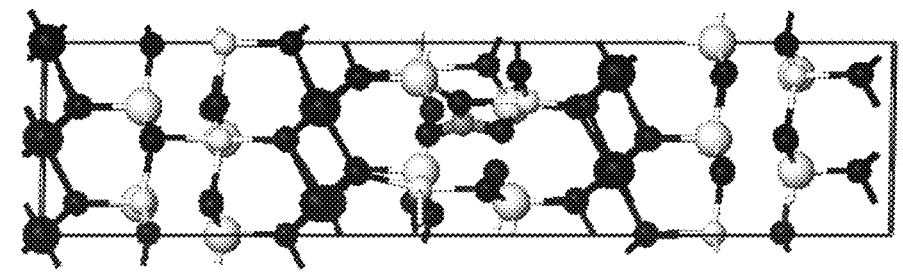
Figure 39C:
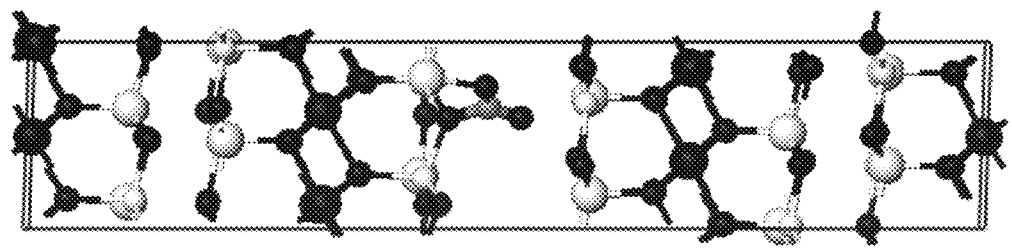
Figure 39D:
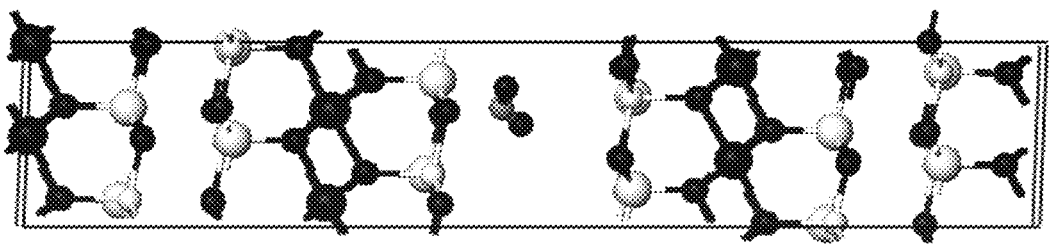

FIG. 39A shows a position in the large group of $InGaZnO_4$ into which $CO_2$ is introduced. FIGS. 39B to 39D show crystal states of the large group of $InGaZnO_4$ during optimization of the structure in the case where $CO_2$ was introduced to a position shown in FIG. 39A. Here, the structure in FIG. 39D, the structure in FIG. 39C, and the structure in FIG. 39B are closer to the optimal structure in this order.

In FIG. 39B, $CO_2$ is substituted by part of the large group of $InGaZnO_4$. Then, as in FIG. 39C, the interlayer distance of $InGaZnO_4$ is increased in the vicinity of $CO_2$. After that, as in FIG. 39D, $CO_2$ is separated and the interlayer distance of $InGaZnO_4$ is further increased.

This result shows that $CO_2$ in the In—Ga—Zn—O-based material inhibited maintenance of the crystal structure.

Hereinafter, the crystalline state of an oxide semiconductor film used in a transistor applicable to the semiconductor device according to this embodiment will be described.

To evaluate crystalline states, an X-ray diffraction (XRD) analysis of oxide semiconductor films was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. Methods for forming Sample A and Sample B will be described below.

First, a quartz substrate that had been subjected to dehydrogenation treatment was prepared.

Then, an In—Sn—Zn—O film with a thickness of 100 nm was formed over the quartz substrate.

The In—Sn—Zn—O film was formed with a sputtering apparatus with a power of 100 W (DC) in an oxygen gas atmosphere. An In—Sn—Zn—O target having an atomic ratio of In:Sn:Zn=1:1:1 was used as a target. Note that the substrate heating temperature in film formation was set at room temperature (without heating) or at 200° C. A sample formed in this manner was used as Sample A.

Next, a sample formed by a method similar to that of Sample A was subjected to heat treatment at 650° C. As the heat treatment, heat treatment in a nitrogen gas atmosphere was first performed for one hour and heat treatment in an oxygen gas atmosphere was further performed for one hour without lowering the temperature. A sample formed in this manner was used as Sample B.

Figure 28:
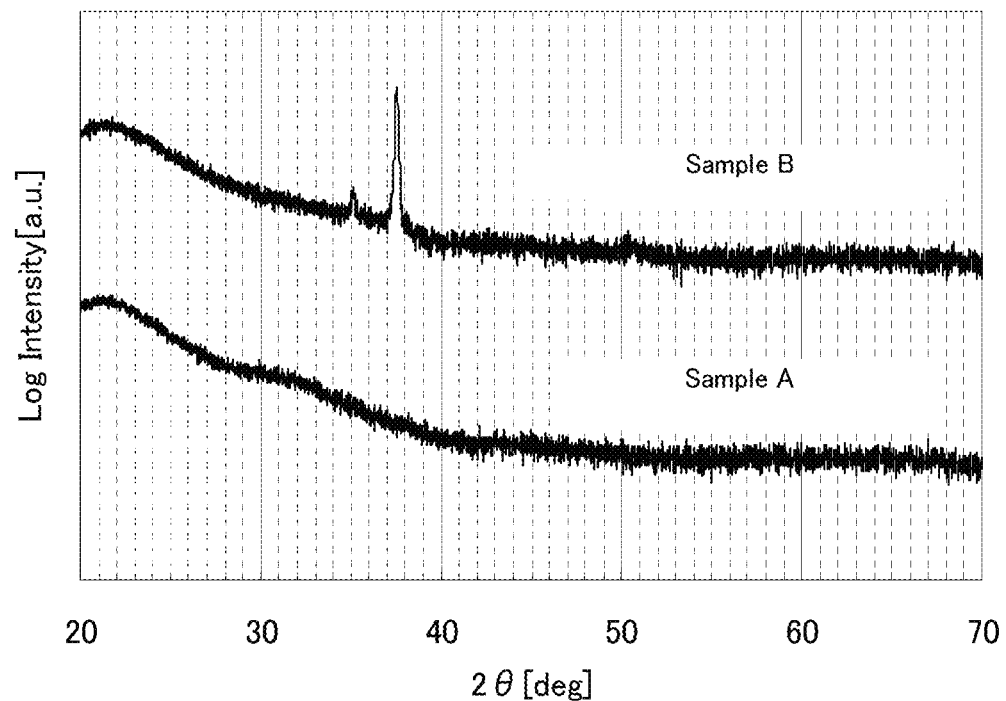
FIG. 28 is a graph showing XRD results of oxide semiconductor films.

FIG. 28 shows XRD results of Sample A and Sample B. No peak derived from crystal was observed in Sample A, whereas peaks derived from crystal were observed when 2θ was around 35 deg. and at 37 deg. to 38 deg. in Sample B.

These results reveal that the crystalline oxide semiconductor film was able to be obtained when heat treatment was performed on the sample at 650° C.

There is no particular limitation on the substrate 100 as long as it has at least heat resistance enough to withstand heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. It is preferable to use any of these substrates further provided with a semiconductor element, as the substrate 100.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

The base insulating film 102 can be formed to have a single-layer structure or a stacked-layer structure using one or more of silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

It is preferable that the base insulating film 102 be sufficiently flat. Specifically, the film serving as a base is provided so as to have an average surface roughness (Ra) of 1 nm or less, preferably 0.3 nm or less, more preferably 0.1 nm or less. When Ra is less than or equal to the above value, a crystal region is easily formed in the oxide semiconductor film 106. Note that Ra is obtained by expanding centerline average roughness, which is defined by JIS B 0601, into three dimensions for application to a plane. Moreover, Ra can be expressed as the average value of the absolute values of deviations from a reference surface to a specific surface and is defined by Formula 1.

$$Ra = \frac{1}{S_0} \int_{y_1}^{y_2} \int_{x_1}^{x_2} |f(x, y) - Z_0| dx dy \qquad \text{[EQUATION 1]}$$

Note that, in Formula 1, $S_0$ represents the area of a measurement surface (a quadrangular region which is defined by four points represented by the coordinates $(x_1, y_1)$, $(x_1, y_2)$, $(x_2, y_1)$, and $(x_2, y_2)$), and $Z_0$ represents the average height of the measurement surface. Ra can be evaluated using an atomic force microscope (AFM).

In this specification, silicon oxynitride refers to a substance in which the oxygen content is higher than the nitrogen content. For example, silicon oxynitride contains oxygen, nitrogen, silicon, and hydrogen at concentrations ranging from 50 at. % to 70 at. % inclusive, from 0.5 at. % to 15 at. % inclusive, from 25 at. % to 35 at. % inclusive, and from 0 at. % to 10 at. % inclusive, respectively. Silicon nitride oxide refers to a substance in which the nitrogen content is higher than the oxygen content. For example, silicon nitride oxide contains oxygen, nitrogen, silicon, and hydrogen at concentrations ranging from 5 at. % to 30 a.% inclusive, from 20a t.% to 55 at. % inclusive, from 25 at. % to 35 at. % inclusive, and from 10 at. % to 25 at. % inclusive, respectively. Note that the above ranges are obtained in the case where measurements are performed using Rutherford backscattering spectrometry (RBS) and hydrogen forward scattering (HFS). Moreover, the total of the percentages of the constituent elements does not exceed 100 at. %.

It is preferable that an insulating film from which oxygen is released by heat treatment be used as the base insulating film 102.

To release oxygen by heat treatment means that the release amount of oxygen which is converted into oxygen atoms is greater than or equal to $1.0 \times 10^{18}$ atoms/cm$^3$ or greater than or equal to $3.0 \times 10^{20}$ atoms/cm$^3$ in thermal desorption spectroscopy (TDS) analysis.

Here, a measurement method of the amount of released oxygen using TDS analysis will be described.

The total amount of released gases in TDS analysis is proportional to the integral value of intensity of ions of the released gases, and the total amount of released gases can be calculated by comparison between the integral value of a measured sample and that of a standard sample.

For example, the amount of oxygen molecules ($N_{O2}$) released from an insulating film can be found according to Equation 2 with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. A CH$_3$OH gas, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[EQUATION 2]}$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. The value $S_{O2}$ is the integral value of ion intensity in the case where the insulating film is subjected to the TDS analysis. The value $\alpha$ is a coefficient affecting the ion intensity in the TDS analysis. Japanese Published Patent Application No. H6-275697 can be referred to for details of Equation 2. Note that the amount of oxygen released from the above insulating film was measured with EMD-WA1000S/W, a thermal desorption spectroscopy apparatus produced by ESCO Ltd., with the use of a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

In the above structure, the film from which oxygen is released by heat treatment may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

The supply of oxygen from the base insulating film 102 to the oxide semiconductor film 106 can reduce the interface state density between the oxide semiconductor film 106 and the base insulating film 102. As a result, carrier trapping at the interface between the oxide semiconductor film 106 and the base insulating film 102 due to the operation of a transistor, or the like can be suppressed, and thus, a transistor with high reliability can be obtained.

Further, electric charge is generated due to oxygen vacancies in the oxide semiconductor film 106 in some cases. In general, part of oxygen vacancies in the oxide semiconductor film 106 serves as a donor and causes release of an electron which is a carrier. Consequently, the threshold voltage of a transistor shifts in the negative direction. When oxygen is sufficiently supplied from the base insulating film 102 to the oxide semiconductor film 106 so that the oxide semiconductor film 106 preferably contains excessive oxygen, oxygen vacancies in the oxide semiconductor film 106 which cause the negative shift of the threshold voltage can be reduced.

The excessive oxygen is mainly oxygen existing between lattices of the oxide semiconductor film 106. When the concentration of oxygen is set in the range of $1\times10^{16}$ atoms/cm$^3$ to $2\times10^{20}$ atoms/cm$^3$, crystal distortion or the like is not caused and thus a crystal region is not destroyed, which is preferable.

The pair of electrodes 116 may be formed to have a single-layer structure or a stacked-layer structure using one or more of Al, Ti, Cr, Co, Ni, Cu, Y, Zr, Mo, Ag, Ta, and W, a nitride of any of these elements, an oxide of any of these elements, and an alloy of any of these elements. Alternatively, an oxide or an oxynitride which contains at least In and Zn may be used. For example, an In—Ga—Zn—O—N-based material may be used.

The gate insulating film 112 may be formed using a method and a material similar to those of the base insulating film 102.

The gate electrode 104 may be formed using a method and a material similar to those of the pair of electrodes 116.

Figure 4A:
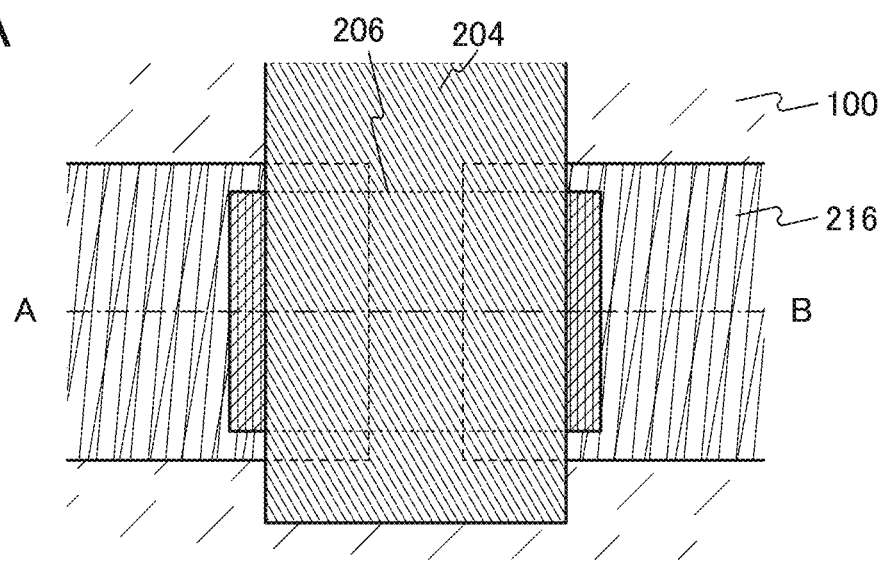
FIGS. 4A and 4B are a top view and a cross-sectional view which illustrate an example of a transistor.
Figure 4B:
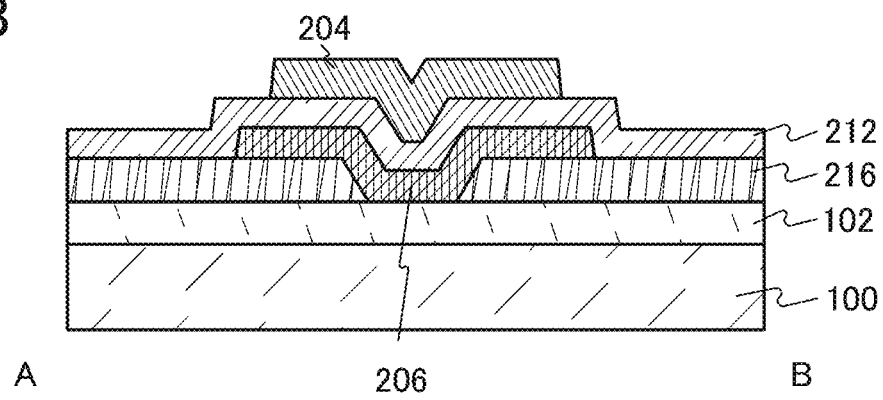

Next, the structure of the transistor in FIGS. 4A and 4B will be described. FIG. 4A is a top view of the transistor. FIG. 4B is a cross-sectional view along dashed-dotted line A-B in FIG. 4A.

The transistor in FIG. 4B includes, over the substrate 100, the base insulating film 102; a pair of electrodes 216 provided over the base insulating film 102; an oxide semiconductor film 206 provided over the pair of electrodes 216 so as to be at least partly in contact with the pair of electrodes 216 and the base insulating film 102; a gate insulating film 212 provided to cover the pair of electrodes 216 and the oxide semiconductor film 206; and a gate electrode 204 provided to overlap with the oxide semiconductor film 206 with the gate insulating film 212 interposed therebetween.

Note that the pair of electrodes 216, the oxide semiconductor film 206, the gate insulating film 212, and the gate electrode 204 can be formed using methods and materials similar to those of the pair of electrodes 116, the oxide semiconductor film 106, the gate insulating film 112, and the gate electrode 104, respectively.

Figure 5A:
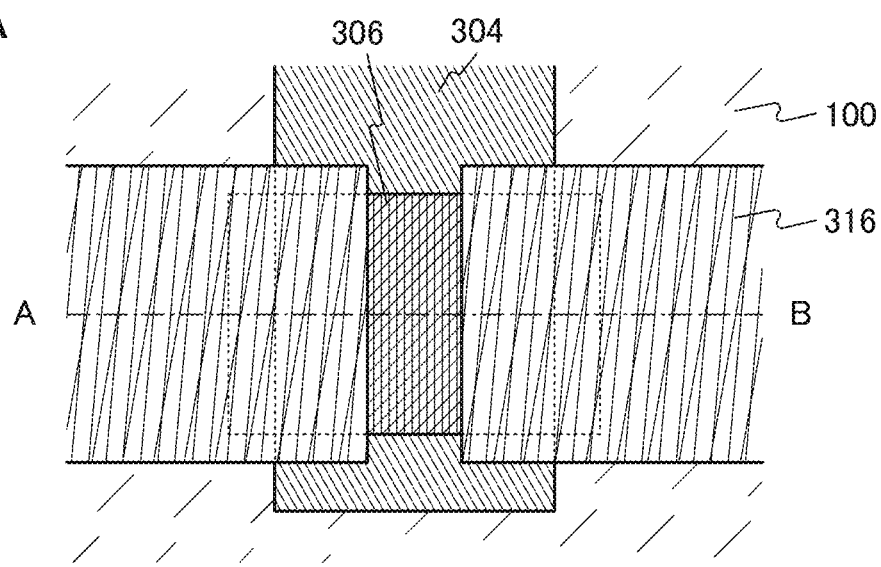
FIGS. 5A and 5B are a top view and a cross-sectional view which illustrate an example of a transistor.
Figure 5B:
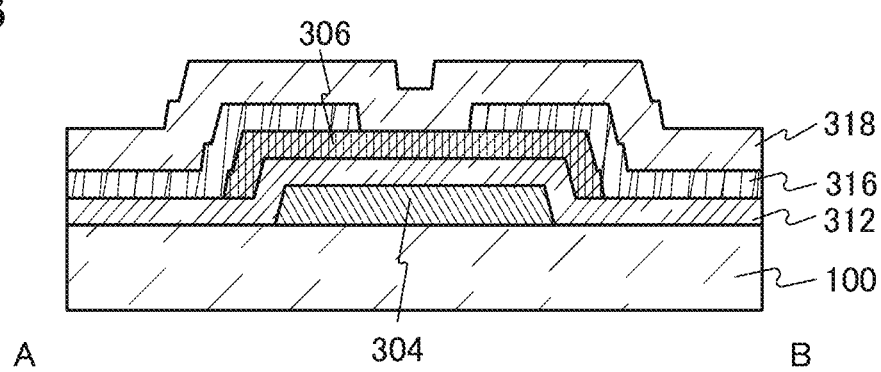

The structure of the transistor in FIGS. 5A and 5B will be described. FIG. 5A is a top view of the transistor. FIG. 5B is a cross-sectional view along dashed-dotted line A-B in FIG. 5A.

The transistor in FIG. 5B includes, over the substrate 100, a gate electrode 304; a gate insulating film 312 provided to cover the gate electrode 304; an oxide semiconductor film 306 provided to overlap with the gate electrode 304 with the gate insulating film 312 interposed therebetween; and a pair of electrodes 316 provided over and at least partly in contact with the oxide semiconductor film 306. Note that a protective insulating film 318 is preferably provided to cover the oxide semiconductor film 306 and the pair of electrodes 316.

Note that the pair of electrodes 316, the oxide semiconductor film 306, the gate insulating film 312, and the gate electrode 304 can be formed using methods and materials similar to those of the pair of electrodes 116, the oxide semiconductor film 106, the gate insulating film 112, and the gate electrode 104, respectively.

The protective insulating film 318 can be provided using a method and a material similar to those of the base insulating film 102.

Figure 6A:
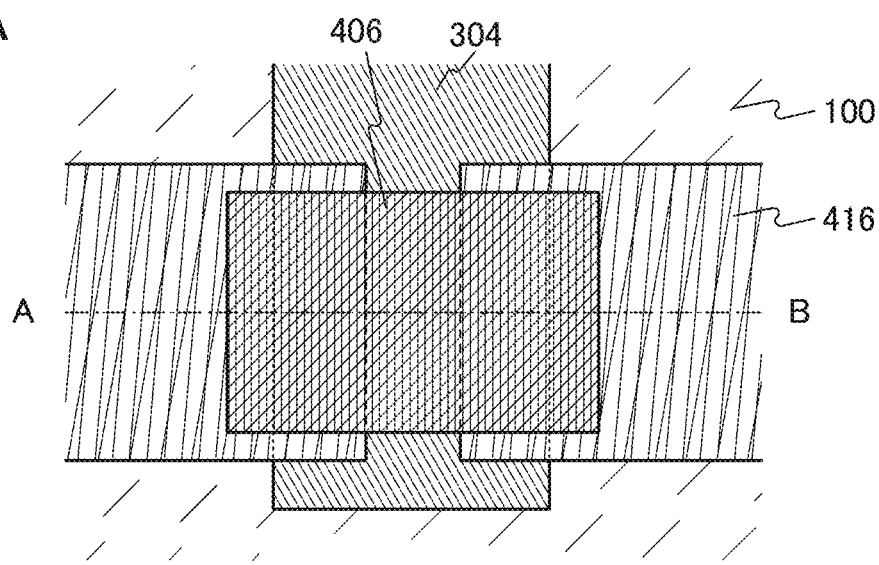
FIGS. 6A and 6B are a top view and a cross-sectional view which illustrate an example of a transistor.
Figure 6B:
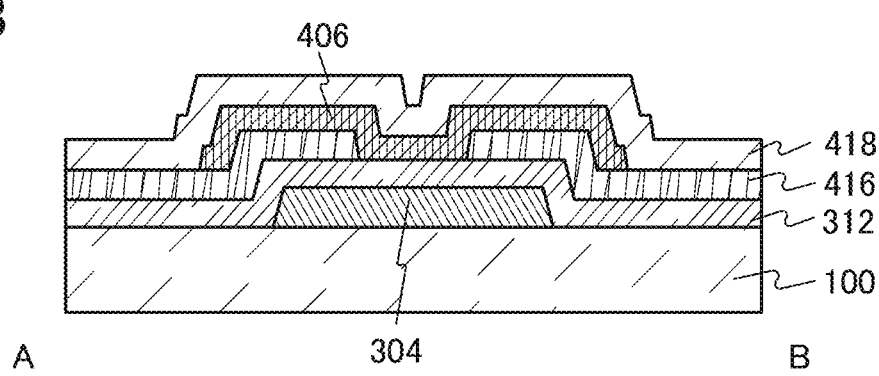

The structure of the transistor in FIGS. 6A and 6B will be described. FIG. 6A is a top view of the transistor. FIG. 6B is a cross-sectional view along dashed-dotted line A-B in FIG. 6A.

The transistor in FIG. 6B includes, over the substrate 100, the gate electrode 304; the gate insulating film 312 provided to cover the gate electrode 304; a pair of electrodes 416 provided over the gate insulating film 312; and an oxide semiconductor film 406 provided over the pair of electrodes 416 so as to be at least partly in contact with the pair of electrodes 416 and the gate insulating film 312. Note that a protective insulating film 418 is preferably provided to cover the pair of electrodes 416 and the oxide semiconductor film 406.

Note that the pair of electrodes 416, the oxide semiconductor film 406, and the protective insulating film 418 can be formed using methods and materials similar to those of the pair of electrodes 116, the oxide semiconductor film 106, and the protective insulating film 318, respectively.

The manufacturing processes of the transistors illustrated in FIGS. 7A to 7C and FIGS. 8A and 8B are a little more complicated than those of the transistors illustrated in FIGS. 3A and 3B, FIGS. 4A and 4B, FIGS. 5A and 5B, and FIGS. 6A and 6B; however, parasitic capacitance is smaller and short-channel effects are less likely to occur in the transistors in FIGS. 7A to 7C and FIGS. 8A and 8B. Thus, the structures of the transistors in FIGS. 7A to 7C and FIGS. 8A and 8B are suitable for a minute transistor whose electric characteristics need to be excellent.

Figure 7A:
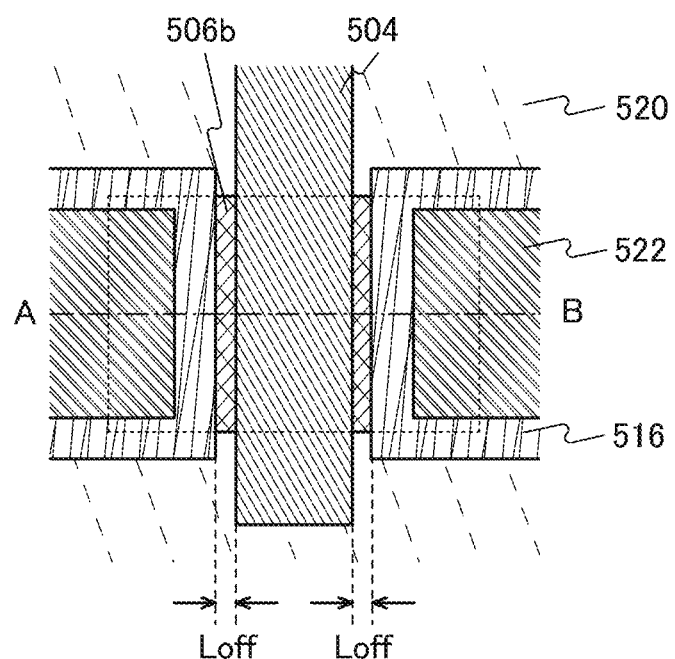
FIGS. 7A to 7C are a top view and cross-sectional views which illustrate examples of transistors.
Figure 7B:
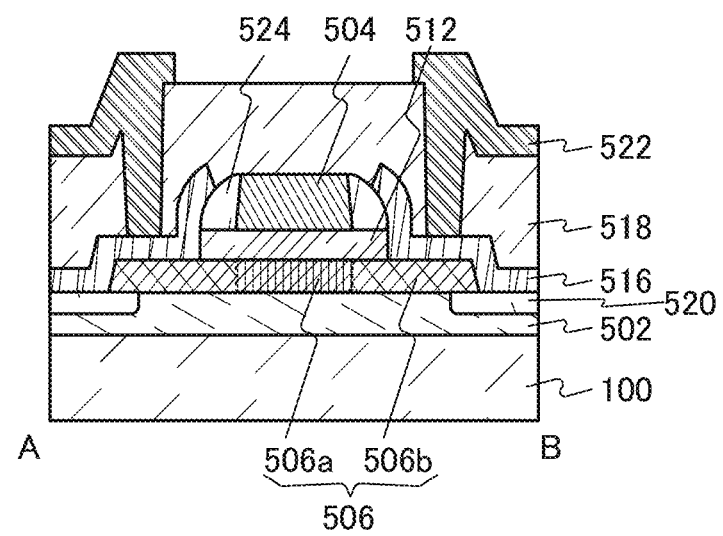

The structure of the transistor in FIGS. 7A and 7B will be described. FIG. 7A is a top view of the transistor. FIG. 7B is a cross-sectional view along dashed-dotted line A-B in FIG. 7A.

The transistor in FIG. 7B includes, over the substrate 100, a base insulating film 502; a protective film 520 provided on the periphery of the base insulating film 502; an oxide semiconductor film 506 provided over the base insulating film 502 and the protective film 520 and including a high-resistance region 506a and low-resistance regions 506b; a gate insulating film 512 provided over the oxide semiconductor film 506; a gate electrode 504 provided to overlap with the oxide semiconductor film 506 with the gate insulating film 512 interposed therebetween; sidewall insulating films 524 provided in contact with side surfaces of the gate electrode 504; and a pair of electrodes 516 provided over and at least partly in contact with the oxide semiconductor film 506.

Note that a protective insulating film 518 is preferably provided to cover the gate electrode 504, the sidewall insulating films 524, and the pair of electrodes 516. Further, wirings 522 are preferably provided in contact with the pair of electrodes 516 through openings formed in the protective insulating film 518.

Note that the pair of electrodes 516, the gate insulating film 512, the protective insulating film 518, and the gate electrode 504 can be formed using methods and materials similar to those of the pair of electrodes 116, the gate insulating film 112, the protective insulating film 318, and the gate electrode 104, respectively.

The oxide semiconductor film 506 can be provided in such a manner that an impurity having a function of reducing the resistance value of the oxide semiconductor film is added through the gate insulating film 512 with the use of the gate electrode 504 as a mask so that the high-resistance region 506a and the low-resistance regions 506b are formed. As the impurity, phosphorus, nitrogen, boron, or the like may be used. After the addition of the impurity, heat treatment at 250° C. to 650° C. inclusive is preferably performed. Note that an ion implantation method is preferably employed to add the impurity because, in such a case, less hydrogen enters the oxide semiconductor film as compared to the case where an ion doping method is employed to add the impurity. Note that the use of an ion doping method is not excluded.

The oxide semiconductor film 506 can alternatively be provided in such a manner that an impurity having a function of reducing the resistance value of the oxide semiconductor film is added through the gate insulating film 512 with the use of the gate electrode 504 and the sidewall insulating films 524 as masks so that the high-resistance region 506a and the low-resistance regions 506b are formed. In that case, a region overlapping with the sidewall insulating films 524 is not the low-resistance regions 506b but the high-resistance region 506a (see FIG. 7C).

Note that by addition of the impurity through the gate insulating film 512, damage caused at the time of addition of the impurity to the oxide semiconductor film 506 can be reduced. However, the impurity may be implanted without passing through the gate insulating film 512.

The base insulating film 502 can be formed in such a manner that an insulating film formed using a method and a material similar to those of the base insulating film 102 is processed to have groove portions.

The protective film 520 can be formed in such a manner that an insulating film is formed so as to fill the groove portions formed in the base insulating film 502 and then subjected to chemical mechanical polishing (CMP) treatment.

The protective film 520 can be formed to have a single-layer structure or a stacked-layer structure using one or more of silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

It is preferable that the protective film 520 do not allow permeation of oxygen even when heat treatment at 250° C. to 450° C. inclusive, preferably 150° C. to 800° C. inclusive is performed for one hour, for example.

When the protective film 520 with such a property is provided on the periphery of the base insulating film 502, oxygen released from the base insulating film 502 by heat treatment can be prevented from diffusing toward the outside of the transistor. Since oxygen is held in the base insulating film 502 in this manner, the field-effect mobility of the transistor can be prevented from decreasing, a variation in threshold voltage can be reduced, and the reliability can be improved.

Note that a structure without the protective film 520 may be employed.

The sidewall insulating films 524 are formed in such a manner that an insulating film is provided to cover the gate electrode 504 and then is etched. Highly anisotropic etching is employed for the etching. The sidewall insulating films 524 can be formed in a self-aligned manner by performing a highly anisotropic etching step on the insulating film. For example, a dry etching method is preferably employed. As an etching gas used for a dry etching method, for example, a gas containing fluorine such as trifluoromethane, octafluorocyclobutane, or tetrafluoromethane can be given. A rare gas or hydrogen may be added to the etching gas. As a dry etching method, a reactive ion etching (RIE) method in which high-frequency voltage is applied to a substrate is preferably used.

The wirings 522 can be provided using a method and a material similar to those of the gate electrode 104.

Figure 8A:
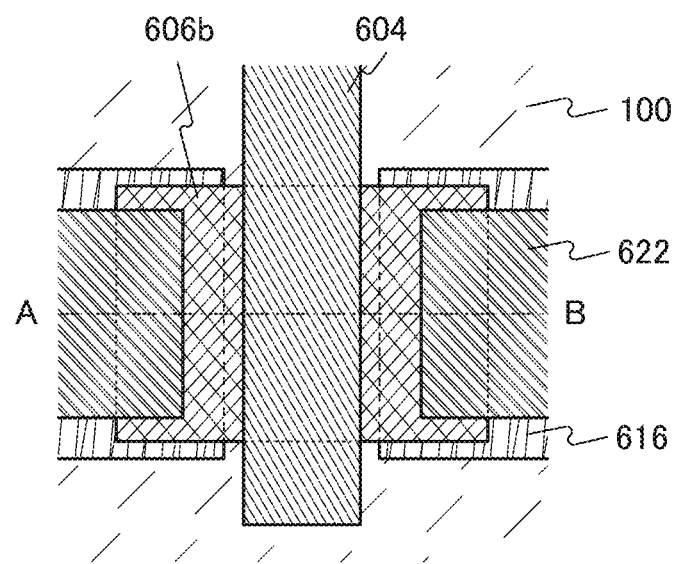
FIGS. 8A and 8B are a top view and a cross-sectional view which illustrate an example of a transistor.

The structure of the transistor in FIGS. 8A and 8B will be described. FIG. 8A is a top view of the transistor. A cross-sectional view along dashed-dotted line A-B in FIG. 8A is FIG. 8B.

Figure 8B:
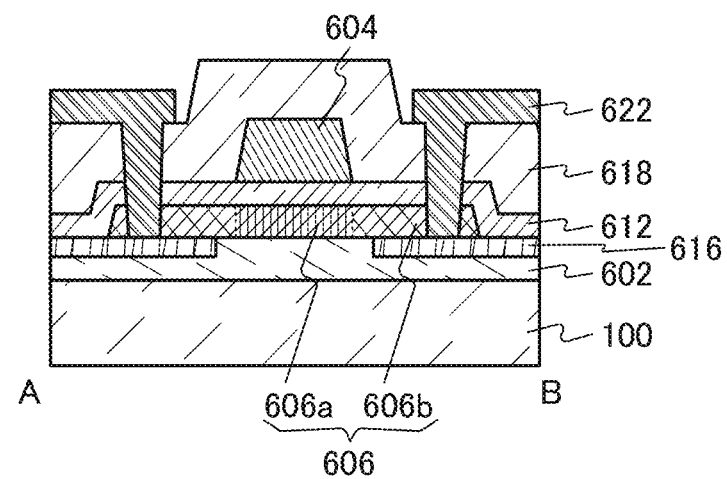

The transistor illustrated in FIG. 8B includes, over the substrate 100, a base insulating film 602; a pair of electrodes 616 provided in groove portions of the base insulating film 602; an oxide semiconductor film 606 including a high-resistance region 606a and low-resistance regions 606b and provided over the base insulating film 602 and the pair of electrodes 616; a gate insulating film 612 provided over the oxide semiconductor film 606; and a gate electrode 604 provided to overlap with the oxide semiconductor film 606 with the gate insulating film 612 interposed therebetween. Note that a protective insulating film 618 is preferably provided to cover the gate insulating film 612 and the gate electrode 604. Further, wirings 622 are preferably provided in contact with the pair of electrodes 616 through openings formed in the protective insulating film 618, the gate insulating film 612, and the oxide semiconductor film 606.

Note that the gate insulating film 612, the protective insulating film 618, the oxide semiconductor film 606, the wirings 622, and the gate electrode 604 can be formed using methods and materials similar to those of the gate insulating film 112, the protective insulating film 318, the oxide semiconductor film 506, the wirings 522, and the gate electrode 104, respectively.

The base insulating film 602 can be formed in such a manner that an insulating film formed using a method and a material similar to those of the base insulating film 102 is processed to have groove portions.

The pair of electrodes 616 can be formed in such a manner that a conductive film is formed so as to fill the groove portions formed in the base insulating film 602 and then subjected to CMP treatment.

The field-effect mobility of transistors will be described below with reference to FIG. 18, FIGS. 19A to 19C, FIGS. 20A to 20C, and FIGS. 21A to 21C.

The field-effect mobility of a transistor tends to be measured lower than its ideal field-effect mobility for a variety of reasons; this phenomenon occurs not only in the case of using an oxide semiconductor. One of the causes for a reduction in the field-effect mobility is a defect inside a semiconductor or a defect at the interface between the semiconductor and an insulating film. Here, the field-effect mobility on the assumption that no defect exists inside the semiconductor is calculated theoretically using a Levinson model.

Assuming that the ideal field-effect mobility of the transistor is to and a potential barrier (such as a grain boundary) exists in the semiconductor, the measured field-effect mobility µ is expressed by Equation 3.

$$\mu = \mu_0 \exp\left(-\frac{E}{kT}\right) \quad \text{[EQUATION 3]}$$

Here, E represents the height of the potential barrier, k represents the Boltzmann constant, and T represents the absolute temperature. Note that according to the Levinson model, the height of the potential barrier E is assumed to be attributed to a defect and is expressed by Equation 4.

$$E = \frac{e^2 N^2}{8\varepsilon n} = \frac{e^3 N^2 t}{8\varepsilon C_{ox} V_{gs}} \quad \text{[EQUATION 4]}$$

Here, e represents the elementary charge, N represents the average defect density per unit area in a channel, c represents the permittivity of the semiconductor, n represents the carrier density per unit area in the channel, $C_{ox}$ represents the gate insulating film capacitance per unit area, $V_{gs}$ represents the gate voltage, and t represents the thickness of the channel. In the case where the thickness of a semiconductor layer is less than or equal to 30 nm, the thickness of the channel may be regarded as being the same as the thickness of the semiconductor layer.

The drain current $I_{ds}$ in a linear region can be expressed by Equation 5.

$$\frac{I_{ds}}{V_{gs}} = \frac{W \mu V_{ds} C_{ox}}{L} \exp\left(-\frac{E}{kT}\right) \quad \text{[EQUATION 5]}$$

Here, L represents the channel length and W represents the channel width, and L and W are each 10 µm here. In addition, $V_{ds}$ represents the drain voltage.

When taking logarithms of both sides of Equation 5, Equation 6 can be obtained.

$$\ln\left(\frac{I_{ds}}{V_{gs}}\right) = \quad \text{[EQUATION 6]}$$

$$\ln\left(\frac{W \mu V_{ds} C_{ox}}{L}\right) - \frac{E}{kT} = \ln\left(\frac{W \mu V_{ds} C_{ox}}{L}\right) - \frac{e^3 N^2 t}{8 k T \varepsilon C_{ox} V_{gs}}$$

The right side of Equation 6 is a function of $V_{gs}$; thus, the defect density N can be obtained from the slope of a line in a graph which is obtained by plotting actual measured values with $\ln(I_{ds}/V_{gs})$ as the ordinate and $1/V_{gs}$ as the abscissa. That is, the defect density N in a semiconductor can be obtained from the $V_{gs}$-$I_{ds}$ characteristics of the transistor.

The defect density N in the semiconductor depends on a substrate temperature in deposition of the semiconductor. In the case where the semiconductor is an oxide semiconductor deposited using an In—Sn—Zn—O target having a ratio of In:Sn:Zn=1:1:1 [atomic ratio], the defect density N in the oxide semiconductor is approximately $1 \times 10^{12}/\text{cm}^2$.

By calculation with Equations 3 and 4 on the basis of the above defect density N in the oxide semiconductor, the ideal field-effect mobility to of the transistor is determined to be 120 cm²/Vs. Thus, in an ideal transistor in which no defect exists inside the oxide semiconductor and at the interface between the oxide semiconductor and the gate insulating film that is in contact with the oxide semiconductor, the field-effect mobility to is found to be 120 cm²/Vs. In contrast, in the case of using an oxide semiconductor with many defects, the field-effect mobility µ of a transistor is approximately 30 cm²/Vs.

Note that even when no defect exists inside a semiconductor, scattering at the interface between a channel and a gate insulating film affects the transport property of the transistor. The field-effect mobility $\mu_1$ at a position that is a distance x away from the interface of the gate insulating film can be expressed by Equation 7.

$$\frac{1}{\mu_1} = \frac{1}{\mu_0} + \frac{D}{B} \exp\left(-\frac{x}{l}\right) \quad \text{[EQUATION 7]}$$

Here, D represents the intensity of an electric field generated by the gate electrode, B represents a constant, and l represents the depth at which the adverse effect of scattering at the interface is caused. B and l can be obtained from actual measurement results of the electric characteristics of a transistor; according to the above measurement results of the electric characteristics of the transistor formed using an oxide semiconductor, B is $4.75 \times 10^7$ cm/s and l is 10 nm. When D is increased, i.e., when $V_{gs}$ is increased, the second term of Equation 7 is increased and accordingly the field-effect mobility $\mu_1$ is decreased.

Figure 18:
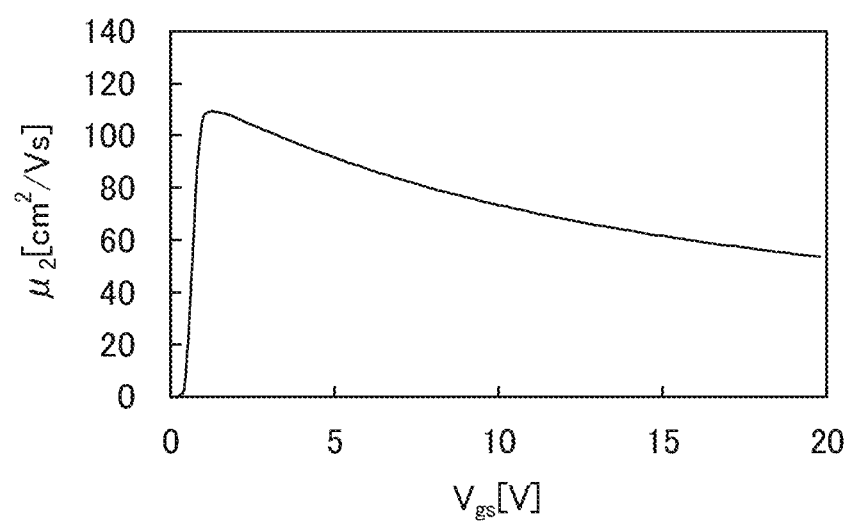
FIG. 18 is a graph showing the Vgs dependence of field-effect mobility, which is obtained by calculation.

Calculation results of the field-effect mobility $\mu_2$ of an ideal transistor in which no defect exists in an oxide semiconductor and at the interface between the oxide semiconductor and a gate insulating film in contact with the oxide semiconductor are shown in FIG. 18. For the calculation, Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 µm, and $V_{ds}$ was assumed to be 0.1 V.

FIG. 18 reveals that the field-effect mobility $\mu_2$ has a peak of more than 100 cm²/Vs at $V_{gs}$ of around 1 V and is decreased as $V_{gs}$ becomes higher because the influence of interface scattering is increased.

Calculation results in the case where such an ideal transistor is miniaturized are shown in FIGS. 19A to 19C, FIGS. 20A to 20C, and FIGS. 21A to 21C. Assume that transistors having the structures illustrated in FIGS. 7A to 7C were used for the calculations.

Here, the resistivity of the low-resistance region 506b was assumed to be $2 \times 10^{-3}$ Ωcm, and the width of the gate electrode 504, that of the sidewall insulating film 524, and the channel width were assumed to be 33 nm, 5 nm, and 40 nm, respectively. Note that although the channel region is referred to as high-resistance region 506a for convenience, the channel region was assumed to be an intrinsic semiconductor here.

Figure 19A:
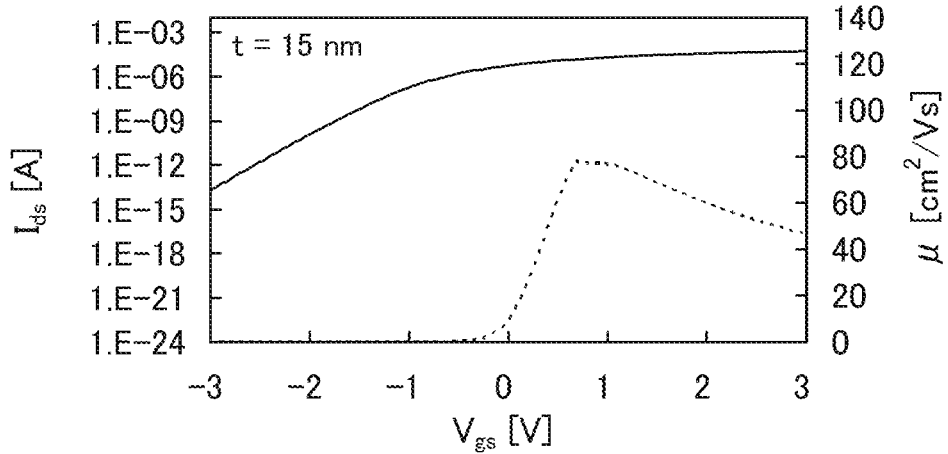
FIGS. 19A to 19C are graphs each showing the Vgs dependence of $I_{ds}$ and field-effect mobility, which is obtained by calculation.
Figure 19B:
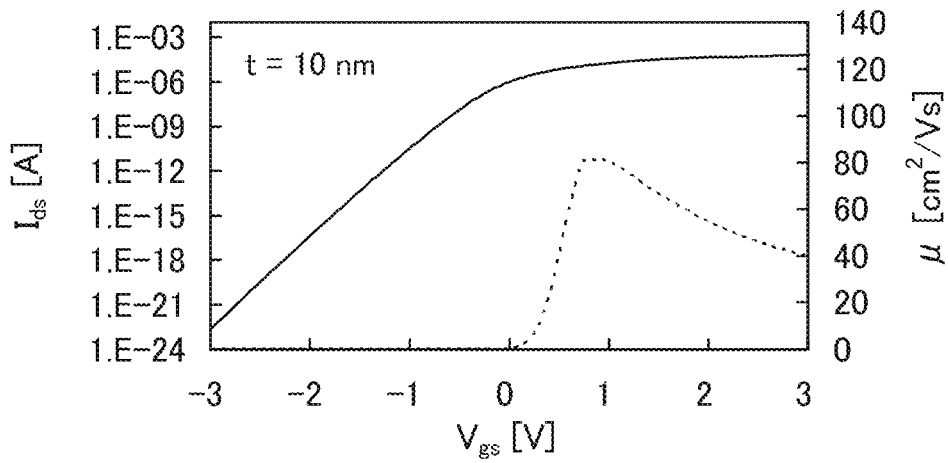
Figure 19C:
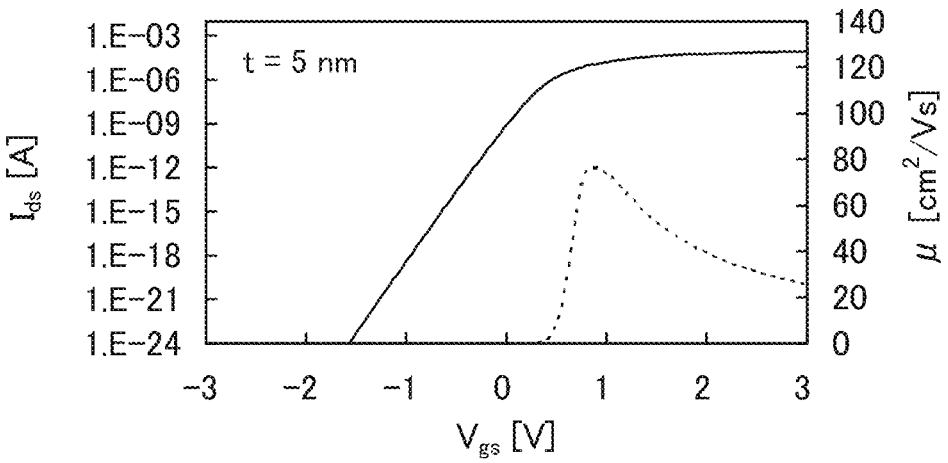

For the calculation, Sentaurus Device manufactured by Synopsys, Inc. was used. FIGS. 19A to 19C show $V_{gs}$ dependence of $I_{ds}$ (solid line) and the field-effect mobility (dotted line) of the transistor having the structure illustrated in FIG. 7B. $I_{ds}$ was obtained by calculation under the assumption that $V_{ds}$ was 1 V, and the field-effect mobility μ was obtained by calculation under the assumption that $V_{ds}$ is 0.1 V. FIG. 19A shows the results where the thickness of the gate insulating film was 15 nm, FIG. 19B shows the results where the thickness of the gate insulating film was 10 nm, and FIG. 19C shows the results where the thickness of the gate insulating film was 5 nm.

FIGS. 19A to 19C show that as the gate insulating film is thinner, the drain current $I_{ds}$ in an off state (here, in the range of $V_{gs}$ from −3 V to 0 V) decreases. On the other hand, there is no noticeable change in the peak value of the field-effect mobility and the drain current $I_{ds}$ in an on state (here, in the range of $V_{gs}$ from 0 V to 3 V). FIGS. 19A to 19C show that $I_{ds}$ exceeds 10 μA, which is requisite for a memory and the like that are semiconductor devices, at $V_{gs}$ of around 1 V.

Figure 7C:
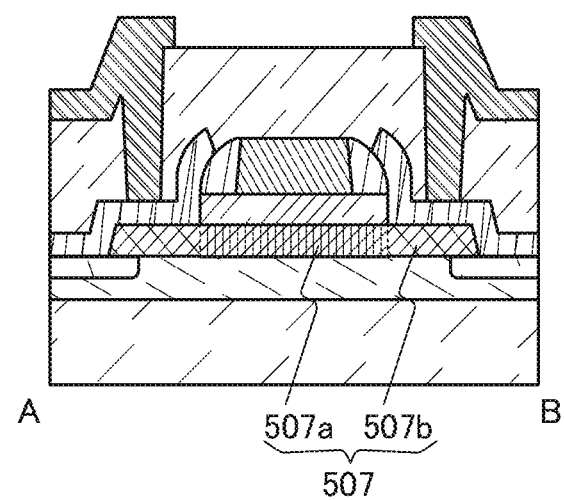

Similarly, the calculation was also conducted on the transistor illustrated in FIG. 7C. The transistor in FIG. 7C is different from the transistor illustrated in FIG. 7B in that an oxide semiconductor film 507 including a high-resistance region 507a and low-resistance regions 507b is provided. Specifically, in the transistor illustrated in FIG. 7C, a region of the oxide semiconductor film 507 which overlaps with the sidewall insulating film 524 is included in the high-resistance region 507a. In other words, the transistor has an offset region whose width is the same as the width of the sidewall insulating film 524. Note that the width of the offset region is also referred to as an offset length ($L_{off}$) (see FIG. 7A). Note that $L_{off}$ on the right side is the same as $L_{off}$ on the left side for the sake of convenience.

Figure 20A:
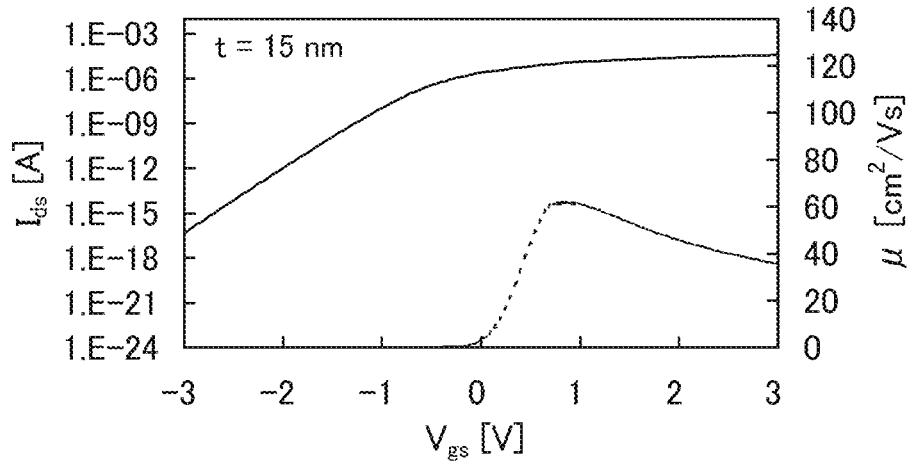
FIGS. 20A to 20C are graphs each showing the Vgs dependence of $I_{ds}$ and field-effect mobility, which is obtained by calculation.
Figure 20B:
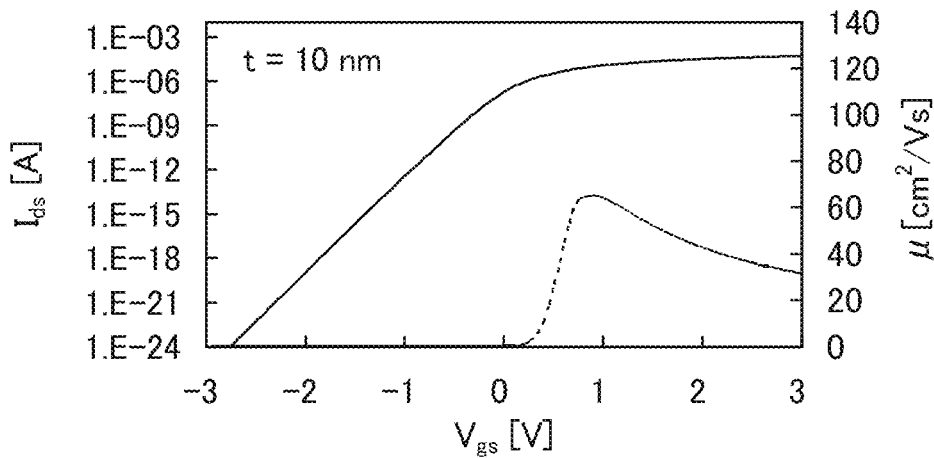
Figure 20C:
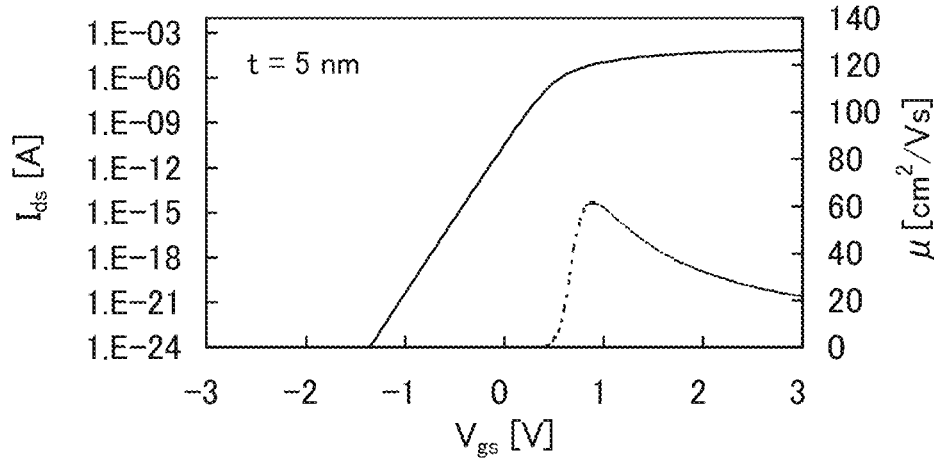

FIGS. 20A to 20C show $V_{gs}$ dependence of the drain current $I_{ds}$ (solid line) and the field-effect mobility μ (dotted line) of the transistor illustrated in FIG. 7C in which $L_{off}$ is 5 nm. Note that $I_{ds}$ was calculated under the assumption that $V_{ds}$ was 1 V, and the field-effect mobility μ was calculated under the assumption that $V_{ds}$ was 0.1 V. FIG. 20A shows the results where the thickness of the gate insulating film was 15 nm, FIG. 20B shows the results where the thickness of the gate insulating film was 10 nm, and FIG. 20C shows the results where the thickness of the gate insulating film was 5 nm.

Figure 21A:
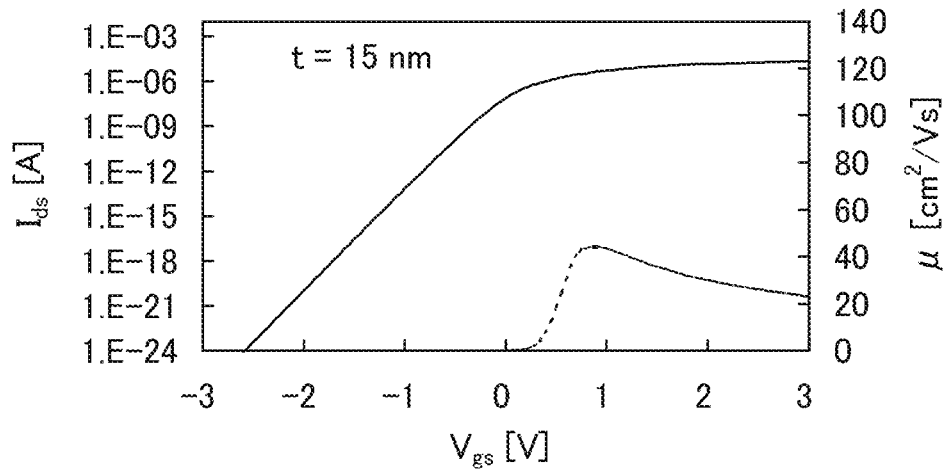
FIGS. 21A to 21C are graphs each showing the Vgs dependence of $I_{ds}$ and field-effect mobility, which is obtained by calculation.
Figure 21B:
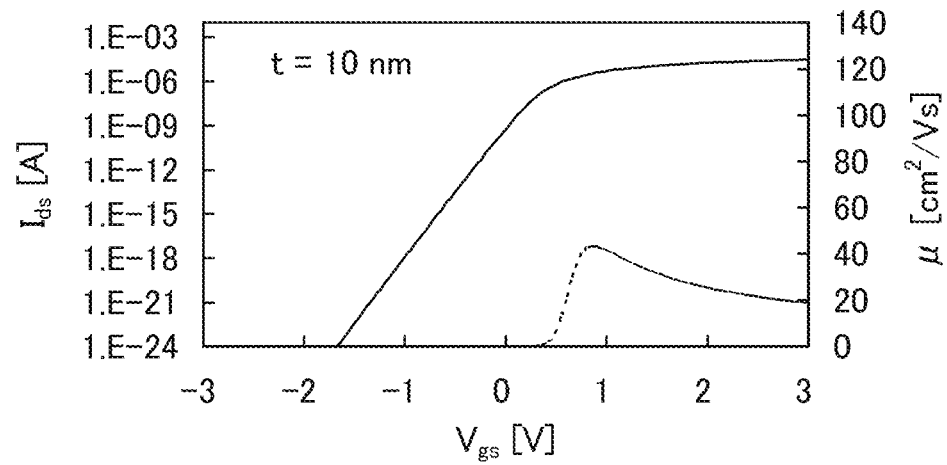
Figure 21C:
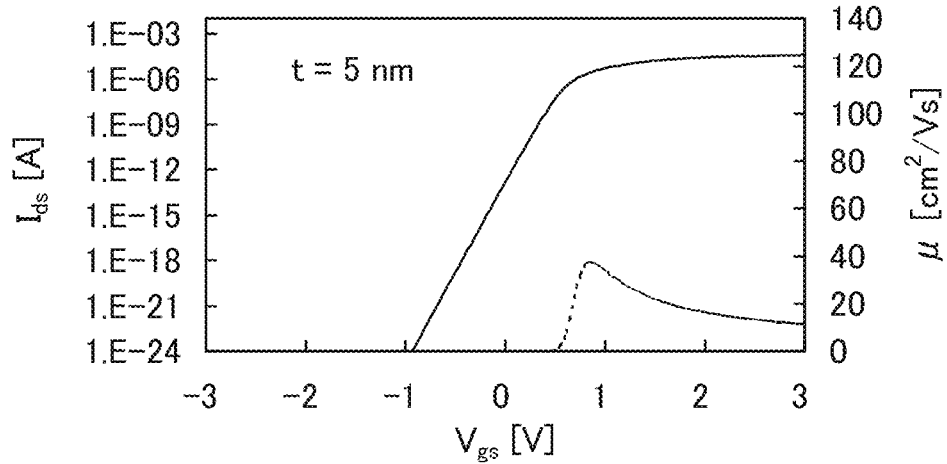

FIGS. 21A to 21C show $V_{gs}$ dependence of the drain current $I_{ds}$ (solid line) and the field-effect mobility μ (dotted line) of the transistor illustrated in FIG. 7C in which $L_{off}$ is 15 nm. Note that $I_{ds}$ was calculated under the assumption that $V_{ds}$ was 1 V, and the field-effect mobility μ was calculated under the assumption that $V_{ds}$ was 0.1 V. FIG. 21A shows the results where the thickness of the gate insulating film was 15 nm, FIG. 21B shows the results where the thickness of the gate insulating film was 10 nm, and FIG. 21C shows the results where the thickness of the gate insulating film was 5 nm.

The calculation results in FIGS. 20A to 20C and FIGS. 21A to 21C show that as the gate insulating film is thinner, the drain current $I_{ds}$ in an off state (here, in the range of $V_{gs}$ from −3 V to 0 V) decreases, similarly to those in FIGS. 19A to 19C. On the other hand, there is no noticeable change in the peak value of the field-effect mobility μ and the drain current $I_{ds}$ in an on state (here, in the range of $V_{gs}$ from 0 V to 3 V).

The peak of the field-effect mobility μ is approximately 80 cm$^2$/Vs in FIGS. 19A to 19C, approximately 60 cm$^2$/Vs in FIGS. 20A to 20C, and approximately 40 cm$^2$/Vs in FIGS. 21A to 21C. These results show that the peak of the mobility μ is decreased as the offset length $L_{off}$ is increased and the same applies to $I_{ds}$ in an off state. $I_{ds}$ in an on state is also decreased as the offset length $L_{off}$ is increased; however, the decrease in $I_{ds}$ in an on state is much more gradual than the decrease in $I_{ds}$ in an off state. Further, all the calculation results reveal that $I_{ds}$ exceeds 10 μA, which is requisite for a memory and the like, at $V_{gs}$ of around 1 V.

Next, the electric characteristics of a transistor formed using an oxide semiconductor will be described.

Figure 22A:
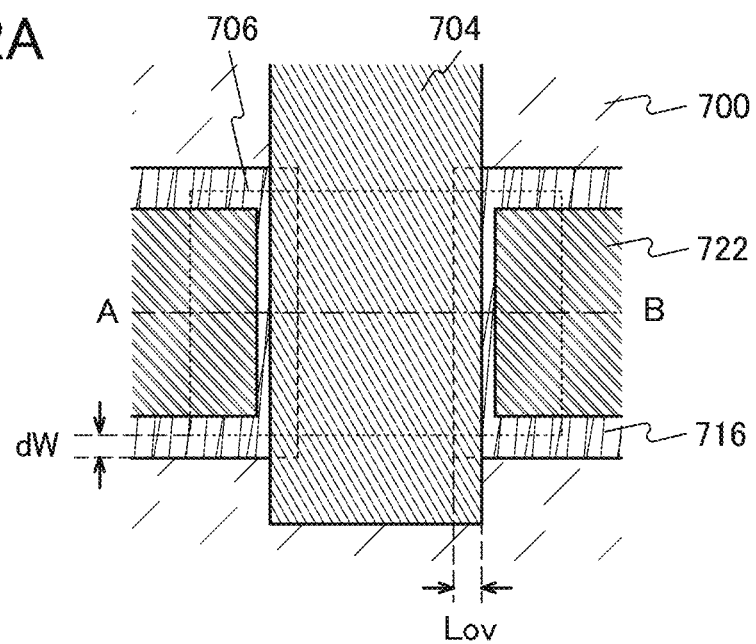
FIGS. 22A and 22B are a top view and a cross-sectional view of a transistor.
Figure 22B:
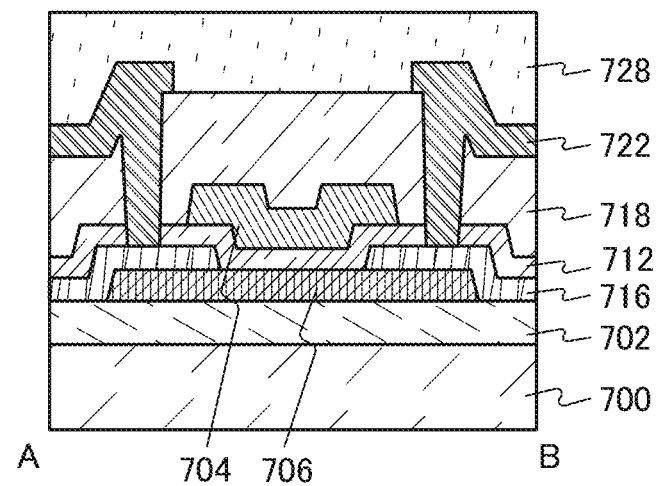

FIGS. 22A and 22B are a top view illustrating a structure of each of formed transistors (Sample 1 and Sample 2) and a cross-sectional view along dashed-dotted line A-B in FIG. 22A.

The transistor in FIG. 22B includes, over a substrate 700, a base insulating film 702; an oxide semiconductor film 706 provided over the base insulating film 702; a pair of electrodes 716 provided in contact with the oxide semiconductor film 706; a gate insulating film 712 provided over the oxide semiconductor film 706 and the pair of electrodes 716; and a gate electrode 704 provided to overlap with the oxide semiconductor film 706 with the gate insulating film 712 interposed therebetween. Further, an interlayer insulating film 718 covering the gate insulating film 712 and the gate electrode 704, wirings 722 connected to the pair of electrodes 716 through openings formed in the interlayer insulating film 718, and a protective insulating film 728 covering the interlayer insulating film 718 and the wirings 722 are provided.

As the substrate 700, a glass substrate was used. As the base insulating film 702, a silicon oxide film was used. As the oxide semiconductor film 706, an In—Sn—Zn—O film was used. As the pair of electrodes 716, a tungsten film was used. As the gate insulating film 712, a silicon oxide film was used. The gate electrode 704 had a stacked-layer structure of a tantalum nitride film and a tungsten film. The interlayer insulating film 718 had a stacked-layer structure of a silicon oxynitride film and a polyimide film. The wiring 722 had a stacked-layer structure in which a titanium film, an aluminum film, and a titanium film were formed in this order. As the protective insulating film 728, a polyimide film was used.

Note that in the transistor having the structure illustrated in FIG. 22A, the width of a portion where the gate electrode 704 overlaps with one of the pair of electrodes 716 is referred to as Lov. Similarly, the width of a portion of the pair of electrodes 716, which does not overlap with the oxide semiconductor film 706, is referred to as dW.

Methods for forming the transistors (Sample 1 and Sample 2) each having the structure shown in FIG. 22B will be described below.

First, plasma treatment was performed on a surface of the substrate 700 in an argon gas atmosphere. The plasma treatment was carried out with a sputtering apparatus by applying 200 W of bias power (RF) to the substrate 700 side for 3 minutes.

Subsequently, without breaking the vacuum, the silicon oxide film as the base insulating film 702 was formed to a thickness of 300 nm.

The silicon oxide film was formed with a sputtering apparatus with 1500 W of power (RF) in an oxygen gas atmosphere. A quartz target was used as a target. The substrate heating temperature in the deposition was set at 100° C.

A surface of the base insulating film 702 was subjected to CMP treatment to be planarized such that $R_a$ was about 0.2 nm.

Then, the In—Sn—Zn—O film as the oxide semiconductor film was formed to have a thickness of 15 nm.

The In—Sn—Zn—O film was formed with a sputtering apparatus with 100 W of power (DC) in a mixed atmosphere having a volume ratio of argon:oxygen=2:3. An In—Sn—Zn—O target having an atomic ratio of In:Sn:Zn=1:1:1 was used as a target. The substrate heating temperature in the deposition was set at 200° C.

Then, heat treatment at 650° C. was performed only on Sample 2. As the heat treatment, heat treatment in a nitrogen gas atmosphere was first performed for 1 hour and then heat treatment in an oxygen gas atmosphere was performed for 1 hour while keeping the temperature.

The oxide semiconductor film was processed through a photolithography process, so that the oxide semiconductor film 706 was formed.

Next, the tungsten film was formed to a thickness of 50 nm.

The tungsten film was formed with a sputtering apparatus with 1000 W of power (DC) in an argon gas atmosphere. The substrate heating temperature in the deposition was set at 200° C.

The tungsten film was processed through a photolithography process, so that the pair of electrodes 716 was formed.

Then, the silicon oxide film as the gate insulating film 712 was formed to a thickness of 100 nm. The relative permittivity of the silicon oxide film was set to 3.8.

The silicon oxide film as the gate insulating film 712 was formed in a manner similar to that of the base insulating film 702.

Next, the tantalum nitride film and the tungsten film were formed in this order to have thicknesses of 15 nm and 135 nm, respectively.

The tantalum nitride film was formed with a sputtering apparatus with 1000 W of power (DC) in a mixed atmosphere having a volume ratio of argon:oxygen=5:1. Substrate heating was not performed in the deposition.

The tungsten film was formed with a sputtering apparatus with 4000 W of power (DC) in an argon gas atmosphere. The substrate heating temperature in the deposition was set at 200° C.

The tantalum nitride film and the tungsten film were processed through a photolithography process, so that the gate electrode 704 was formed.

Next, the silicon oxynitride film as part of the interlayer insulating film 718 was formed to a thickness of 300 nm.

The silicon oxynitride film as part of the interlayer insulating film 718 was formed with a PCVD apparatus with 35 W of power (RF) in a mixed atmosphere having a volume ratio of monosilane:nitrous oxide=1:200. The substrate heating temperature in the deposition was set at 325° C.

The silicon oxynitride film as part of the interlayer insulating film 718 was processed through a photolithography process.

Then, photosensitive polyimide as part of the interlayer insulating film 718 was deposited to a thickness of 1500 nm.

The photosensitive polyimide as part of the interlayer insulating film 718 was exposed to light with the use of a photomask used in the photolithography process performed on the silicon oxynitride film as part of the interlayer insulating film 718, and developed, and then subjected to heat treatment so that the photosensitive polyimide film was hardened. In this manner, the interlayer insulating film 718 was formed of the silicon oxynitride film and the photosensitive polyimide film. The heat treatment was performed at 300° C. in a nitrogen atmosphere.

Next, the titanium film, the aluminum film, and the titanium film were formed in this order to thicknesses of 50 nm, 100 nm, and 5 nm, respectively.

The two titanium films were formed with a sputtering apparatus with 1000 W of power (DC) in an argon gas atmosphere. Substrate heating was not performed in the deposition.

The aluminum film was formed with a sputtering apparatus with 1000 W of power (DC) in an argon atmosphere. Substrate heating was not performed in the deposition.

The titanium film, the aluminum film, and the titanium film were processed through a photolithography process, so that the wirings 722 were formed.

Next, the photosensitive polyimide film as the protective insulating film 728 was formed to a thickness of 1500 nm.

The photosensitive polyimide film was exposed to light with the use of a photomask used in the photolithography process performed on the wirings 722, and developed, so that openings exposing the wirings 722 were formed in the protective insulating film 728.

Then, heat treatment was performed so that the photosensitive polyimide film was hardened. The heat treatment was performed in a manner similar to that of the heat treatment performed on the photosensitive polyimide film as the interlayer insulating film 718.

Through the above process, the transistor having the structure illustrated in FIG. 22B was formed.

Next, the electrical characteristics of the transistor having the structure in FIG. 22B were evaluated.

Figure 23A:
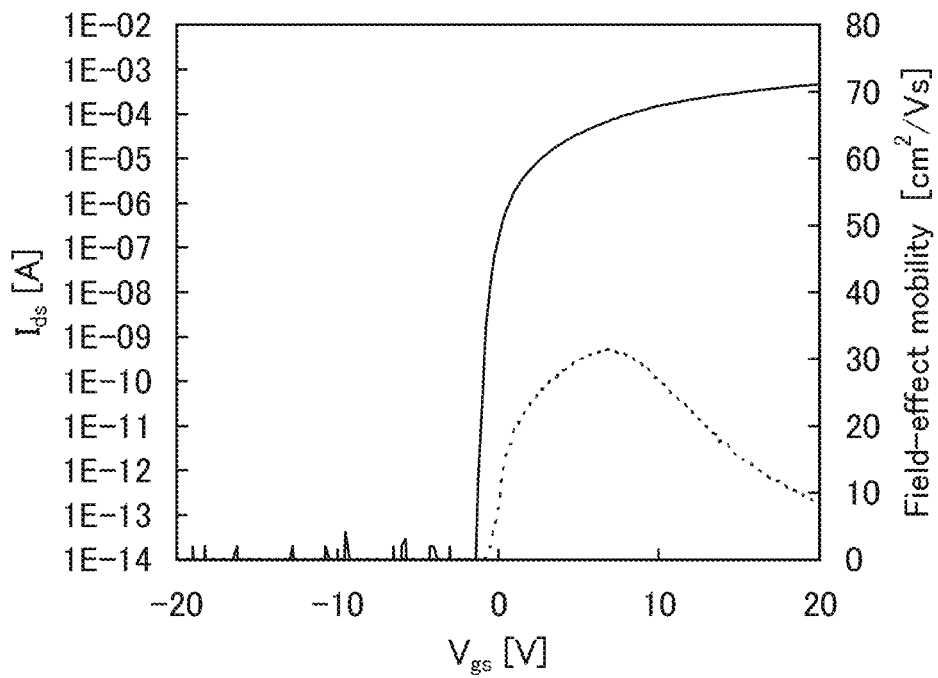
FIGS. 23A and 23B are graphs each showing $V_{gs}$-$I_{ds}$ characteristics and field-effect mobility of transistors of Samples 1 and 2.
Figure 23B:
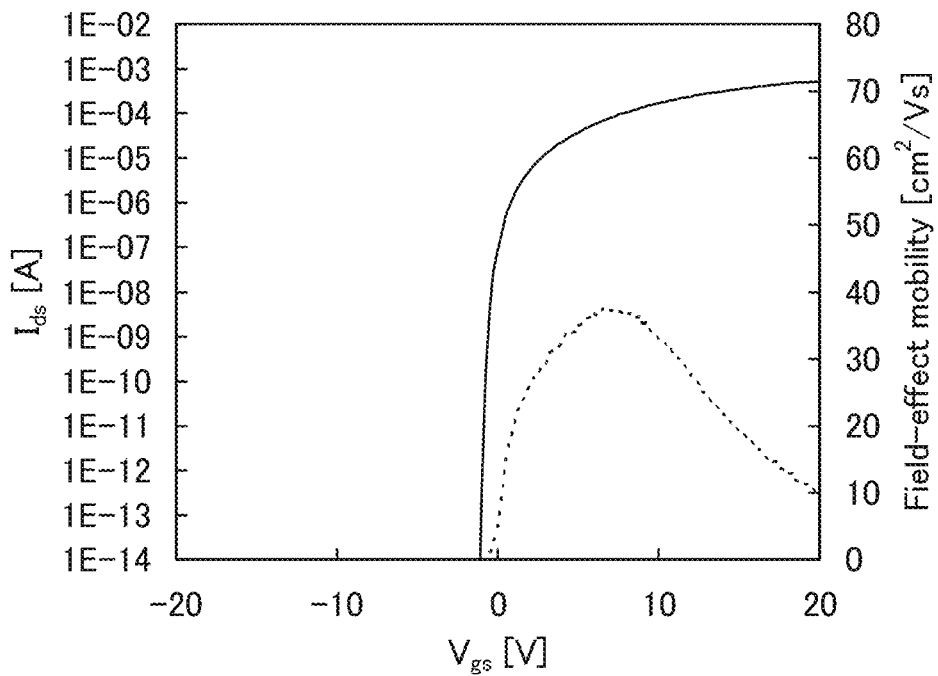

Here, $V_{gs}$-$I_{ds}$ characteristics of the transistor having the structure in FIG. 22B were measured; the results of Sample 1 are shown in FIG. 23A, and the results of Sample 2 are shown in FIG. 23B. The transistors used for the measurement each have a channel length L of 3 μm, a channel width W of 10 μm, Lov of 3 μm per side (6 μm in total), and dW of 3 μm per side (6 μm in total). $V_{ds}$ was set to 10 V.

Comparing Samples 1 and 2, it is found that the field-effect mobility of the transistor was increased by performing heat treatment after formation of the oxide semiconductor film. The inventors deemed that the increase in field-effect mobility of the transistor might result from reduction in impurity concentration in the oxide semiconductor film by the heat treatment. Accordingly, it is understood that the impurity concentration in the oxide semiconductor film was reduced by the heat treatment performed after the oxide semiconductor film was formed, resulting in the field-effect mobility of the transistor close to ideal field-effect mobility.

Thus, the results suggest that the impurity concentration in an oxide semiconductor film might be reduced by performing heat treatment after formation of the oxide semiconductor film, resulting in an increase in field-effect mobility of a transistor.

Next, BT tests were performed on Sample 1 and Sample 2. The BT tests will be described below.

First, $V_{gs}$-$I_{ds}$ characteristics of the transistors were measured at a substrate temperature of 25° C. and $V_{ds}$ of 10 V. Note that $V_{ds}$ refers to a drain voltage (a potential difference between a drain and a source). Then, the substrate temperature was set to 150° C. and $V_{ds}$ was set to 0.1 V. After that, 20 V of $V_{gs}$ was applied so that the intensity of an electric field applied to the gate insulating films was 2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT test.

In a similar manner, first, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, −20 V of $V_{gs}$ was applied so that the intensity of an electric field applied to the gate insulating films was −2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT test.

Figure 24A:
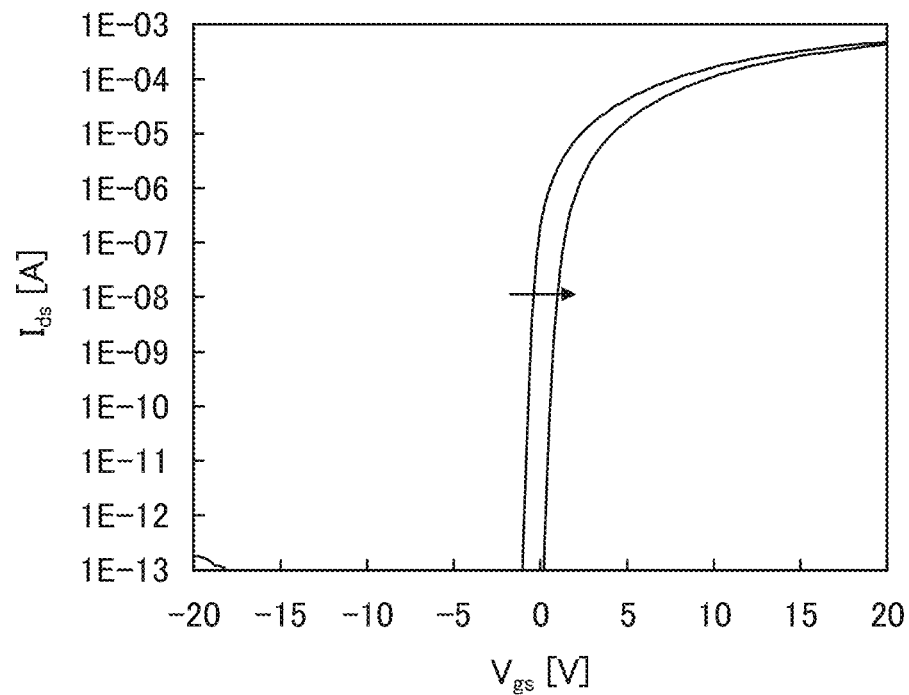
FIGS. 24A and 24B are graphs each showing $V_{gs}$-$I_{ds}$ characteristics between before and after a BT test of the transistor of Sample 1.
Figure 24B:
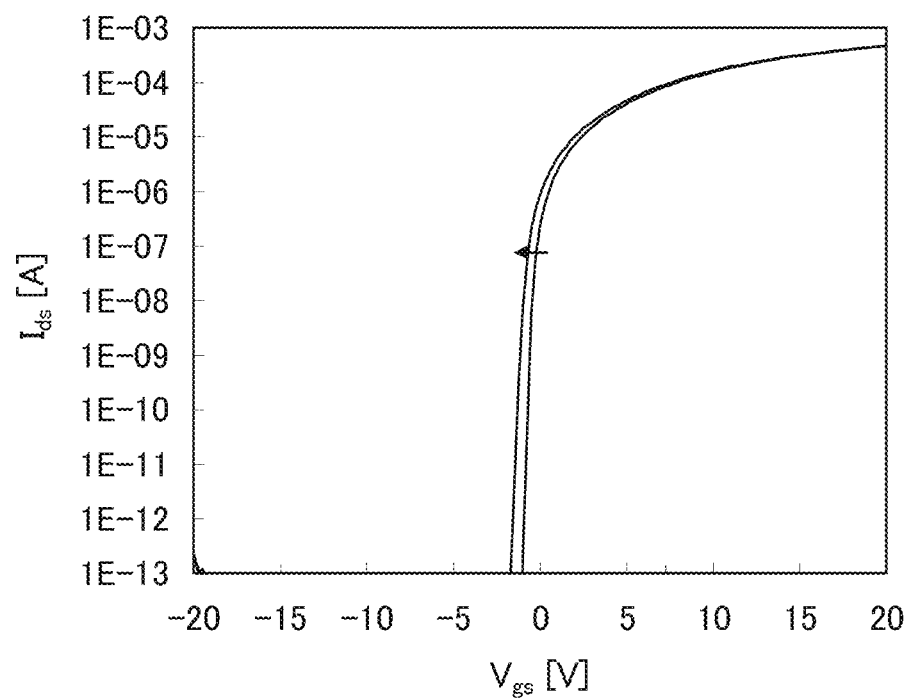
Figure 25A:
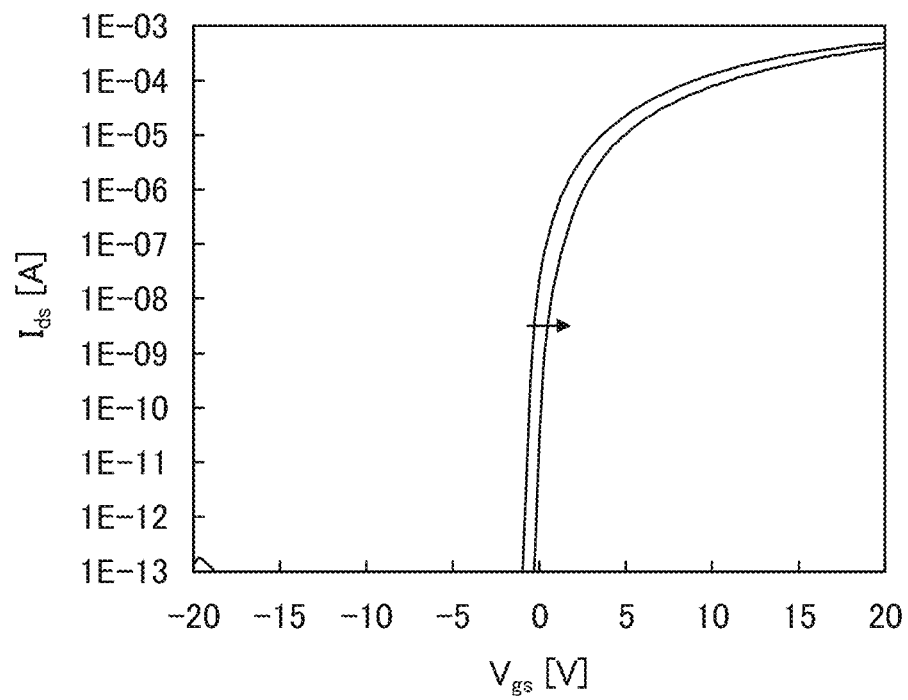
FIGS. 25A and 25B are graphs each showing $V_{gs}$-$I_{ds}$ characteristics between before and after a BT test of the transistor of Sample 2.
Figure 25B:
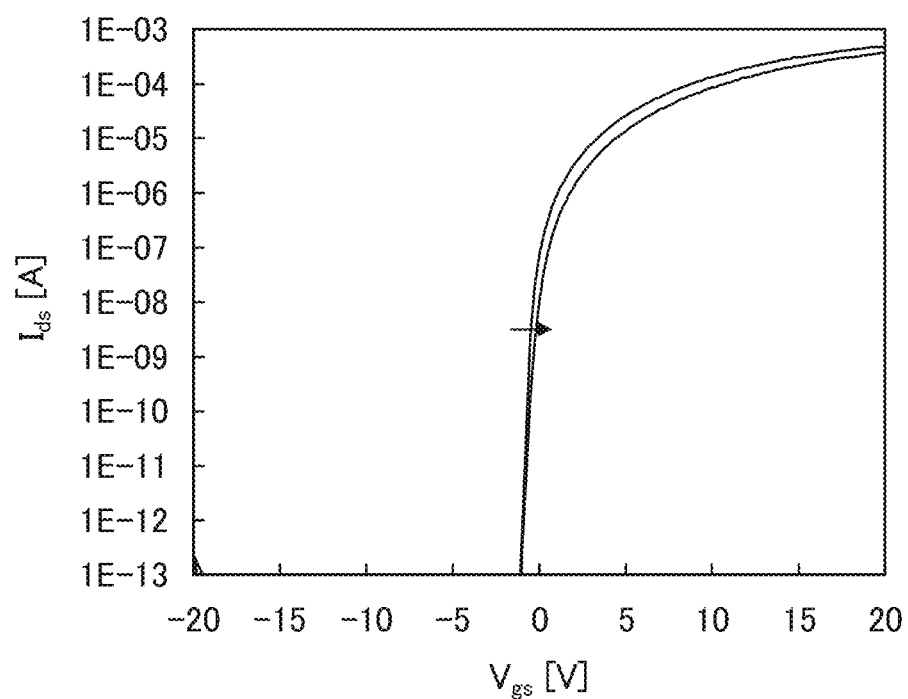

FIGS. 24A and 24B show a result of the positive BT test of Sample 1 and a result of the negative BT test of Sample 1, respectively. FIGS. 25A and 25B show a result of the positive BT test of Sample 2 and a result of the negative BT test of Sample 2, respectively. Note that arrows are used in the graphs to clearly show changes in $V_{gs}$-$I_{ds}$ characteristics between before and after the BT tests.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively.

It is found that, in each of Sample 1 and Sample 2, the amount of shift in the threshold voltage between before and after the BT tests is small and the samples are highly reliable transistors.

Next, the relation between the substrate temperature and electric characteristics of the transistor of Sample 2 was evaluated.

The transistor used for the measurement has a channel length L of 3 μm, a channel width W of 10 μm, Lov of 3 μm on one side (total Lov of 6 μm), and dW of 0 μm. Note that $V_{ds}$ was set to 10 V. The substrate temperature was −40° C., −25° C., 25° C., 75° C., 125° C., and 150° C.

Figure 26A:
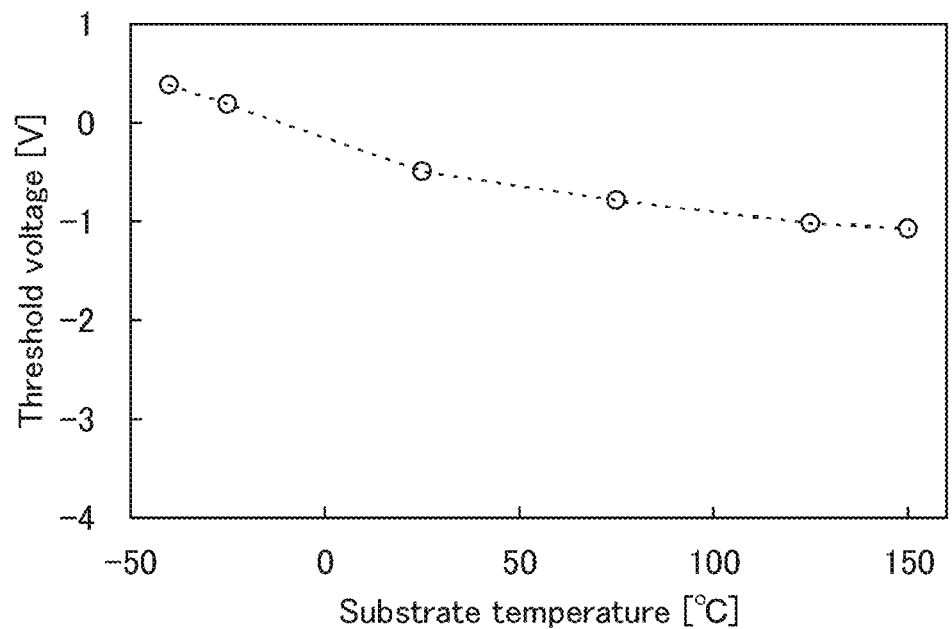
FIG. 26A is a graph showing the relation between substrate temperature and threshold voltage of the transistor of Sample 2.
Figure 26B:
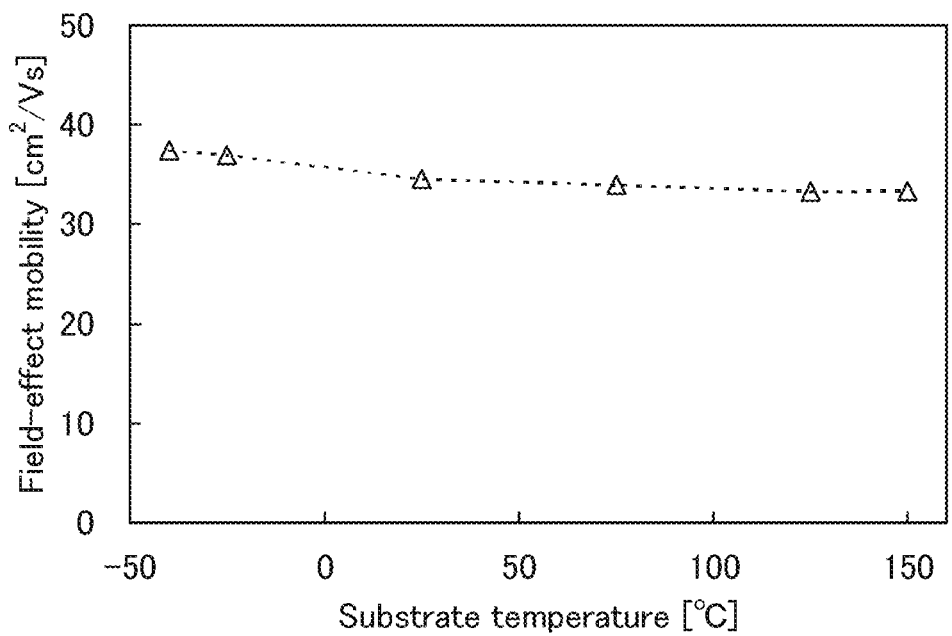
FIG. 26B is a graph showing the relation between substrate temperature and field-effect mobility of the transistor of Sample 2.

FIG. 26A shows the relation between the substrate temperature and the threshold voltage, and FIG. 26B shows the relation between the substrate temperature and the field-effect mobility.

From FIG. 26A, it is found that the threshold voltage gets lower as the substrate temperature increases. Note that the threshold voltage is decreased from 0.38 V to −1.08 V in the range from −40° C. to 150° C.

From FIG. 26B, it is found that the field-effect mobility gets lower as the substrate temperature increases. Note that the mobility is decreased from 37.4 cm²/Vs to 33.4 cm²/Vs in the range from −40° C. to 150° C.

Thus, it is found that variation in electric characteristics of Sample 2 is small in the above temperature range.

It is also found that the transistor described above has a high field-effect mobility and thus is highly reliable.

Similarly, the off-state current per micrometer in channel width of a transistor applicable to the semiconductor device according to one embodiment of the present invention was evaluated.

A sample was formed by a method similar to that of Sample 2. Note that the transistor used for the measurement has L of 3 μm, W of 10 cm, Lov of 2 μm, and dW of 0 μm.

Figure 27:
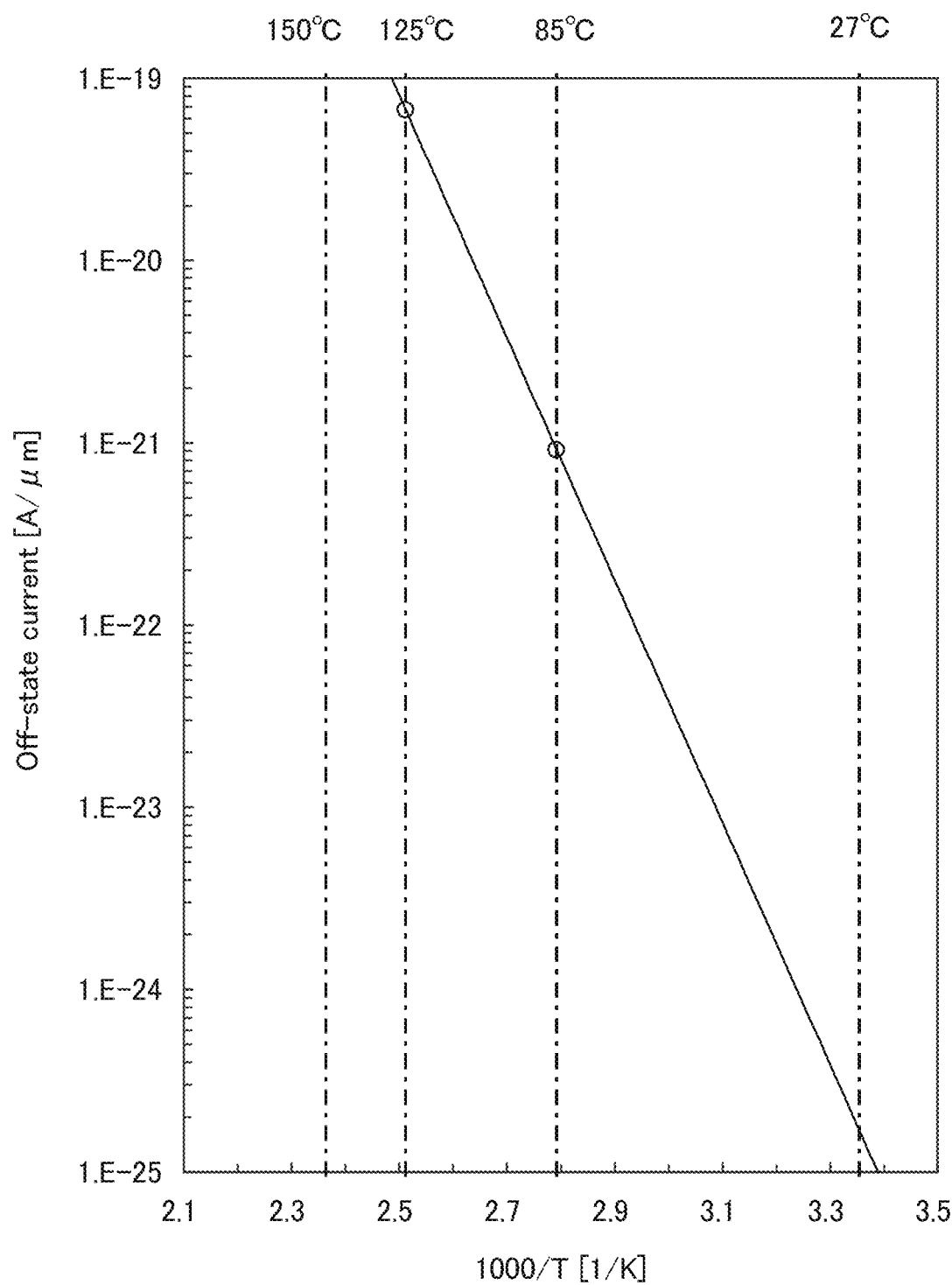
FIG. 27 is a graph showing off-state current of a transistor formed using an oxide semiconductor film.

FIG. 27 shows the relation between the off-state current of a transistor and the inverse of substrate temperature (absolute temperature) at measurement of the off-state current. In FIG. 27, the horizontal axis represents a value (1000/T) obtained by multiplying an inverse of substrate temperature at measurement by 1000, for the sake of simplicity.

A method for measuring the off-state current of the transistor will be briefly described below. Here, the transistor used for the measurement is called a first transistor for the sake of convenience.

A drain of the first transistor is connected to a floating gate FG, and the floating gate FG is connected to a gate of a second transistor.

First, the first transistor is turned off and then, electric charge is applied to the floating gate FG Note that a constant drain voltage is applied to the second transistor.

At this time, the electric charge of the floating gate FG gradually leaks through the first transistor. When the electric charge of the floating gate FG is leaked, the potential of a source of the second transistor is changed. The amount of electric charge leaking from the first transistor is estimated from the amount of change in potential of the source with respect to time; thus, the off-state current can be measured.

FIG. 27 shows that the off-state current per micrometer in channel width of the formed transistor was $2 \times 10^{-21}$/μm (2 zA/μm) when the substrate temperature at measurement was 85° C.

Thus, the result shows that the off-state current of the formed transistor was significantly small.

As described above, a highly reliable transistor can be formed with the use of an oxide semiconductor film containing few impurities.

Further, a transistor having excellent electric characteristics can be obtained.

This embodiment can be implemented in appropriate combination with any of the structures described in the other embodiments.

Embodiment 2

In this embodiment, a liquid crystal display device manufactured using the transistor described in Embodiment 1 will be described. Note that although an example in which the transistor according to one embodiment of the present invention is applied to the liquid crystal display device is described in this embodiment, one embodiment of the present invention is not limited thereto. For example, application of the transistor according to one embodiment of the present invention to an electroluminescence (EL) display device is readily conceived by those skilled in the art.

FIG. 9 is a circuit diagram of an active matrix liquid crystal display device. The liquid crystal display device includes source lines SL_1 to SL_a, gate lines GL_1 to GL_b, and a plurality of pixels 2200. The pixels 2200 each include a transistor 2230, a capacitor 2220, and a liquid crystal element 2210. A pixel portion in the liquid crystal display device includes the pixels 2200 arranged in matrix. Note that a "source line SL" and a "gate line GL" simply refer to a source line and a gate line, respectively.

As the transistor 2230, the transistor described in Embodiment 1 can be used. With the use of the transistor according to one embodiment of the present invention, a liquid crystal display device with high display quality and high reliability can be obtained.

The gate line GL is connected to a gate of the transistor 2230, the source line SL is connected to a source of the transistor 2230, and a drain of the transistor 2230 is connected to one of capacitor electrodes of the capacitor 2220 and one of pixel electrodes of the liquid crystal element 2210. The other capacitor electrode of the capacitor 2220 and the other pixel electrode of the liquid crystal element 2210 are connected to a common electrode. Note that the common electrode may be formed in the same layer as the gate line GL using the same material as the gate line GL.

Further, the gate line GL is connected to a gate driver circuit. The gate driver circuit may include the transistor described in Embodiment 1.

The source line SL is connected to a source driver circuit. The source driver circuit may include the transistor described in Embodiment 1.

Note that either or both of the gate driver circuit and the source driver circuit may be formed over a separately prepared substrate and connected using a method such as chip on glass (COG), wire bonding, or tape automated bonding (TAB).

Since a transistor is easily broken by static electricity or the like, a protection circuit is preferably provided. The protection circuit is preferably formed using a nonlinear element.

When a potential is supplied to the gate line GL to be higher than or equal to the threshold voltage of the transistor 2230, electric charge supplied from the source line SL flows as the drain current of the transistor 2230 and is stored in the capacitor 2220. After charging for one row, the transistors 2230 in the row are turned off and voltage application from the source line SL stops; however, a necessary voltage can be kept by the electric charge accumulated in the capacitors 2220. Then, the capacitors 2220 in the next row are charged. In this manner, the capacitors in the first row to the b-th row are charged.

Since the off-state current of the transistor 2230 is low, the electric charge stored in the capacitor 2220 is not easily lost and capacitance of the capacitor 2220 can be reduced, so that power consumption needed for charging can be reduced.

Thus, with the use of the transistor according to one embodiment of the present invention, a liquid crystal display device with low power consumption, high display quality, and high reliability can be obtained.

This embodiment can be implemented in appropriate combination with any of the other embodiments.

Embodiment 3

In this embodiment, an example of manufacturing a memory which is a semiconductor device with the use of the transistor described in Embodiment 1 will be described.

Typical examples of volatile memories include a dynamic random access memory (DRAM) which stores data by selecting a transistor included in a memory element and accumulating electric charge in a capacitor and a static random access memory (SRAM) which holds stored data using a circuit such as a flip-flop.

The transistor described in Embodiment 1 can be applied to part of transistors included in a memory.

An example of a memory cell included in a semiconductor device to which the transistor described in Embodiment 1 is applied will be described with reference to FIGS. 10A to 10C.

Figure 10A:
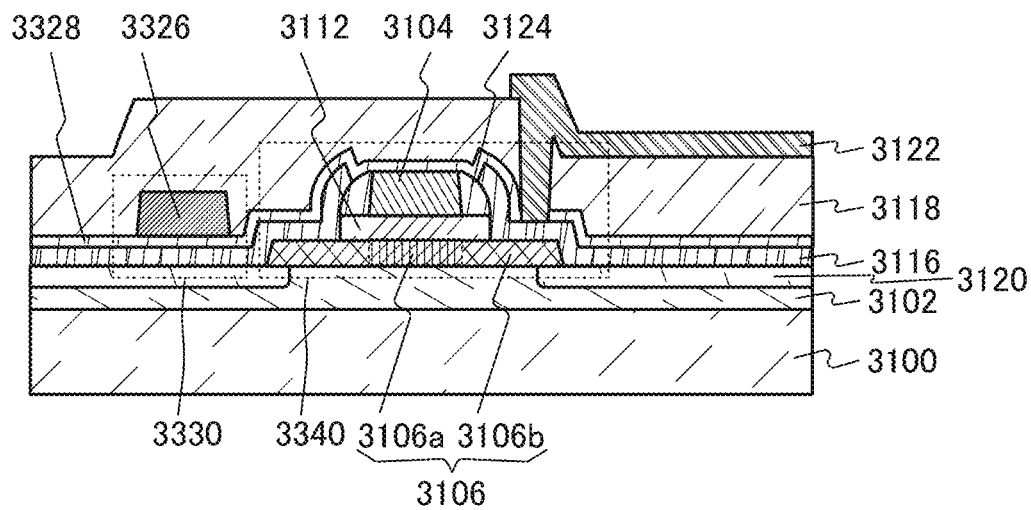
FIG. 10A is a cross-sectional view which illustrates an example of a semiconductor device.

FIG. 10A is a cross-sectional view of the memory cell. A transistor 3340 includes, over a substrate 3100, a base insulating film 3102; a protective film 3120 provided on the periphery of the base insulating film 3102; an oxide semiconductor film 3106, which is provided over the base insulating film 3102 and the protective film 3120 and includes a high-resistance region 3106a and low-resistance regions 3106b; a gate insulating film 3112 provided over the oxide semiconductor film 3106; a gate electrode 3104 provided so that the oxide semiconductor film 3106 overlaps with the gate electrode 3104 with the gate insulating film 3112 positioned therebetween; sidewall insulating films 3124 provided in contact with a side surface of the gate electrode 3104; and a pair of electrodes 3116 provided in contact with at least the oxide semiconductor film 3106.

Here, the substrate 3100, the base insulating film 3102, the protective film 3120, the oxide semiconductor film 3106, the gate insulating film 3112, the gate electrode 3104, the sidewall insulating films 3124, and the pair of electrodes 3116 may be provided using methods and materials which are similar to those of the substrate 100, the base insulating film 502, the protective film 520, the oxide semiconductor film 506, the gate insulating film 512, the gate electrode 504, the sidewall insulating films 524, and the pair of electrodes 516, respectively.

Further, the transistor 3340 includes an interlayer insulating film 3328 provided so as to cover the transistor 3340, and an electrode 3326 provided over the interlayer insulating film 3328. A capacitor 3330 includes one of the pair of electrodes 3116, the interlayer insulating film 3328, and the electrode 3326. Although a parallel plate-type capacitor is illustrated in the drawing, a stack-type capacitor or a trench-type capacitor may alternatively be used to increase capacity. The interlayer insulating film 3328 may be provided using methods and materials which are similar to those of the protective insulating film 518. The electrode 3326 may be provided using methods and materials which are similar to those of the pair of electrodes 516.

Furthermore, the transistor 3340 includes an interlayer insulating film 3118 provided so as to cover the interlayer insulating film 3328 and the electrode 3326, and a wiring 3122 connected to the other of the pair of electrodes 3116 through an opening formed in the interlayer insulating film 3118 and the interlayer insulating film 3328. Although not illustrated, a protective film may be provided to cover the interlayer insulating film 3118 and the wiring 3122. With the protective film, a minute amount of leakage current generated due to surface conduction of the interlayer insulating film 3118 can be reduced and thus the off-state current of the transistor can be reduced. The wiring 3122 may be provided using methods and materials which are similar to those of the wiring 522.

Figure 10B:
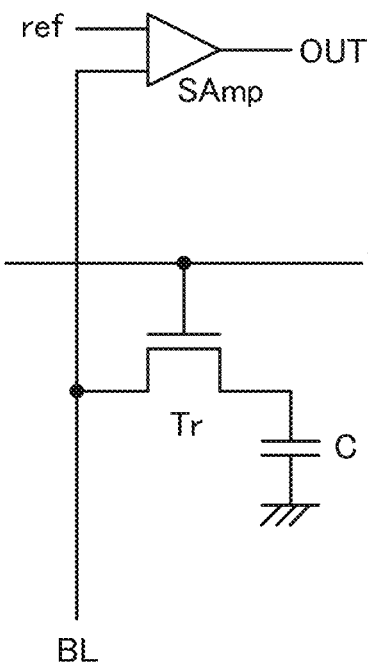
FIG. 10B is a circuit diagram.

FIG. 10B is a circuit diagram of the memory cell in FIG. 10A. The memory cell includes a transistor Tr and a capacitor C connected to one of a source and a drain of the transistor Tr. Note that an electrode of the capacitor C which is not connected to the one of the source and the drain of the transistor Tr is grounded. A gate of the transistor Tr is connected to a word line WL, and the one of the source and the drain of the transistor Tr is connected to a bit line BL. The bit line BL is connected to a sense amplifier SAmp. Note that the transistor Tr and the capacitor C correspond to the transistor 3340 and the capacitor 3330, respectively.

Figure 10C:
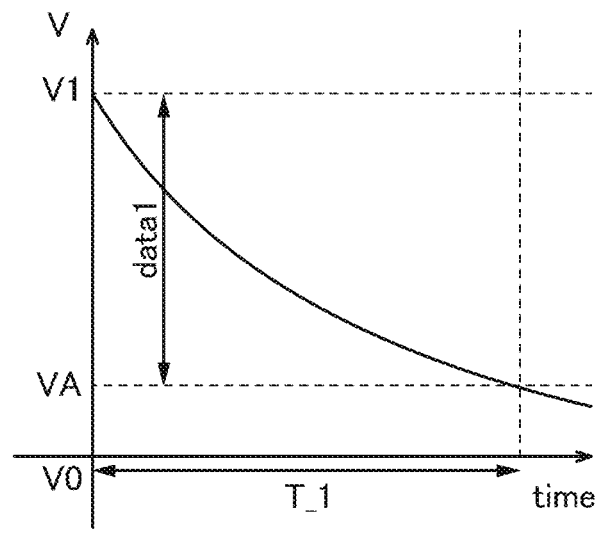
FIG. 10C is a graph showing electric characteristics.

It is known that the potential held in the capacitor C is gradually decreased over time as shown in FIG. 10C owing to the off-state current of the transistor Tr. The potential is changed from V0 to V1 by charging is reduced over time to VA that is a limit for reading out data 1. This period is called a holding period T_1. Thus, in the case of a two-level DRAM, a refresh operation needs to be performed within the holding period T_1.

Here, when the transistor 3340 is used as the transistor Tr, the off-state current of the transistor Tr can be significantly small, so that the holding period T_1 can be made to be longer. In other words, an interval between refresh operations can be extended; thus, power consumption of the memory cell can be reduced. Further, since the transistor Tr is highly reliable, the memory cell can have high reliability.

For example, in the case where a memory cell is formed using a transistor whose off-state current is $1\times10^{-18}$ A or less, preferably $1\times10^{-21}$ A or less, more preferably $1\times10^{-24}$ A or less, an interval between refresh operations can be several tens of seconds to several tens of years.

As described above, the use of the transistor according to one embodiment of the present invention allows formation of a semiconductor device with high reliability and low power consumption.

Next, an example of a memory cell included in a semiconductor device to which the transistor described in Embodiment 1 is applied, which is different from the example in FIGS. 10A to 10C will be described with reference to FIGS. 11A to 11C.

Figure 11A:
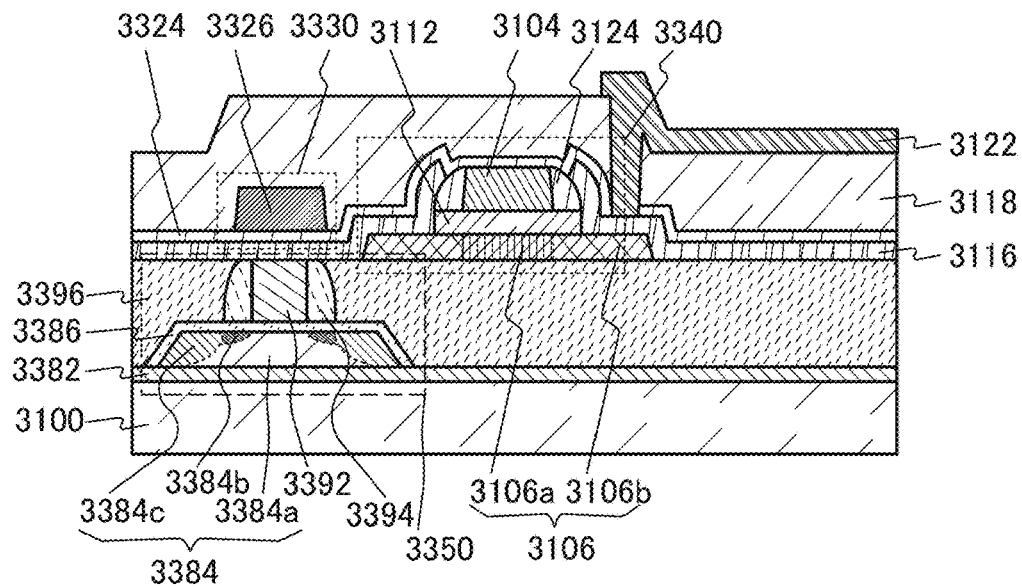
FIG. 11A is a cross-sectional view which illustrates an example of a semiconductor device.

FIG. 11A is a cross-sectional view of the memory cell. A transistor 3350 includes, over a substrate 3100, a base insulating film 3382; a semiconductor film 3384 provided over the base insulating film 3382 and including a first resistance region 3384a, second resistance regions 3384b, and third resistance regions 3384c; a gate insulating film 3386 provided over the semiconductor film 3384; a gate electrode 3392 provided to overlap with the first resistance region 3384a with the gate insulating film 3386 positioned therebetween; and sidewall insulating films 3394 provided in contact with side surfaces of the gate electrode 3392. The descending order of resistance in the semiconductor film 3384 is as follows: the first resistance region 3384a, the second resistance regions 3384b, and the third resistance regions 3384c. In the first resistance region 3384a, a channel is formed when a voltage higher than or equal to the threshold voltage of the transistor 3350 is applied to the gate electrode 3392. Although not illustrated, a pair of electrodes in contact with the third resistance regions 3384c may be provided.

As the transistor 3350, either a transistor formed using a semiconductor film which is other than an oxide semiconductor film and which contains a Group 14 element, such as a polycrystalline silicon film, a single crystal silicon film, a polycrystalline germanium film, or a single crystal germanium film, or the transistor formed using the oxide semiconductor film described in Embodiment 1 may be used.

Further, an interlayer insulating film 3396 is provided in contact with the transistor 3350. Note that a surface of the interlayer insulating film 3396 is a surface over which the transistor 3340 is formed; thus, the surface of the interlayer insulating film 3396 is planarized as much as possible. Specifically, Ra of the surface of the interlayer insulating film 3396 is preferably 1 nm or less, preferably 0.3 nm or less, more preferably 0.1 nm or less.

The interlayer insulating film 3396 may have a single-layer structure or a stacked-layer structure, in which a layer that is in contact with the oxide semiconductor film 3106 is preferably an insulating film from which oxygen is released by heat treatment.

The transistor 3340 is provided over the interlayer insulating film 3396. One of the pair of electrodes 3116 of the transistor 3340 is electrically connected to the gate electrode 3392 of the transistor 3350. The capacitor 3330 includes one of the pair of electrodes 3116 and the interlayer insulating film 3328 which are included in the transistor 3340, and the electrode 3326. Although a parallel plate-type capacitor is illustrated in the drawing, a stack-type capacitor or a trench-type capacitor may alternatively be used to increase capacity.

Figure 11B:
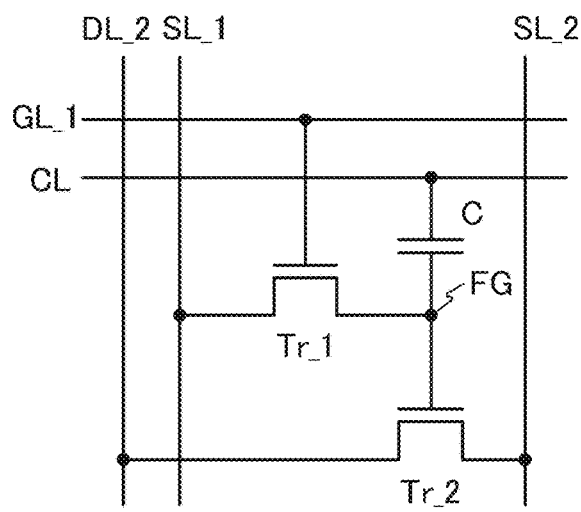
FIG. 11B is a circuit diagram.

FIG. 11B is a circuit diagram of the memory cell in FIG. 11A. The memory cell includes a transistor Tr_1, a transistor Tr_2, a capacitor C, and a floating gate FG connected to the capacitor C, a drain of the transistor Tr_1, and a gate of the transistor Tr_2. A gate of the transistor Tr_1 is connected to a gate line GL_1. A source of the transistor Tr_1 is connected to a source line SL_1. A source of the transistor Tr_2 is connected to a source line SL_2. A drain of the transistor Tr_2 is connected to a drain line DL_2. An electrode of the capacitor C which is not connected to the floating gate FG is connected to a capacitor line CL. Note that the transistor Tr_1, the transistor Tr_2, and the capacitor C correspond to the transistor 3340, the transistor 3350, and the capacitor 3330, respectively.

Figure 11C:
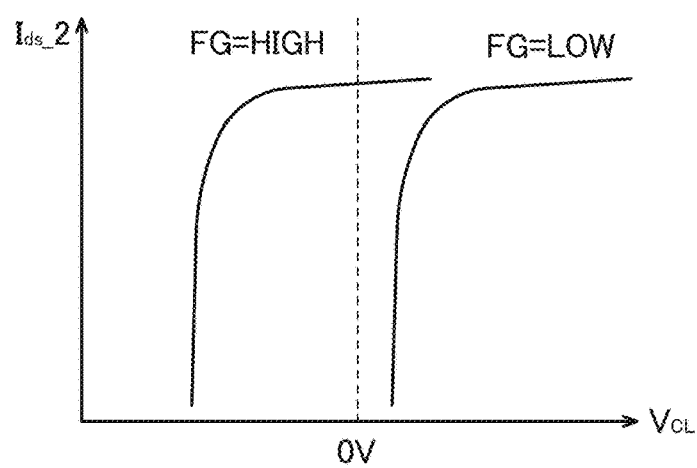
FIG. 11C is a graph showing electric characteristics.

The memory cell described in this embodiment utilizes variation in threshold value of the transistor Tr_2 in accordance with the potential of the floating gate FG For example, FIG. 11C shows the relation between potential $V_{CL}$ of the capacitor wiring CL and drain current Ids_2 flowing through the transistor Tr_2.

Here, the potential of the floating gate FG can be adjusted through the transistor Tr_1. For example, the potential of the source line SL_1 is set to VDD. In this case, when the potential of the gate line GL_1 is set to higher than or equal to a potential obtained by adding VDD to the threshold voltage Vth of the transistor Tr_1, the potential of the floating gate FG can be HIGH. Further, when the potential of the gate line GL_1 is set to lower than or equal to the threshold voltage Vth of the transistor Tr_1, the potential of the floating gate FG can be LOW.

Thus, either a $V_{CL}$-$I_{ds\_2}$ curve (FG=LOW) or a $V_{CL}$-$I_{ds\_2}$ curve (FG=HIGH) can be obtained. That is, when the potential of FG is LOW, the $I_{ds\_2}$ is small at a $V_{CL}$ of 0V; accordingly, data 0 is stored. Further, when the potential of FG is HIGH, the $I_{ds\_2}$ is large at a $V_{CL}$ of 0V; accordingly, data 1 is stored. In this manner, data can be stored.

Since the off-state current of the transistor Tr_1 can be made to be extremely small when the transistor 3340 is used as the transistor Tr_1 here, unintentional leak of electric charge accumulated in the floating gate FG in FIG. 11B through the transistor Tr_1 can be suppressed. Therefore, data can be held for a long period. Further, the field-effect mobility of the transistor Tr_1 is high; thus, the memory cell can be operated at high speed.

As described above, the use of the transistor according to one embodiment of the present invention allows formation of a semiconductor device having high reliability and low power consumption and being capable of high-speed operation.

This embodiment can be combined with any of other embodiments.

Embodiment 4

A central processing unit (CPU) can be formed with the use of the transistor described in Embodiment 1 and the semiconductor device described in Embodiment 3 for at least part of the CPU.

Figure 12A:
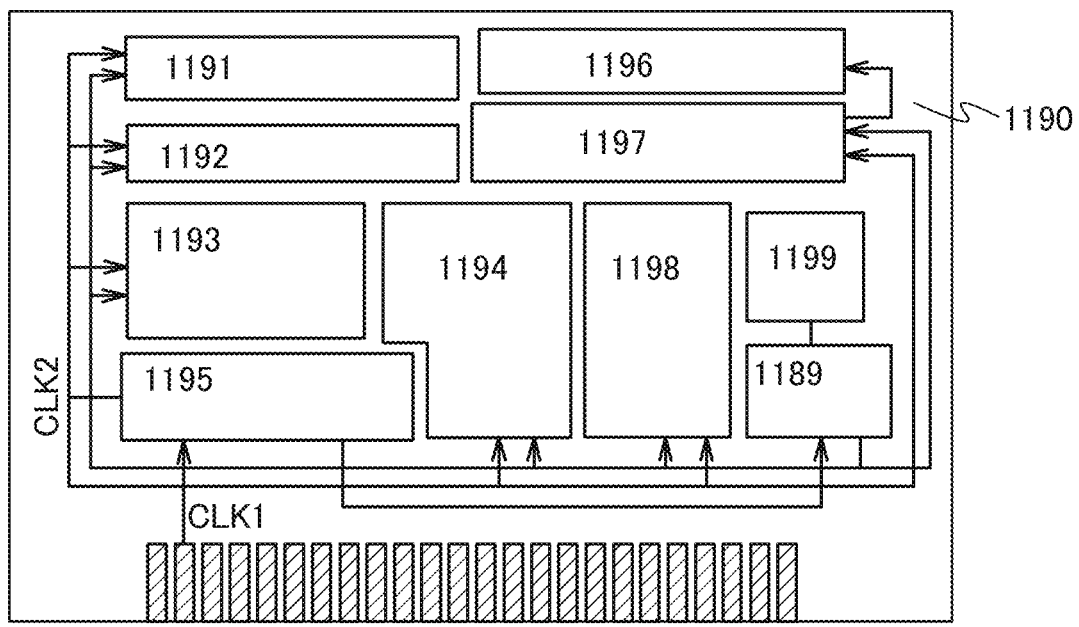
FIG. 12A is a block diagram which illustrates a specific example of a CPU according to one embodiment of the present invention.

FIG. 12A is a block diagram illustrating a specific configuration of a CPU. The CPU in FIG. 12A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. It is needless to say that the CPU illustrated in FIG. 12A is only an example in which the configuration is simplified, and actual CPUs have various configurations depending on applications.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 12A, the semiconductor device according to Embodiment 3 is provided in the register 1196.

In the CPU illustrated in FIG. 12A, the register controller 1197 selects an operation of holding data in the register 1196, in response to an instruction from the ALU 1191. That is, the semiconductor device in the register 1196 determines which of a phase-inversion element and a capacitor holds data. When data holding by the phase-inversion element is selected, power supply voltage is supplied to the semiconductor device in the register 1196. When data holding by the capacitor is selected, the data is rewritten in the capacitor, and supply of the power supply voltage to the semiconductor memory device in the register 1196 can be stopped.

Figure 12B:
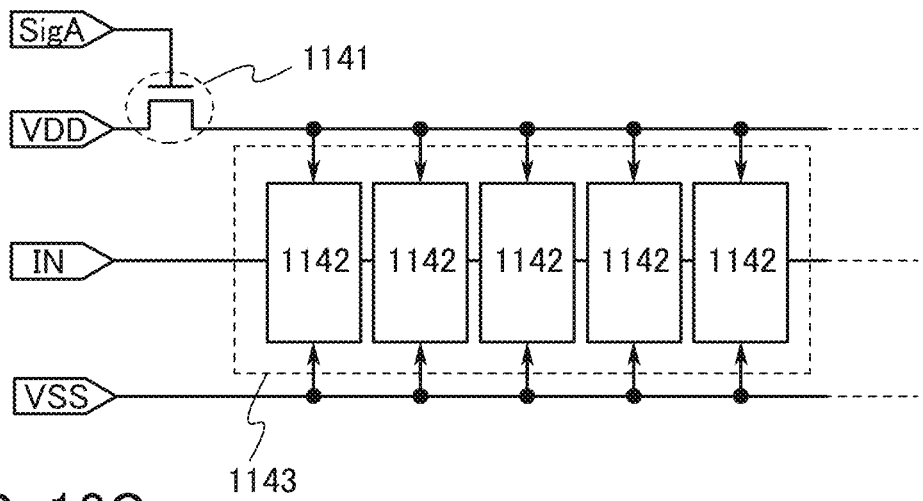
FIGS. 12B and 12C are circuit diagrams of parts of the CPU.
Figure 12C:
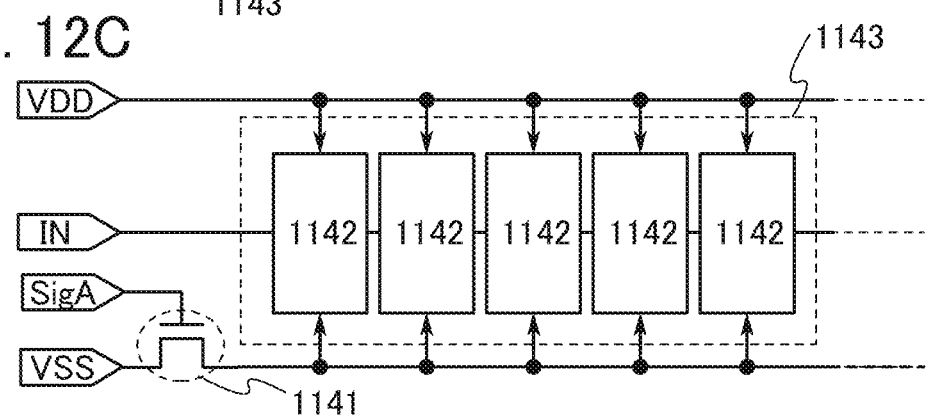

The power supply can be stopped with a switching element provided between a semiconductor device group and a node to which a power supply potential VDD or a power supply potential VSS is supplied, as illustrated in FIG. 12B or FIG. 12C. Circuits illustrated in FIGS. 12B and 12C will be described below.

FIGS. 12B and 12C each illustrate an example of a configuration of a memory circuit including the transistor described in Embodiment 1, of which off-state current is significantly small, for a switching element for controlling supply of power supply potential to a semiconductor device.

The storage device illustrated in FIG. 12B includes a switching element 1141 and a semiconductor device group 1143 including a plurality of semiconductor devices 1142. Specifically, as each of the semiconductor devices 1142, the semiconductor device described in Embodiment 3 can be used. Each of the semiconductor devices 1142 included in the semiconductor device group 1143 is supplied with the high-level power supply potential VDD through the switching element 1141. Further, each of the semiconductor devices 1142 included in the semiconductor device group 1143 is supplied with a potential of a signal IN and the low-level power supply potential VSS.

In FIG. 12B, as the switching element 1141, the transistor described in Embodiment 1 can be used. The switching of the transistor is controlled by a signal SigA input to a gate thereof.

Note that FIG. 12B illustrates the configuration in which the switching element 1141 includes only one transistor; however, one embodiment of the present invention is not limited thereto. The switching element 1141 may include a plurality of transistors. In the case where the switching element 1141 includes a plurality of transistors which serves as switching elements, the plurality of transistors may be connected to each other in parallel, in series, or in combination of parallel connection and serial connection.

FIG. 12C illustrates an example of a storage device in which each of the semiconductor devices 1142 included in the semiconductor device group 1143 is supplied with the low-level power supply potential VSS through the switching element 1141. The supply of the low-level power supply potential VSS to each of the semiconductor devices 1142 included in the semiconductor device group 1143 can be controlled by the switching element 1141.

When a switching element is provided between a semiconductor device group and a node to which the power supply potential VDD or the power supply potential VSS is supplied, data can be held even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Further, when the transistor described in Embodiment 1 and the semiconductor device described in Embodiment 3 are used, the CPU can operate at high speed while consuming less power.

Although the CPU is given as an example here, one embodiment of the present invention can also be applied to an LSI such as a digital signal processor (DSP), a custom LSI, or a field programmable gate array (FPGA).

This embodiment can be implemented in appropriate combination with any of the other embodiments.

Embodiment 5

In this embodiment, examples of electronic devices to which any of Embodiments 1 to 4 can be applied will be described.

Figure 13A:
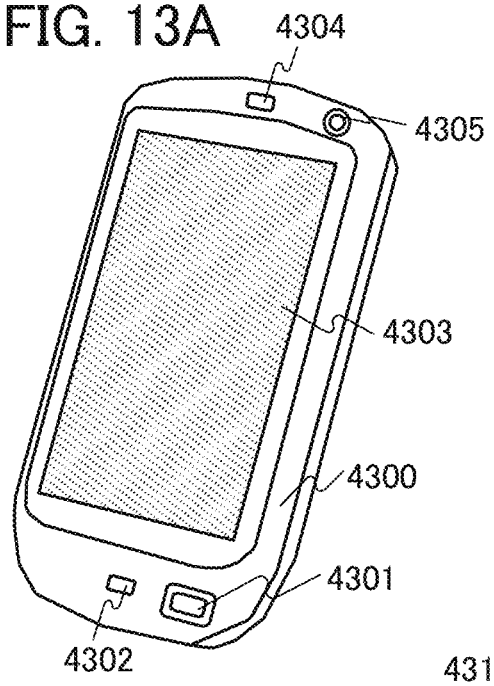
FIGS. 13A to 13C are perspective views which illustrate examples of electronic devices according to embodiments of the present invention.

FIG. 13A illustrates a portable information terminal. The portable information terminal includes a housing 4300, a button 4301, a microphone 4302, a display portion 4303, a speaker 4304, and a camera 4305, and has a function of a mobile phone.

Figure 13B:
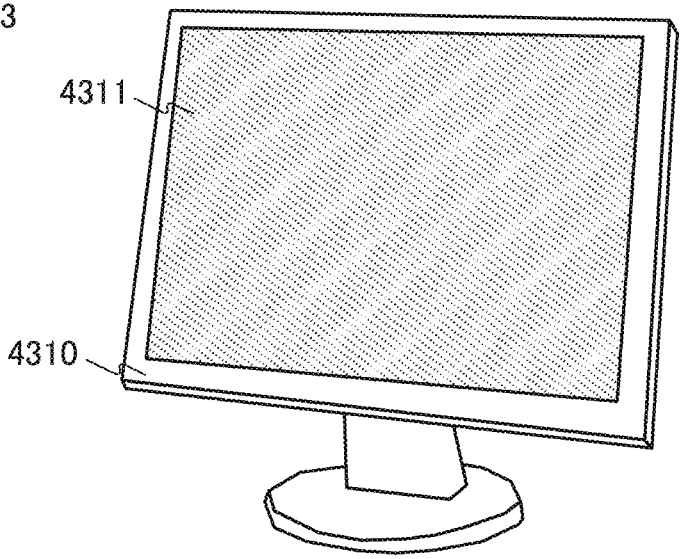

FIG. 13B illustrates a display. The display includes a housing 4310 and a display portion 4311.

Figure 13C:
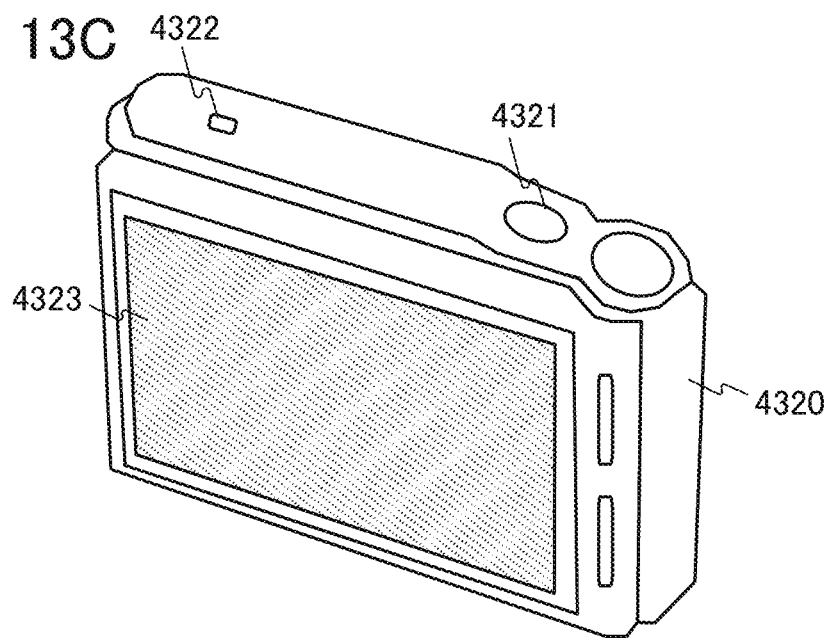

FIG. 13C illustrates a digital still camera. The digital still camera includes a housing 4320, a button 4321, a microphone 4322, and a display portion 4323.

With the use of the transistor according to one embodiment of the present invention, an electronic device with low power consumption and favorable quality can be obtained.

This embodiment can be implemented in appropriate combination with any of the other embodiments.

Example 1

In this example, description will be given of pressures and leakage rates in a deposition chamber of a sputtering apparatus to which one embodiment of the present invention is applied.

The deposition chamber has a volumetric capacity of 1.40 m³ and is provided with a turbo molecular pump and a cryopump which are parallel to each other. As an auxiliary pump, a rough vacuum pump is also provided.

After release of the air in the deposition chamber, the deposition chamber is evacuated for 6 hours with the use of the turbo molecular pump.

When the total pressure in the deposition chamber reached $5 \times 10^{-4}$ Pa, a cryotrap was operated. After that, baking of the chamber was performed at 400° C. for 12 hours.

Then, dummy film formation was performed in the deposition chamber until a film was deposited to 10 μm (until integral power consumption reached 50 kWh). Note that the dummy film formation was performed under the condition that the substrate temperature was 250° C., the deposition pressure was 0.3 Pa, the deposition power was 9 kW (AC), deposition gases were 50 sccm of argon and 50 sccm of oxygen, the distance between a target and a substrate was 150 mm, and the deposition rate was 920 s/film. For the dummy film formation, an In—Ga—Zn—O target having an atomic ratio of In:Ga:Zn=1:1:1 was used.

In the deposition chamber from which impurities were thus sufficiently reduced, the total pressure was $2.16 \times 10^{-5}$ Pa; the partial pressure of a gas having a mass-to-charge ratio (m/z) of 2 was $8.63 \times 10^{-6}$ Pa; the partial pressure of a gas having a mass-to-charge ratio (m/z) of 18 was $8.43 \times 10^{-6}$ Pa; the partial pressure of a gas having a mass-to-charge ratio (m/z) of 28 was $1.66 \times 10^{-5}$ Pa; the partial pressure of a gas having a mass-to-charge ratio (m/z) of 40 (e.g., an argon atom) was $3.87 \times 10^{-7}$ Pa; and the partial pressure of a gas having a mass-to-charge ratio (m/z) of 44 was $5.33 \times 10^{-6}$ Pa.

Figure 29:
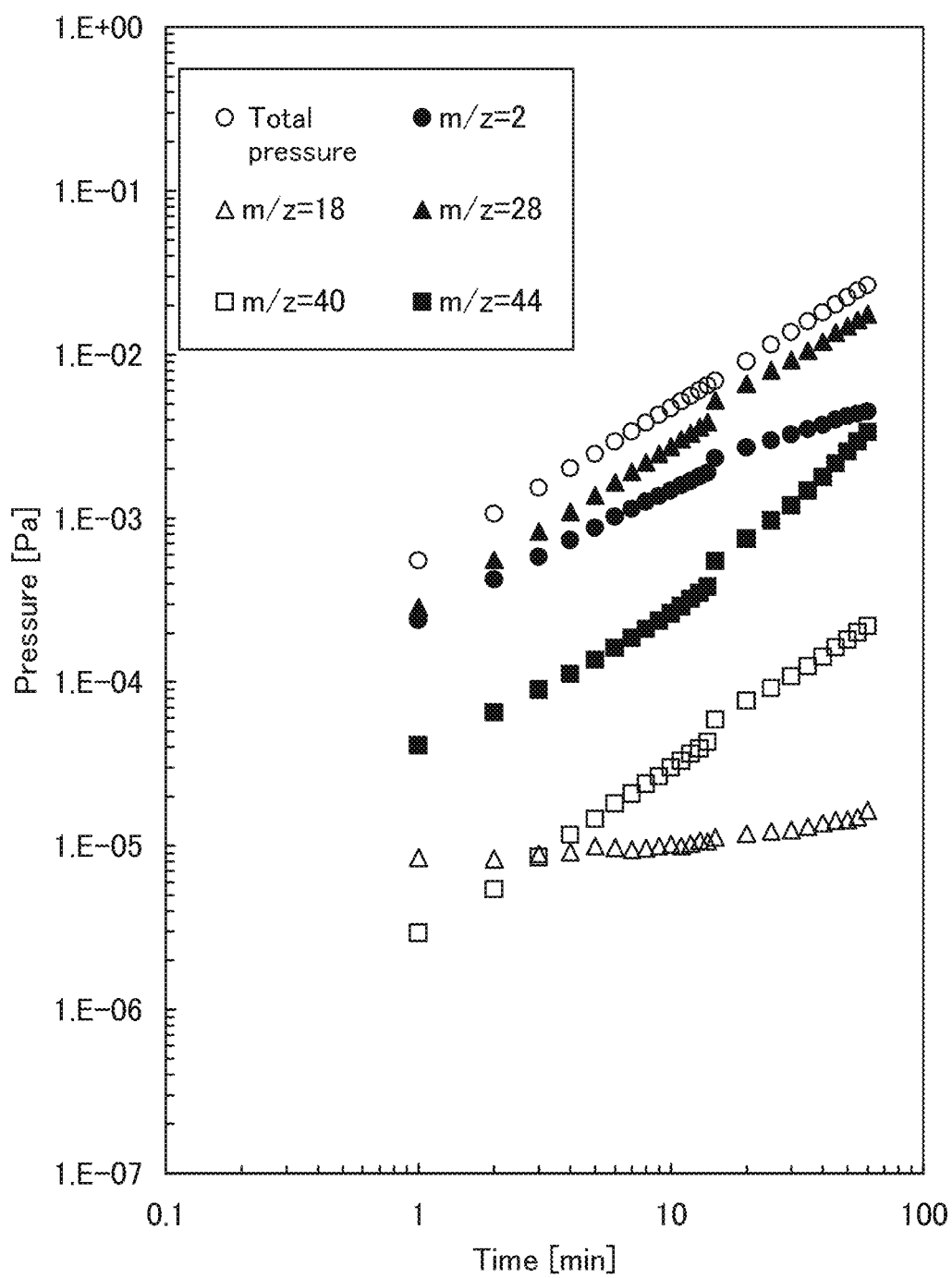
FIG. 29 is a graph showing the relation between pressures in a deposition chamber and elapsed time after the operation of a vacuum pump was stopped.

FIG. 29 shows the total pressure and the partial pressures of the molecules in the deposition chamber. White circles represent the total pressure; black circles represent the partial pressure of a gas having a mass-to-charge ratio (m/z) of 2; white triangles represent the partial pressure of a gas having a mass-to-charge ratio (m/z) of 18; black triangles represent the partial pressure of a gas having a mass-to-charge ratio (m/z) of 28; white quadrangles represent the partial pressure of a gas having a mass-to-charge ratio (m/z) of 40; and black quadrangles represent the partial pressure of a gas having a mass-to-charge ratio (m/z) of 44. Note that FIG. 29 shows the relation between the pressures in the deposition chamber and elapsed time after evacuation with the vacuum pump was stopped. The pressures were measured using Qulee CGM-051, a quadrupole mass analyzer (also referred to as Q-mass) manufactured by ULVAC, Inc.

The leakage rates estimated from the obtained pressures were as follows. The total leakage rate of the deposition chamber was $9.84 \times 10^{-6}$ Pa·m³/s. The leakage rate of a gas having a mass-to-charge ratio (m/z) of 2 was $3.24 \times 10^{-6}$ Pa·m³/s. The leakage rate of a gas having a mass-to-charge ratio (m/z) of 18 was $4.46 \times 10^{-9}$ Pa·m³/s. The leakage rate of a gas having a mass-to-charge ratio (m/z) of 28 was $7.74 \times 10^{-6}$ Pa·m³/s. The leakage rate of a gas having a mass-to-charge ratio (m/z) of 40 was $8.72 \times 10^{-8}$ Pa·m³/s. The leakage rate of a gas having a mass-to-charge ratio (m/z) of 44 was $7.89 \times 10^{-7}$ Pa·m³/s.

The leakage rates were calculated from the relation between the pressures in the deposition chamber and elapsed time after evacuation with the vacuum pump was stopped. Specifically, a leakage rate was obtained by dividing the difference between pressure one minute after the stop of evacuation with the vacuum pump and pressure 15 minutes after the stop of evacuation with the vacuum pump by time and multiplying the result by the volumetric capacity of the deposition chamber.

Example 2

In this example, a heated inert gas such as a heated rare gas was supplied to increase pressure in the deposition chamber, and after the elapse of a certain period of time, treatment for evacuating the deposition chamber was performed, in order to further reduce impurities present in the deposition chamber of the sputtering apparatus described in Example 1.

Specifically, an argon gas at 70° C. was supplied to the deposition chamber over an hour so that the pressure therein became 20 Pa, and then, evacuation with the vacuum pump was performed for 10 minutes. Here, this treatment was repeated 10 times.

In the deposition chamber from which impurities were thus further reduced, the total pressure was $1.34 \times 10^{-5}$ Pa; the partial pressure of a gas having a mass-to-charge ratio (m/z) of 2 was $7.58 \times 10^{-6}$ Pa; the partial pressure of a gas having a mass-to-charge ratio (m/z) of 18 was $5.79 \times 10^{-6}$ Pa; the partial pressure of a gas having a mass-to-charge ratio (m/z) of 28 was $8.40 \times 10^{-6}$ Pa; the partial pressure of a gas having a mass-to-charge ratio (m/z) of 40 (e.g., an argon molecule) was $1 \times 10^{-7}$ Pa or less (the lower limit of measurement or less); and the partial pressure of a gas having a mass-to-charge ratio (m/z) of 44 was $1 \times 10^{-7}$ Pa or less (the lower limit of measurement or less).

Figure 37:
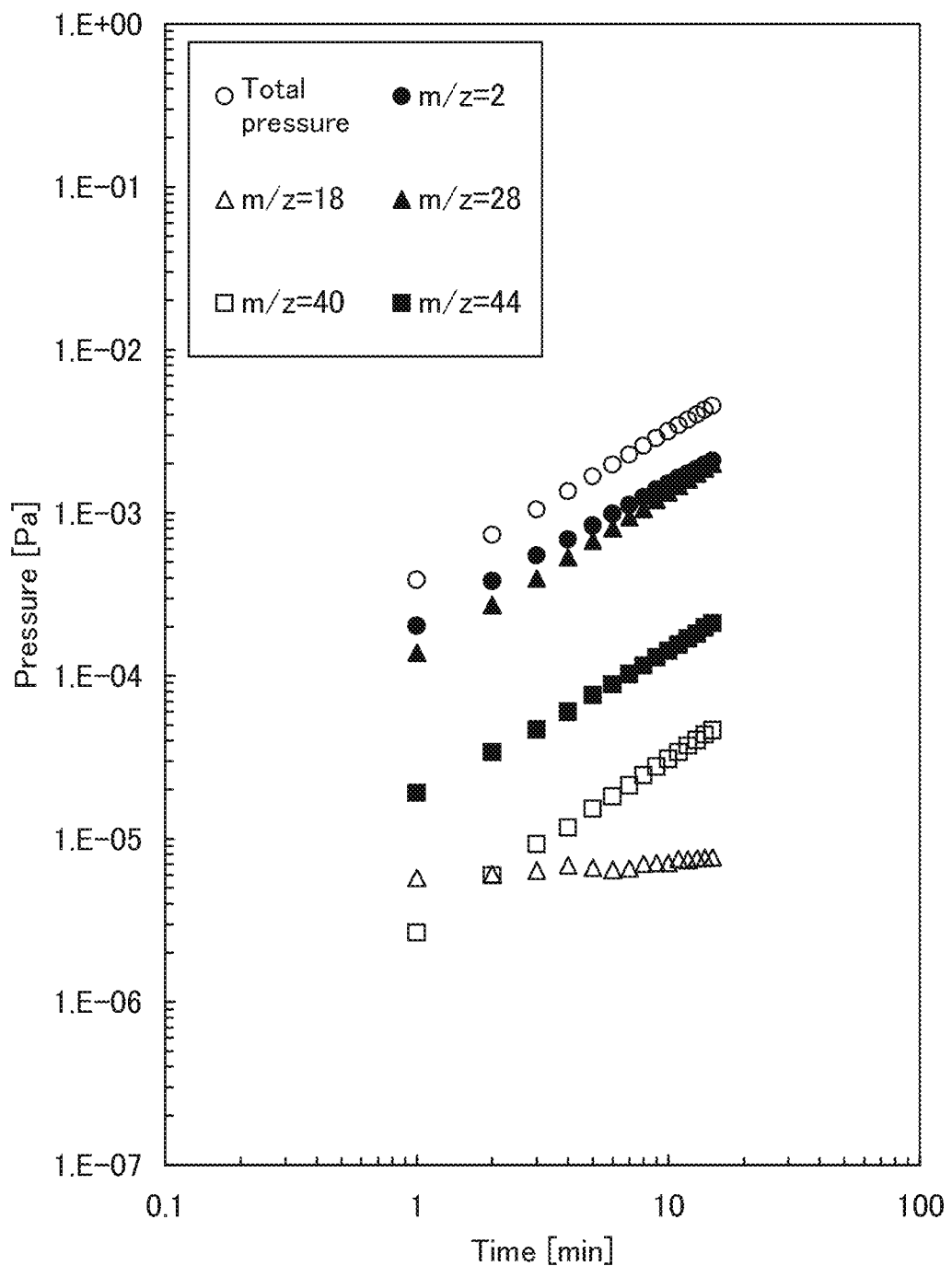
FIG. 37 is a graph showing the relation between pressures in a deposition chamber and elapsed time after the operation of a vacuum pump was stopped.

FIG. 37 shows the relation between the pressures in the deposition chamber and elapsed time after evacuation with the vacuum pump was stopped. The pressures were measured using Qulee CGM-051, a quadrupole mass analyzer manufactured by ULVAC, Inc. As a gauge head, M-11, a gauge head manufactured by ULVAC, Inc., was used.

The leakage rates estimated from the obtained pressures were as follows. The total leakage rate of the deposition chamber was $6.94 \times 10^{-6}$ Pa·m³/s. The leakage rate of a gas having a mass-to-charge ratio (m/z) of 2 was $3.13 \times 10^{-6}$ Pa·m³/s. The leakage rate of a gas having a mass-to-charge ratio (m/z) of 18 was $3.20 \times 10^{-9}$ Pa·m³/s. The leakage rate of a gas having a mass-to-charge ratio (m/z) of 28 was $3.12 \times 10^{-6}$ Pa·m³/s. The leakage rate of a gas having a mass-to-charge ratio (m/z) of 40 was $7.27 \times 10^{-8}$ Pa·m³/s. The leakage rate of a gas having a mass-to-charge ratio (m/z) of 44 was $3.20 \times 10^{-7}$ Pa·m³/s.

The leakage rates were calculated from the relation between the pressures in the deposition chamber and elapsed time after evacuation with the vacuum pump was stopped. Specifically, a leakage rate was obtained by dividing the difference between pressure one minute after the stop of evacuation with the vacuum pump and pressure 15 minutes after the stop of evacuation with the vacuum pump by time and multiplying the result by the volumetric capacity of the deposition chamber.

Table 1 shows comparisons between pressures and comparisons between leakage rates in Examples 1 and 2.

TABLE 1

| | Pressure [Pa] | | Leakage Rate [Pa · m³/s] | |
| --- | --- | --- | --- | --- |
| | Example 1 | Example 2 | Example 1 | Example 2 |
| Total | $2.16 \times 10^{-5}$ | $1.34 \times 10^{-5}$ | $9.84 \times 10^{-6}$ | $6.94 \times 10^{-6}$ |
| m/z = 2 | $8.63 \times 10^{-6}$ | $7.56 \times 10^{-6}$ | $3.24 \times 10^{-6}$ | $3.13 \times 10^{-6}$ |

TABLE 1-continued

| | Pressure [Pa] | | Leakage Rate [Pa · m³/s] | |
|---|---|---|---|---|
| | Example 1 | Example 2 | Example 1 | Example 2 |
| m/z = 18 | $8.43 \times 10^{-6}$ | $5.79 \times 10^{-6}$ | $4.46 \times 10^{-9}$ | $3.20 \times 10^{-9}$ |
| m/z = 28 | $1.66 \times 10^{-5}$ | $8.40 \times 10^{-6}$ | $7.74 \times 10^{-6}$ | $3.12 \times 10^{-6}$ |
| m/z = 40 | $3.87 \times 10^{-7}$ | $1 \times 10^{-7}$ or less | $8.72 \times 10^{-8}$ | $7.27 \times 10^{-8}$ |
| m/z = 44 | $5.33 \times 10^{-6}$ | $1 \times 10^{-7}$ or less | $7.89 \times 10^{-7}$ | $3.20 \times 10^{-7}$ |

As described above, a heated argon gas was supplied to increase pressure in the deposition chamber, and after the elapse of a certain period of time, treatment for evacuating the deposition chamber was performed, so that impurities existing in the deposition chamber were able to be further reduced as compared to Example 1. This result reveals that release of the impurities was reduced, leading to reductions in pressures and leakage rates in the deposition chamber.

Example 3

In this example, TDS analysis, SIMS, and XRD analysis were performed on samples each formed in the deposition chamber of the sputtering apparatus described in Example 1.

Each of the samples was obtained by forming an In—Ga—Zn—O film over a glass substrate to a thickness of 100 nm.

The conditions for forming the In—Ga—Zn—O film were as follows.

The substrate temperature was 250° C.; the deposition pressure was 0.3 Pa; the deposition power was 9 kW (AC); deposition gases were 50 sccm of argon and 50 sccm of oxygen; and the distance between the target and a substrate was 150 mm. As the target, an In—Ga—Zn—O target having an atomic ratio of In:Ga:Zn=1:1:1 was used.

First, the TDS analysis was conducted.

For the TDS analysis, EMD-WA1000S/W, a thermal desorption spectrometer manufactured by ESCO, Ltd., was used.

Figure 32A:
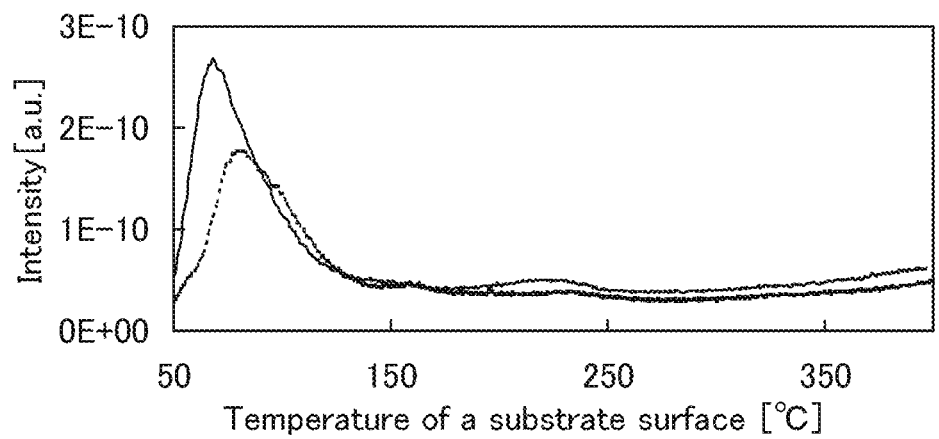
FIGS. 32A to 32C are graphs each showing TDS analysis results of oxide semiconductor films.
Figure 32B:
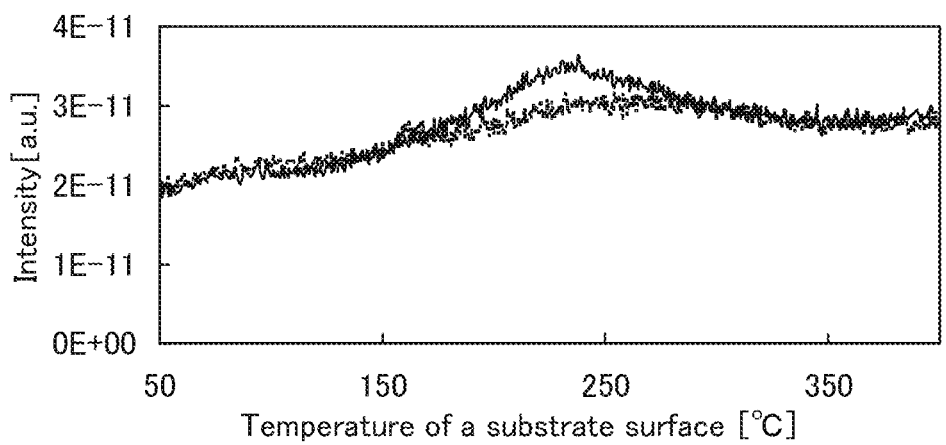
Figure 32C:
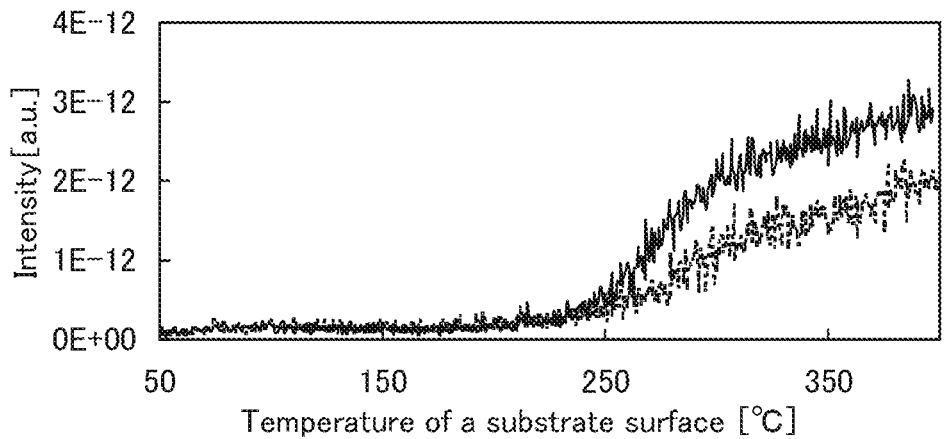

FIGS. 32A to 32C show the TDS analysis results of the samples. Here, FIG. 32A shows the ion intensities of a gas having a mass-to-charge ratio (m/z) of 18; FIG. 32B shows the ion intensities of a gas having a mass-to-charge ratio (m/z) of 28; and FIG. 32C shows the ion intensities of a gas having a mass-to-charge ratio (m/z) of 44. In FIGS. 32A to 32C, solid lines indicate the ion intensities in the case where heat treatment was not performed, and dotted lines indicate the ion intensities in the case where after film formation, heat treatment was performed at 350° C. in a nitrogen gas atmosphere for an hour, and then heat treatment was performed in an oxidation atmosphere (containing 80 vol. % of nitrogen gas and 20 vol. % of oxygen gas) for an hour.

According to the obtained ion intensities, presumably, the release amounts of a gas having a mass-to-charge ratio (m/z) of 18, a gas having a mass-to-charge ratio (m/z) of 28, and a gas having a mass-to-charge ratio (m/z) of 44 in the In—Ga—Zn—O film were reduced by performing heat treatment after formation of the In—Ga—Zn—O film.

Next, SIMS was performed on the samples.

For SIMS, IMS 7fR manufactured by CAMECA, Societe par Actions Simplifiée (SAS), was used.

Figure 33:
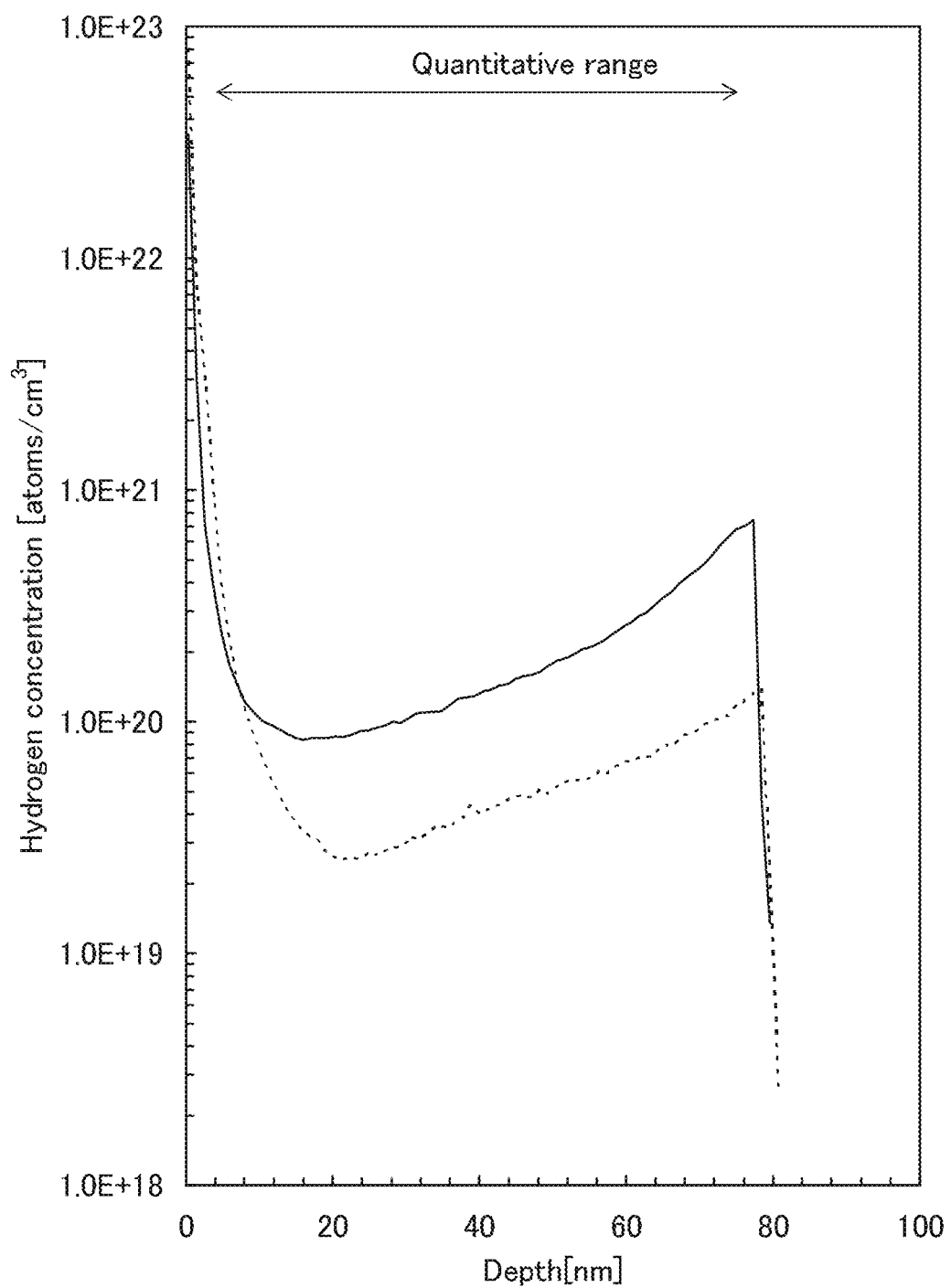
FIG. 33 is a graph showing SIMS results of oxide semiconductor films.
Figure 34:
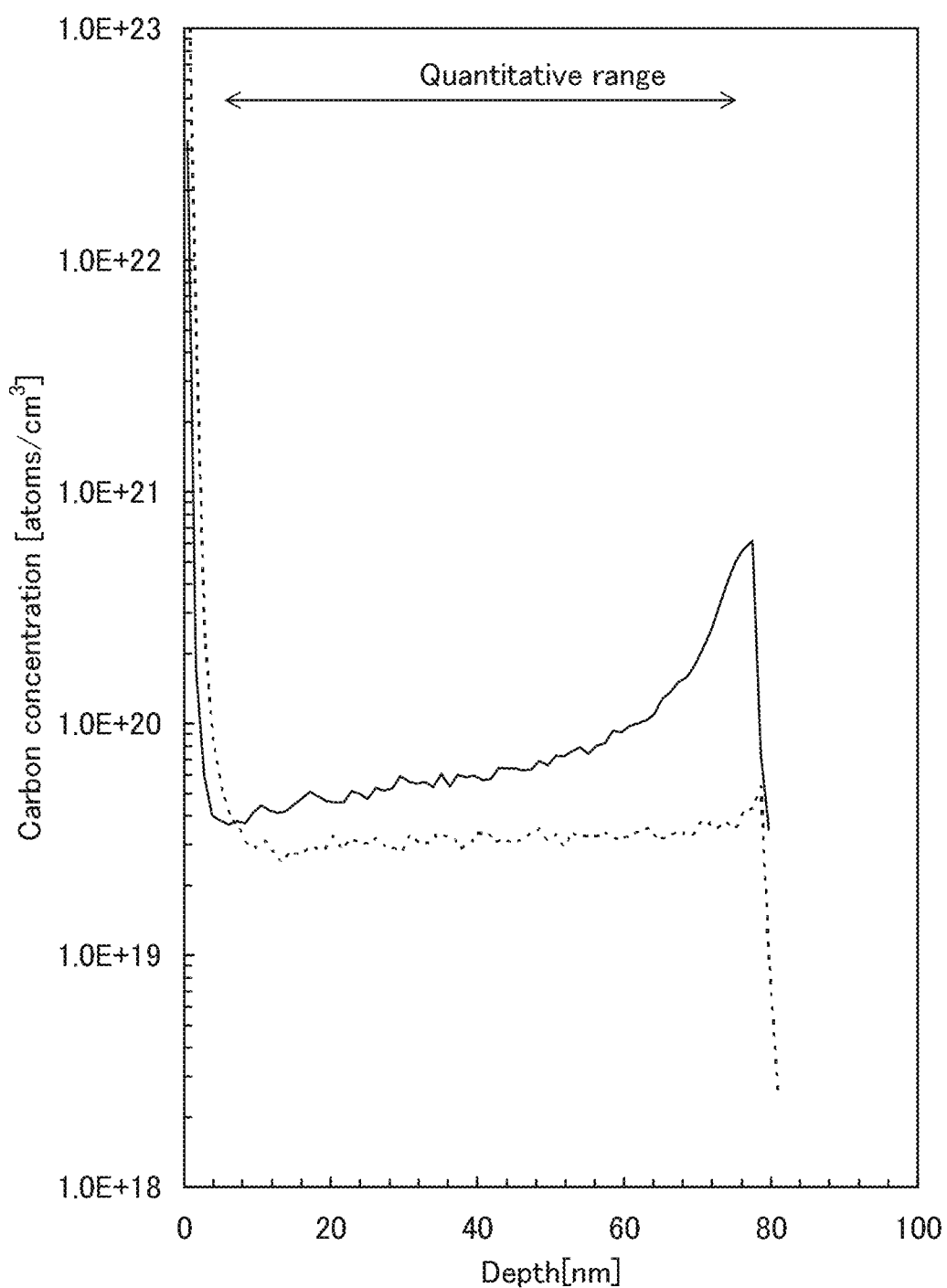
FIG. 34 is a graph showing SIMS results of oxide semiconductor films.
Figure 35:
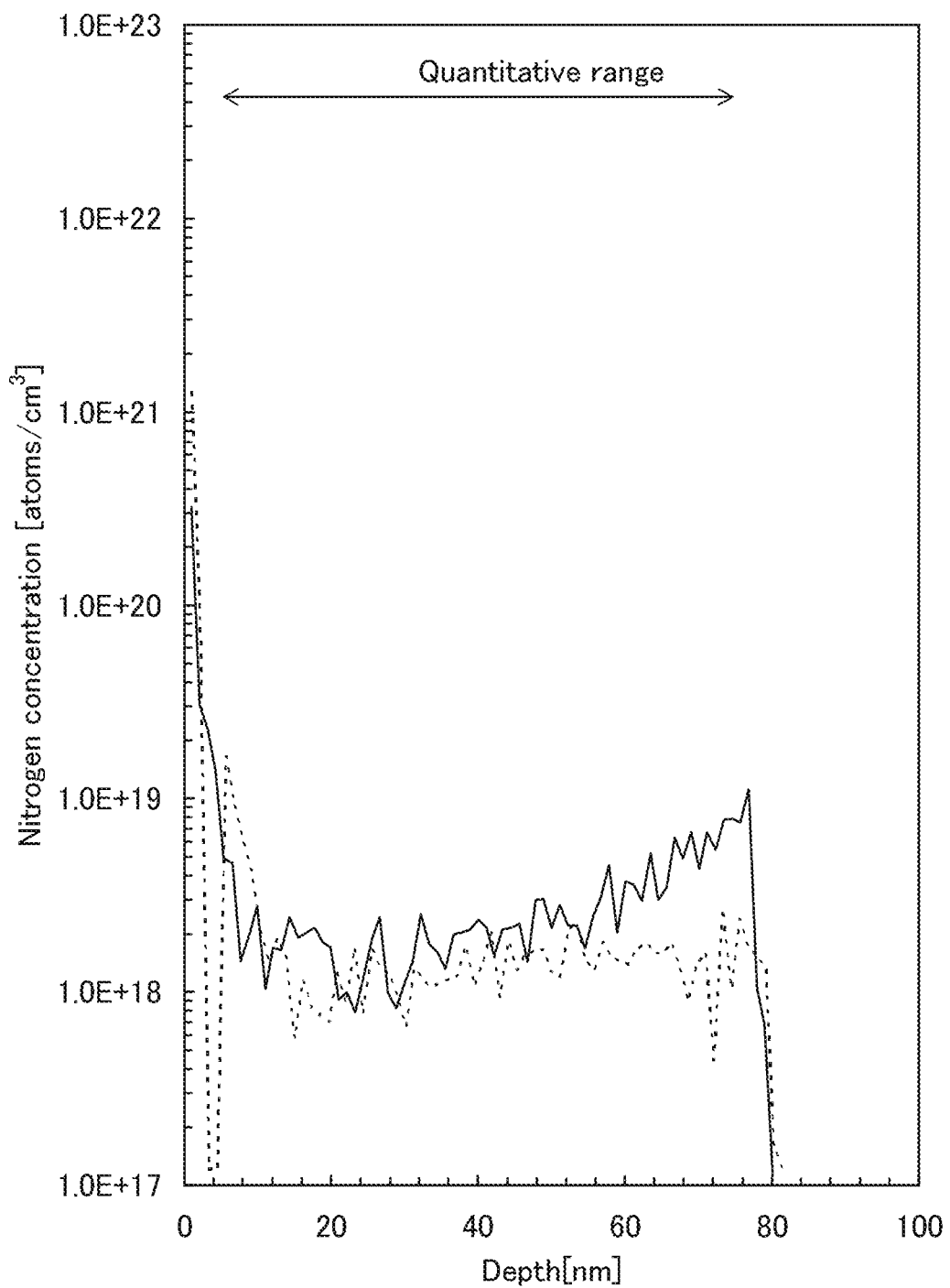
FIG. 35 is a graph showing SIMS results of oxide semiconductor films.

FIG. 33 shows the SIMS depth profiles of hydrogen.
FIG. 34 shows the SIMS depth profiles of carbon.
FIG. 35 shows the SIMS depth profiles of nitrogen.

In FIGS. 33 to 35, solid lines indicate the depth profiles in the case where heat treatment was not performed, and dotted lines indicate the depth profiles in the case where after film formation, heat treatment was performed at 450° C. in a nitrogen gas atmosphere for an hour, and then heat treatment was performed in an oxidation atmosphere (containing 80 vol. % of nitrogen gas and 20 vol. % of oxygen gas) for an hour.

The obtained depth profiles suggest that the concentrations of carbon and nitrogen were reduced by performing heat treatment after formation of the In—Ga—Zn—O film.

Next, the XRD analysis was performed on the samples.

The XRD analysis was conducted using D8 ADVANCE, an X-ray diffractometer manufactured by Bruker AXS, and measurement was performed by an out-of-plane method.

Figure 36:
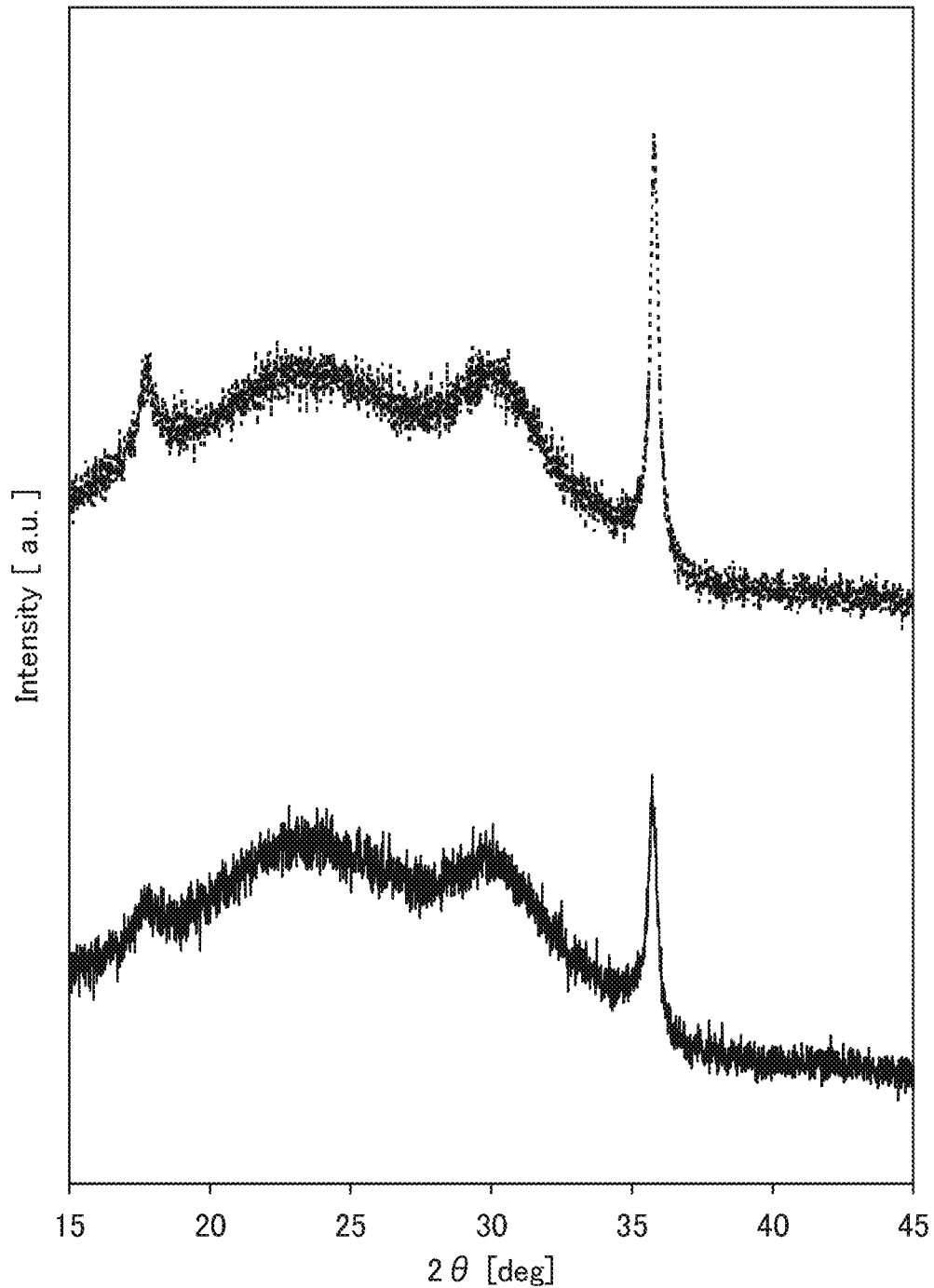
FIG. 36 is a graph showing XRD results of oxide semiconductor films.

FIG. 36 shows XRD results of the In—Ga—Zn—O films.

In FIG. 36, a solid line indicates the XRD result in the case where heat treatment was not performed, and a dotted line indicates the XRD result in the case where after film formation, heat treatment was performed at 450° C. in a nitrogen gas atmosphere for an hour, and then heat treatment was performed in an oxidation atmosphere (containing 80 vol. % of nitrogen gas and 20 vol. % of oxygen gas) for an hour.

FIG. 36 reveals that each sample has a plurality of crystallinity peaks and suggests that the intensity of the crystallinity peak was increased by performing heat treatment after film formation.

It is found that the In—Ga—Zn—O films each formed in the deposition chamber of the sputtering apparatus, which are described in Example 1, have low impurity concentrations and include crystalline regions.

This application is based on Japanese Patent Application serial no. 2011-117354 filed with the Japan Patent Office on May 25, 2011 and Japanese Patent Application serial no. 2011-147189 filed with the Japan Patent Office on Jul. 1, 2011, the entire contents of which are hereby incorporated by reference.

What is claimed is:

1. A semiconductor device comprising:
   a transistor comprising:
      an oxide semiconductor film comprising a channel formation region;
      a gate insulating film in contact with the oxide semiconductor film; and
      a gate electrode overlapping with the oxide semiconductor film with the gate insulating film interposed therebetween,
   wherein the oxide semiconductor film comprises indium, gallium, and zinc, and
   wherein a carbon concentration in the oxide semiconductor film, which is measured by secondary ion mass spectrometry, is more than zero and lower than $5 \times 10^{19}$ atoms/cm³.

2. The semiconductor device according to claim 1, wherein the transistor is electrically connected to a pixel electrode.

3. A semiconductor device comprising:
   a transistor comprising:
      an oxide semiconductor film comprising a channel formation region;
      a gate insulating film in contact with the oxide semiconductor film; and
      a gate electrode overlapping with the oxide semiconductor film with the gate insulating film interposed therebetween,
   wherein the oxide semiconductor film comprises indium, gallium, and zinc, wherein a width of the gate insulating film is larger than a width of the gate electrode and smaller than a width of the oxide semiconductor film in a channel length direction, and wherein a carbon concentration in the oxide semiconductor film, which is measured by secondary ion mass spectrometry, is more than zero and lower than $5\times10^{19}$ atoms/cm$^3$.

4. The semiconductor device according to claim 3, wherein the oxide semiconductor film comprises a first region comprising the channel formation region and overlapped with the gate insulating film, and a second region which is not overlapped with the gate insulating film, and wherein a resistivity of the first region is higher than a resistivity of the second region.

5. The semiconductor device according to claim 3, wherein the transistor is electrically connected to a pixel electrode.

6. A semiconductor device comprising:
a first insulating film;
an oxide semiconductor film in contact with a top surface of the first insulating film;
a second insulating film in contact with a top surface of the oxide semiconductor film; and
a gate electrode over the oxide semiconductor film with the second insulating film interposed therebetween,
wherein the oxide semiconductor film comprises indium, gallium, and zinc,
wherein each of the first insulating film and the second insulating film comprises silicon oxide,
wherein a nitrogen concentration in the oxide semiconductor film, which is measured by secondary ion mass spectrometry, is more than zero and lower than $5\times10^{19}$ atoms/cm$^3$, and
wherein a carbon concentration in the oxide semiconductor film, which is measured by secondary ion mass spectrometry, is more than zero and lower than $5\times10^{19}$ atoms/cm$^3$.

7. The semiconductor device according to claim 6, wherein a transistor comprising the oxide semiconductor film, the second insulating film, and the gate electrode is electrically connected to a pixel electrode.

8. A semiconductor device comprising:
a first insulating film;
an oxide semiconductor film in contact with a top surface of the first insulating film;
a second insulating film in contact with a top surface of the oxide semiconductor film; and
a gate electrode over the oxide semiconductor film with the second insulating film interposed therebetween,
wherein the oxide semiconductor film comprises indium, gallium, and zinc,
wherein each of the first insulating film and the second insulating film comprises silicon oxide,
wherein a width of the second insulating film is larger than a width of the gate electrode and smaller than a width of the oxide semiconductor film in a channel length direction,
wherein a nitrogen concentration in the oxide semiconductor film, which is measured by secondary ion mass spectrometry, is more than zero and lower than $5\times10^{19}$ atoms/cm$^3$, and
wherein a carbon concentration in the oxide semiconductor film, which is measured by secondary ion mass spectrometry, is more than zero and lower than $5\times10^{19}$ atoms/cm$^3$.

9. The semiconductor device according to claim 8, wherein the oxide semiconductor film comprises a region which is not overlapped with the second insulating film, and wherein a resistivity of the region is lower than a resistivity of a channel formation region.

10. The semiconductor device according to claim 8, wherein a transistor comprising the oxide semiconductor film, the second insulating film, and the gate electrode is electrically connected to a pixel electrode.

11. The semiconductor device according to claim 8, wherein the oxide semiconductor film comprises a crystal region whose c-axes are aligned in a direction perpendicular to a surface of the oxide semiconductor film.

* * * * *